(12) United States Patent
Uno et al.

(10) Patent No.: US 7,436,070 B2
(45) Date of Patent: Oct. 14, 2008

(54) SEMICONDUCTOR DEVICE

(75) Inventors: Tomoaki Uno, Takasaki (JP); Masaki Shiraishi, Hitachi (JP); Nobuyoshi Matsuura, Takasaki (JP); Toshio Nagasawa, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 190 days.

(21) Appl. No.: 11/108,825

(22) Filed: Apr. 19, 2005

(65) Prior Publication Data

US 2005/0231990 A1 Oct. 20, 2005

(30) Foreign Application Priority Data

Apr. 19, 2004 (JP) .............................. 2004-123153

(51) Int. Cl.
*H01L 23/48* (2006.01)
(52) U.S. Cl. .................. 257/777; 257/337; 257/481
(58) Field of Classification Search ................ 363/147; 257/337, 339, 341, 342, 476, 481, 678, 685, 257/686, 723, 777
See application file for complete search history.

(56) References Cited

U.S. PATENT DOCUMENTS 6,184,585 B1 * 2/2001 Martinez et al. ............ 257/777
6,775,164 B2 * 8/2004 Wong et al. ................. 363/147

FOREIGN PATENT DOCUMENTS

| JP | 2001-025239 | | 1/2001 |
| JP | 2002-217416 | | 8/2002 |
| JP | 2004342735 | A * | 12/2004 |

* cited by examiner

*Primary Examiner*—Shawn Riley
(74) *Attorney, Agent, or Firm*—Antonelli, Terry, Stout & Kraus, LLP.

(57) ABSTRACT

A non-insulated DC-DC converter hs a power MOS•FRT for a highside switch and a power MOS•FET for a lowside switch. In the non-insulated DC-DC converter, the power MOS•FET for the highside switch and the power MOS•FET for the lowside switch, driver circuits that control operations of these elements, respectively, and a Schottky barrier diode connected in parallel with the power MOS•FET for the lowside switch are respectively formed in four different semiconductor chips. These four semiconductor chips are housed in one package. The semiconductor chips are mounted over the same die pad. The semiconductor chips are disposed so as to approach each other.

9 Claims, 34 Drawing Sheets

SEMICONDUCTOR DEVICE

CROSS-REFERENCE TO RELATED APPLICATION

The present application claims priority from Japanese patent application No. 2004-123153, filed on Apr. 19, 2004, the content of which is hereby incorporated by reference into this application.

BACKGROUND OF THE INVENTION

The present invention relates in general to a semiconductor device, and, more particularly, to a technique that is effective when applied to a semiconductor device having a power supply circuit.

A DC-DC converter, which is widely used as one example of a power supply circuit, has a configuration wherein a power MOS•FET (Metal Oxide Semiconductor Field Effect Transistor) for a highside switch and a power MOS•FET for a lowside switch are connected in series. The power MOS•FET for the highside switch has a switch function for control of the DC-DC converter. The power MOS•FET for the lowside switch has a switch function for synchronization and rectification. The conversion of a power supply voltage is performed by alternately turning these two power MOS•FETs on/off while being synchronized with each other.

Meanwhile, there is a known DC-DC converter in which a Schottky barrier diode is electrically connected to its output in parallel with the power MOS•FET for the lowside switch. That is, the Schottky barrier diode, which has a lower forward voltage VF than a parasitic (body) diode of the power MOS•FET for the lowside switch, is connected in parallel with the power MOS•FET for the lowside switch. A current that flows during the dead time (corresponding to a period in which both power MOS•FETs for highside and lowside switches are turned off) of the DC-DC converter is commutated to the Schottky barrier diode, to thereby reduce the diode conduction loss, as well as a diode recovery loss due to a reverse recovery time (trr) being made fast, whereby a loss produced during the dead time of the DC-DC converter is reduced, thereby to improve its voltage conversion efficiency. In a DC-DC converter considered by the present inventors, the power MOS•FET for the highside switch, the power MOS•FET for the lowside switch, a control IC (Integrated circuit) for controlling the operations of those power MOS•FETs, and the Schottky barrier diode are respectively formed in discrete semiconductor chips, and the respective semiconductor chips are encapsulated in separate packages.

An example of such a DC-DC converter has been described in, for example, Japanese Unexamined Patent Publication No. 2002-217416, which discloses a technique for forming a highside switch by use of a horizontal power MOS•FET and forming a lowside switch by use of a vertical power MOS FET.

A technique, using resistors and capacitors, for reducing noise that presents a problem for a DC-DC converter in which a control circuit, driver circuits and power MOS•FETs are brought into one chip, has been disclosed in, for example, Japanese Unexamined Patent Publication No. 2001-25239.

SUMMARY OF THE INVENTION

Meanwhile, the present inventors have found that a DC-DC converter having a construction as described above, in which the power MOS•FET for the highside switch, the power MOS•FET for the lowside switch, the control IC and the Schottky barrier diode are respectively formed in discrete semiconductor chips and the respective semiconductor chips are respectively encapsulated in separate packages, has the following problems.

That is, with a construction in which several packages are provided, problems result in that the commutation of a load current to the Schottky barrier diode during the dead time is impaired by the inductances of a wiring for electrically connecting the cathode of the Schottky barrier diode and the output of the DC-DC converter and a wiring for electrically connecting the anode of the Schottky barrier diode and a ground wiring, so that despite the use of a Schottky barrier diode having a lower forward voltage than that of the parasitic diode, a sufficient effect cannot be obtained in terms of a reduction in diode conduction loss and a reduction in diode recovery loss due to the reverse recovery time being made fast.

A problem arises in that, when the load current that flows through the Schottky barrier diode during the dead time becomes small due to the wiring inductances and the load current flows even into the body diode of the power MOS•FET for the lowside switch, the potential on the output side of the DC-DC converter is reduced to a negative potential by the forward voltage of the body diode, and the output of the control IC electrically connected to the power MOS•FET is also brought to a negative potential, so that a parasitic npn bipolar transistor is turned on within the control IC, to thereby increase the current consumption of the control IC. Further, a problem arises in that a malfunction occurs in that, when its increased state proceeds and a potential between the source electrode (BOOT) side of a p channel MOS•FET of a CMOS (Complementary MOS) inverter of the control IC and the output of the DC-DC converter becomes lower than a prescribed potential value, a protection circuit function of the DC-DC converter works automatically to stop the operation of the power MOS•FET for the highside switch. In addition to the above, a problem also arises in that, when a plurality of DC-DC converters are electrically connected to a load circuit like a CPU or the like to construct an overall system, including a plurality of DC-DC converters, miniaturization of the overall system is impaired when Schottky barrier diodes are connected to the individual DC-DC converters in separate packages.

An object of the present invention is to provide a technique that is capable of enhancing the power supply conversion efficiency of a semiconductor device.

The above and other objects and novel features of the present invention will become apparent from the following descriptions in the present specification and the accompanying drawings.

A summary of representative aspects of the invention disclosed in the present application will be explained in as follows:

The present invention provides a semiconductor device comprising a first power supply terminal for supply of a first potential, at least one second power supply terminal for supply of a second potential that is lower than the first potential, first and second field effect transistors that are series-connected between the first and second power supply terminals, a control circuit which is electrically connected to inputs of the first and second field effect transistors and which control operations of the first and second field effect transistors, and an output wiring section connected to a wiring that connects the first and second field effect transistors, wherein a Schottky barrier diode connected in parallel with the second field effect transistor is provided between the output wiring section and the second power supply terminal, wherein the first field effect transistor, the second field effect transistor, the control circuit and the Schottky barrier diode are respectively formed in discrete semiconductor chips, and wherein the separate semiconductor chips are encapsulated in one sealing body.

Advantageous effects obtained by the present invention as disclosed in the present application will be explained in brief as follows:

The first field effect transistor, the second field effect transistor, the control circuit and the Schottky barrier diode are respectively formed in discrete semiconductor chips, and the discrete semiconductor chips are encapsulated in one sealing body. Consequently, a wiring section that electrically connects the anode of the Schottky barrier diode and the output wiring section, and a wiring section that electrically connects the cathode of the Schottky barrier diode and the second power supply terminal can be shortened in length. Further, the inductances of the wiring sections can be reduced. It is therefore possible to reduce the diode conduction loss and the diode recovery loss during a dead time and enhance the voltage conversion efficiency of a semiconductor device.

DETAILED DESCRIPTION OF THE PREFERRED EMBODIMENTS

Figure 1:
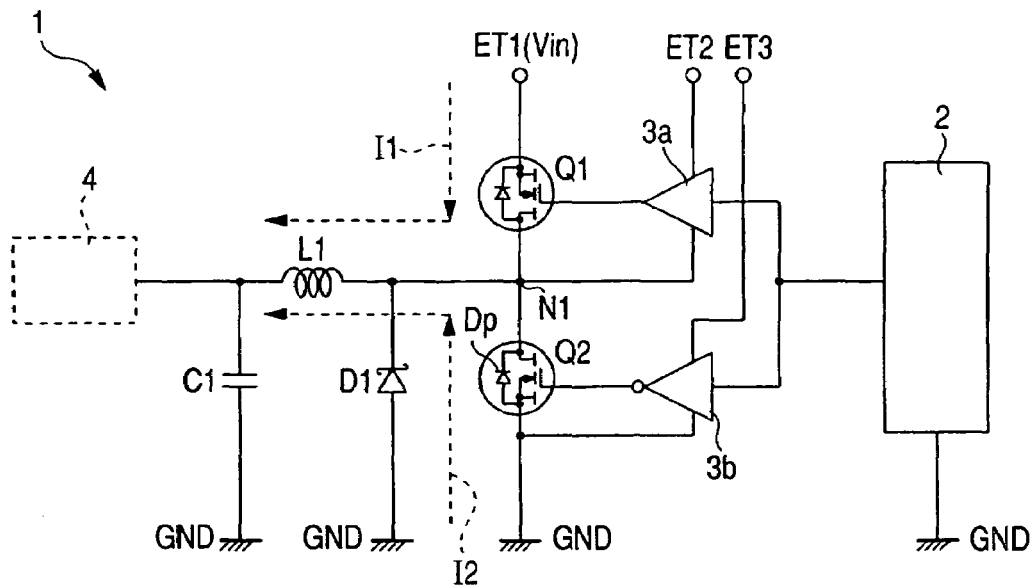
FIG. 1 is a circuit diagram showing one example of a semiconductor device according to a first embodiment of the present invention.

Whenever circumstances require it for convenience, the subject matter of the present invention will be described as being divided into a plurality of sections or embodiments. However, unless otherwise specified in particular, they are not irrelevant to one another. One has to do with modifications, details and supplementary explanations of some or all of the others.

When reference is made to a number of elements or the like (including the number of pieces, numerical values, quantity, range, etc.) in the following description of the embodiments, the number is not limited to a specific number and may be greater than or less than or equal to the specific number, unless otherwise specified in particular and definitely limited to the specific number in principle. It is also needless to say that components (including element or factor steps, etc.) employed in the following embodiments are not always essential, unless otherwise specified in particular and considered to be definitely essential in principle. Similarly, when reference is made to shapes, positional relations and the like of the components or the like in the following description of the embodiments, they will include ones substantially analogous or similar to their shapes or the like, unless otherwise specified in particular and considered not to be definitely so in principle. This similarly applies even to the above-described numerical values and ranges. Those elements each having the same function in all of the drawings are respectively given the same reference numerals, and a repetitive description thereof will therefore be omitted. In the embodiments, a MOS•FET (Metal Oxide Semiconductor Field Effect Transistor) shown with a field effect transistor, as typical, is abbreviated as "MOS", a p channel type MIS•FRT is abbreviated as "pMIS" and an n channel type MIS•FET is abbreviated as "nMIS". The embodiments of the present invention will hereinafter be described in detail on the basis of the drawings.

First Preferred Embodiment

A semiconductor device according to a first embodiment of the present invention operates as a non-insulated DC-DC converter of the type used in a power supply circuit of an electronic apparatus like, for example, a desk top personal computer, a notebook-size personal computer, a server or a game machine or the like. FIG. 1 shows one example of a circuit diagram of the non-insulated DC-DC converter 1. The non-insulated DC-DC converter 1 includes a control circuit 2, driver circuits (first and second control circuits) 3a and 3b, power MOSs (first and second field effect transistors) Q1 and Q2, a Schottky barrier diode (first diode) D1, a coil L1 and a capacitor C1, etc.

Figure 2:
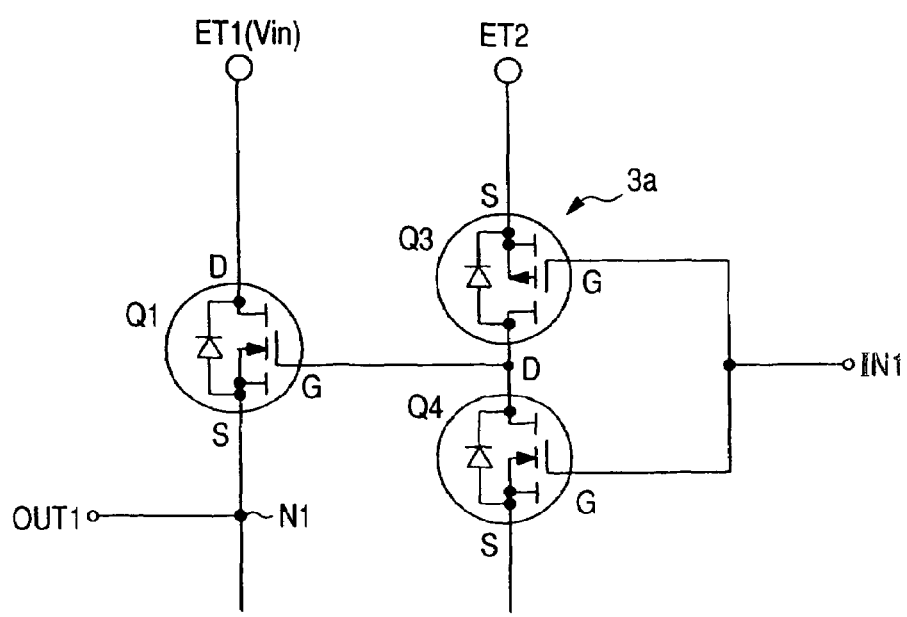
FIG. 2 is a circuit diagram illustrating one example of a control circuit of the semiconductor device shown in FIG. 1.

The control circuit 2 is a circuit which supplies a signal for controlling the voltage switch-on widths (on time) of the power MOSs Q1 and Q2. The control circuit 2 is packaged aside from the power MOSs Q1 and Q2. The output (corresponding to a terminal for the control signal) of the control circuit 2 is electrically connected to corresponding inputs of the driver circuits 3a and 3b. The outputs of the driver circuits 3a and 3b are electrically connected to corresponding gates of the power MOSs Q1 and Q2. The driver circuits 3a and 3b consist of circuits which respectively control the potentials applied to the gates of the power MOSs Q1 and Q2 in accordance with the control signal supplied from the control circuit 2 to thereby control the operations of the power MOSs Q1 and Q2. The driver circuits 3a and 3b are respectively formed of a CMOS inverter circuit, for example. One example of a circuit diagram of the driver circuit 3a is shown in FIG. 2. The driver circuit 3a has a circuit configuration wherein a p channel power MOS Q3 and an n channel power MOS Q4 are complementary-connected in series. The driver circuit 3a is controlled based on a control input signal IN1, and it controls the level of an output signal OUT1 through the power MOS Q1. Incidentally, symbol G indicates a gate, symbol D indicates a drain and symbol S indicates a source. Since the driver circuit 3b is substantially identical in operation to the driver circuit 3a, its description is omitted.

The power MOSs Q1 and Q2 shown in FIG. 1 are series-connected between a terminal (first power supply terminal) ET1 for the supply of an input power supply potential (first power supply potential) Vin and a terminal (second power supply terminal) for the supply of a reference potential (second power supply potential) GND. That is, the power MOS Q1 is provided in such a manner that its source-drain path is connected in series between the terminal ET1 and an output node (output terminal) N1. The power MOS Q2 is provided in such a manner that its source-drain path is connected in series between the output node N1 and the terminal for the supply of the ground potential GND. The input power supply potential Vin ranges from about 5 to 12V, for example. The reference potential GND, for example, is a power supply potential lower than the input power supply potential, e.g., 0 (zero)V corresponding to ground potential. The operating frequency (corresponding to a cycle or period in which each of the power MOSs Q1 and Q2 is turned on and off) of the non-insulated DC-DC converter 1 is about 1 MHz, for example.

The power MOS Q1 is a power transistor for a highside switch (high potential side: first operating voltage), and it has a switch function for storing energy into the coil L1 that supplies power to the output (the input of a load circuit 4) of the non-insulated DC-DC converter 1. The power MOS Q1 is formed of a vertical field effect transistor whose channel is formed in the direction of thickness of a semiconductor chip. According to the discussions of the present inventors, switching losses (turn-on loss and turn-off loss) greatly appear in sight in the power MOS Q1 due to each parasitic capacitance added to the power MOS Q1 as the operating frequency of the non-insulated DC-DC converter 1 becomes higher. It is thus desirable to normally employ a horizontal field effect transistor, whose channel is formed along a main surface (surface intersecting the thickness direction of the semiconductor chip) of the semiconductor chip, as the field effect transistor for the highside switch in consideration of the switching losses. This is because, since a horizontal field effect transistor is smaller than a vertical field effect transistor in terms of the area in which a gate electrode and a drain region overlap each other, the parasitic capacitance (gate parasitic capacitance) added between the gate and drain can be reduced. However, when an attempt is made to obtain a resistance (on resistance) formed at the operation of the horizontal field effect transistor at approximately the same value as the vertical field effect transistor, the cell area of the horizontal field effect transistor must be increased to be greater than or equal to about 2.5 times the cell area of the vertical field effect transistor. Therefore, it brings about a disadvantage in achieving a device size reduction. On the other hand, the channel width per unit area can be increased in the vertical field effect transistor, as compared with the horizontal field effect transistor, and its on resistance can be reduced. That is, the formation of the power MOS Q1 by the vertical field effect transistor makes it possible to realize a device size reduction and bring the packaging to a smaller size.

Figure 3:
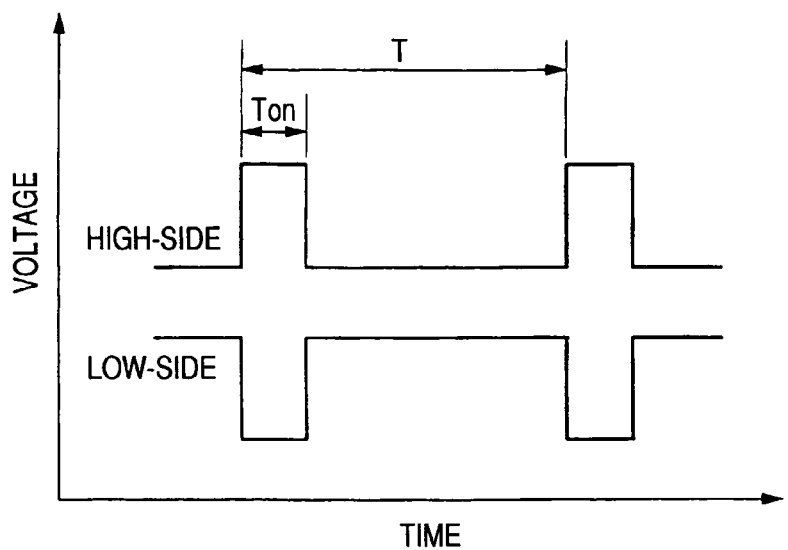
FIG. 3 is a timing chart showing one example of the operation of the semiconductor device shown in FIG. 1.

On the other hand, the power MOS Q2 is a power transistor for a lowside switch (low potential side: second operating voltage). Further, the power MOS Q2 is a rectifying transistor of the non-insulated DC-DC converter 1, and it has the function of performing rectification in sync with a frequency sent from the control circuit 2 with its resistance being held low. The power MOS Q2 is formed of a vertical power MOS whose channel is formed along the direction of thickness of the semiconductor chip in a manner similar to the power MOS Q1. This results from the following reasons, for example. FIG. 3 shows one example of a timing chart of the non-insulated DC-DC converter 1. Ton indicates the pulse width at the turning on of the power MOS Q1 for the highside switch, and T indicates the pulse cycle. As shown in FIG. 3, the power MOS Q2 for the lowside switch is longer than the power MOS Q1 for the highside switch in its on time (the time during which the voltage is being applied). Therefore, since a loss caused by the on resistance of the power MOS Q2, rather than the switching losses, greatly appear in sight in the power MOS Q2, it is advantageous to employ a vertical field effect transistor whose channel width per unit area can be increased, as compared with the horizontal field effect transistor. That is, since the on resistance can be reduced by forming the power MOS Q2 for the lowside switch using a vertical field effect transistor, the voltage conversion efficiency can be enhanced even though the current that flows through the non-insulated DC-DC converter 1 increases.

The output node N1 for supplying an output power supply potential to the outside is provided between wirings for connecting the source of the power MOS Q1 of the non-insulated DC-DC converter 1 shown in FIG. 1 and the drain of the power MOS Q2 thereof. The output node N1 is electrically connected to the coil L1 through an output wiring, and it is electrically connected to the load circuit 4 through an output wiring. The Schottky barrier diode D1, which has a lower forward voltage Vf than a parasitic diode Dp of the power MOS Q2, is electrically connected between the output wiring for connecting the output node N1 and the coil L1 and the terminal for the supply is of the reference potential GND so as to be parallel with the power MOS Q2. The anode of the Schottky barrier diode D1 is electrically connected to the terminal for the supply of the reference potential GND, whereas the cathode thereof is electrically connected to the output wiring for connecting the coil L1 and the output node N1. Connecting the Schottky barrier diode D1 in this way makes it possible to reduce the voltage drop at the dead time when the power MOS Q2 is turned off and to reduce a conduction loss in its diode. The diode recovery loss can be reduced by making a reverse recovery time (trr) fast.

The capacitor C1 is electrically connected between the output wiring for connecting the coil L1 and the load circuit 4 and the terminal for the supply of the reference potential GND. As the load circuit 4, a CPU (Central Processing Unit) or DSP (Digital Signal Processor) or the like of the electronic apparatus can be illustrated by way of example. Terminals ET2 and ET3 shown in FIG. 1 are terminals for supplying power supply voltages to the drivers 3a and 3b, respectively.

In such a circuit, the conversion of the power supply voltage is performed by alternately turning the power MOSs Q1 and Q2 on/off while being synchronized with each other. That is, when the power MOS Q1 for the highside switch is on, a current (first current) I1 flows from the terminal ET1, which is electrically connected to the drain of the power MOS Q1, to the output node N1 via the power MOS Q1. When the power MOS Q1 for the highside switch is off, a current I2 flows due to a back electromotive voltage of the coil L1. Turning on the power MOS Q2 for the lowside switch, when the current I2 is flowing, enables a reduction in the voltage drop. The current I1 is a large current of about 20A, for example.

Figure 4:
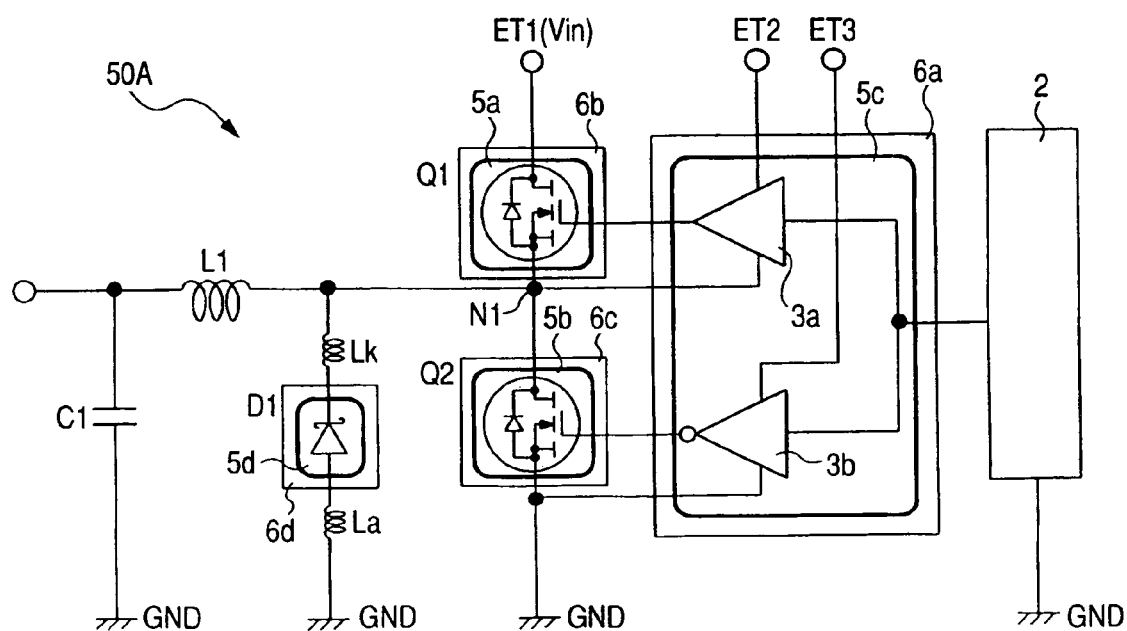
FIG. 4 is a schematic diagram showing one example of the packaging used for a semiconductor device considered by the present inventors.

One example of the packaging configuration of a non-insulated DC-DC converter discussed by the present inventors is shown in FIG. 4. In the non-insulated DC-DC converter 50A, a power MOS Q1 for a highside switch, a power MOS Q2 for a lowside switch, driver circuits 3a and 3b and a Schottky barrier diode D1 are respectively formed in discrete or separate semiconductor chips 5a through 5d, and they are respectively encapsulated in separate packages 6a through 6d. Then, the respective packages 6a through 6d are electrically connected to one another through wirings of a wiring board over which the packages 6a through 6d are mounted. However, it has been found by the present inventors that the following problems arise in such a package configuration.

The first problem is that, since the Schottky diode D1 is provided in the discrete package, the path of the wiring for electrically connecting the cathode of the Schottky barrier diode D1 and the output wiring of the DC-DC converter, and the path of the wiring for electrically connecting the anode of the Schottky barrier diode D1 and the ground wiring become long, to thereby increase the parasitic inductances Lk and La on these wirings, with the result that the effect of an improvement in the voltage conversion efficiency is reduced due to the connection of the Schottky barrier diode D1. That is, it is a problem that the commutation of a load current into the Schottky barrier diode D1 during the dead time (a period in which both power MOSs Q1 and Q2 are turned off) of the non-insulated DC-DC converter 1 is inhibited by the wiring inductances Lk and La, so that even though the Schottky barrier diode D1, which has a lower forward voltage Vf than the parasitic diode Dp, is connected, a sufficient effect cannot be obtained upon a reduction in diode conduction loss and a reduction in diode recovery loss due to the increase is speed of the reverse recovery time (trr). In the non-insulated DC-DC converter, a drive current necessary for the non-insulated DC-DC converter has recently been increased with an increase in the drive current of the load circuit 4. Further, the operating frequency of the non-insulated DC-DC converter is also becoming high from the viewpoint that a constant voltage is stably supplied and from the viewpoint that the coil L1 and the capacitor C1 are smaller in size (the overall dimension is scaled down by reducing the number of elements). Therefore, the problem caused by the wiring inductances Lk and La is becoming increasingly noticeable.

Figure 5:
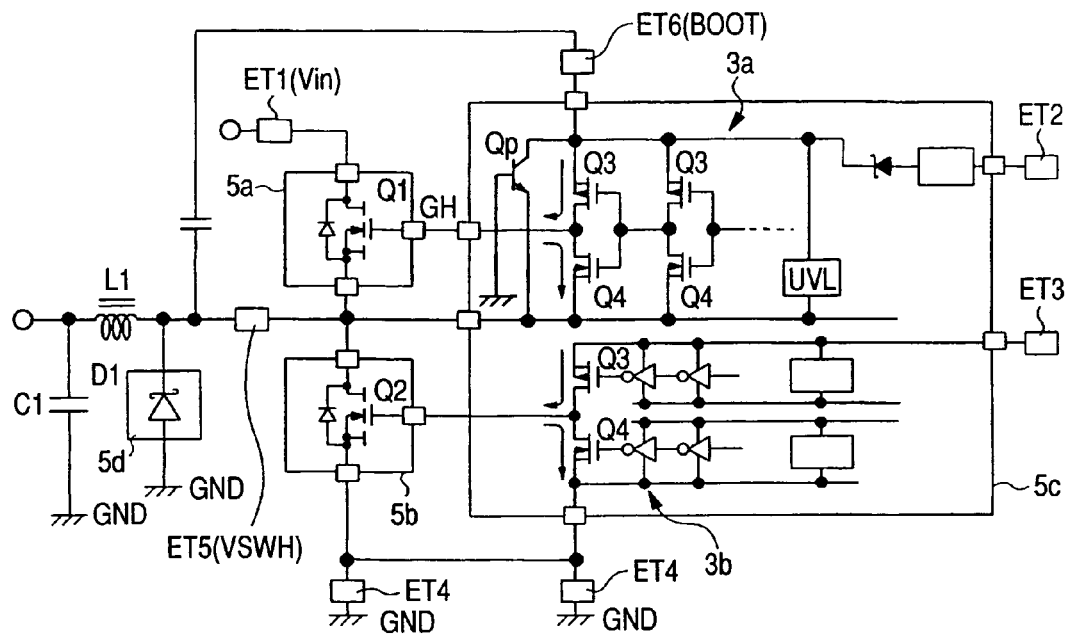
FIG. 5 is a schematic diagram of a circuit of the semiconductor device.
Figure 6:
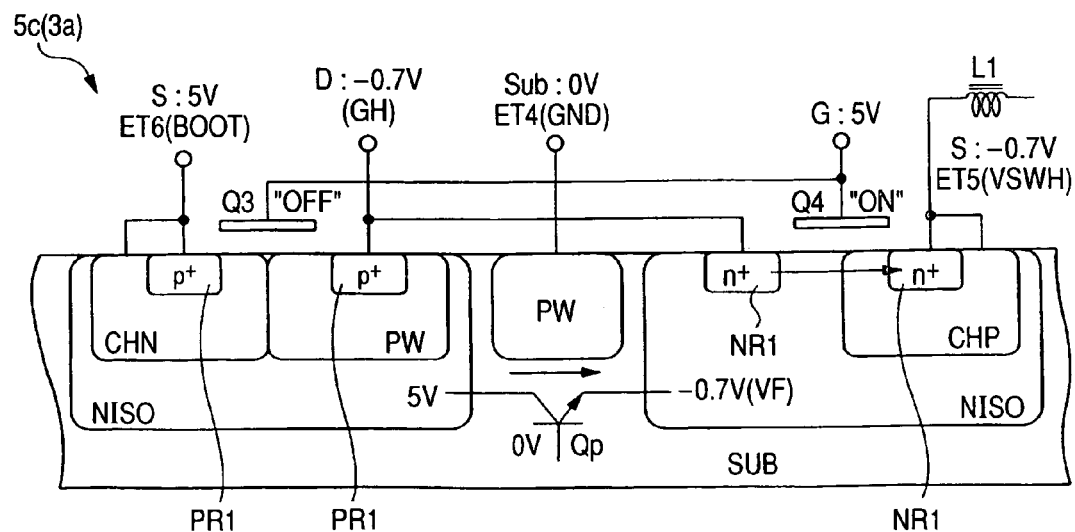
FIG. 6 is a diagram showing a parasitic operation of a semiconductor chip formed with a control chip.

The second problem is a problem that arises in the driver chip (semiconductor chip 5c) formed with the driver circuits 3a and 3b due to the commutation of the load current flowing into the Schottky barrier diode D1 being inhibited by the wiring inductances Lk and La. This problem will be explained with reference to FIGS. 5 and 6. FIG. 5 is a diagram of a non-insulated DC-DC converter including driver circuits 3a and 3b and their output stages, and FIG. 6 is a diagram showing the operation of a parasitic element or device of the semiconductor chip 5c formed with the driver circuit 3a. Each of terminals ET4 shown in FIG. 5 is a terminal for the supply of the reference potential GND, and a terminal ET5 is an output terminal of the non-insulated DC-DC converter 1. A terminal ET6 (BOOT) is a terminal for a bootstrap circuit, for controlling the gate of a power MOS Q1 for a highside switch. Since the potential at the source of the power MOS Q1 has a value that is higher than the reference potential GND (floating), a voltage is supplied from the terminal ET6 with respect to such a voltage. Symbol UVL indicates a protection circuit which, when the voltage between the terminals ET5 and ET6 does not reach a certain predetermined reference voltage, has the function of determining if an abnormal or improper state is occurring and automatically stopping the generation of an output of the non-insulated DC-DC converter 1. Symbol GH indicates the gate of the power MOS Q1 for the highside switch. A semiconductor substrate SUB shown in FIG. 6 corresponds to a substrate section of the semiconductor chip 5c and is formed of, for example, a p-type silicon (Si) monocrystal. Symbols NISO indicate n-type semiconductor regions, symbols PW indicate p-type semiconductor regions (p wells), symbol CHN indicates an n-type semiconductor region in which a channel of a p channel power MOS Q3 is formed, symbol CHP indicates a p-type semiconductor region in which a channel of an n channel power MOS Q4 is formed, symbols PR1 indicate $P^+$ type semiconductor regions for the source/drain of the p channel power MOS Q3, and symbols NR1 indicate $n^+$ type semiconductor regions for the source/drain of the n channel power MOS Q4.

In such a configuration, a load current is supplied through the Schottky barrier diode D1 at the dead times of both power MOSs Q1 and Q2. However, upon heavy loading, when the load current flowing through the Schottky barrier diode D1 is reduced due to the wiring inductances Lk and La, as described above, and the load current flows even into a parasitic diode (body diode) Dp of a power MOS Q2 for a lowside switch, the potential at the terminal ET5 (VSWH) on the output side of the non-insulated DC-DC converter 1 is reduced to a negative potential by a forward voltage Vf of the parasitic diode Dp, and the output of the driver chip (control IC) electrically connected to the power MOS Q1 is also brought to a negative potential, so that a parasitic npn bipolar transistor Qp is turned on within the semiconductor chip 5c, thereby causing a problem in that the current consumption of the driver chip increases. Further, a problem arises in that, when the amount of pulling-out of an electrical charge from the terminal ET6 increases and the potential between the terminals ET5 and ET6 becomes lower than a predetermined potential value, the protection circuit UVL is automatically operated so that a malfunction occurs in that the operation of the power MOS Q1 is stopped.

The third problem is that, since the Schottky barrier diode D1 is formed as a separate package, the system increases in size. A problem arises in that, particularly when a plurality of non-insulated DC-DC converters are electrically connected to one load circuit 4 to construct an overall system, a reduction in the size of the overall system is impaired where the Schottky barrier diode D1 is connected to each individual non-insulated DC-DC converter in the separate package.

The fourth problem is that, since the power MOS Q1 for the highside switch, the power MOS Q2 for the lowside switch, the driver circuits 3a and 3b and the Schottky barrier diode D1 are accommodated in discrete packages 6a through 6d, the wiring paths extending among the respective semiconductor chips 5a through 5d (packages 6a through 6d) become long and the parasitic inductances on their wiring sections increase, so that the non-insulated DC-DC converter 50A experiences a reduced voltage conversion efficiency.

Figure 7:
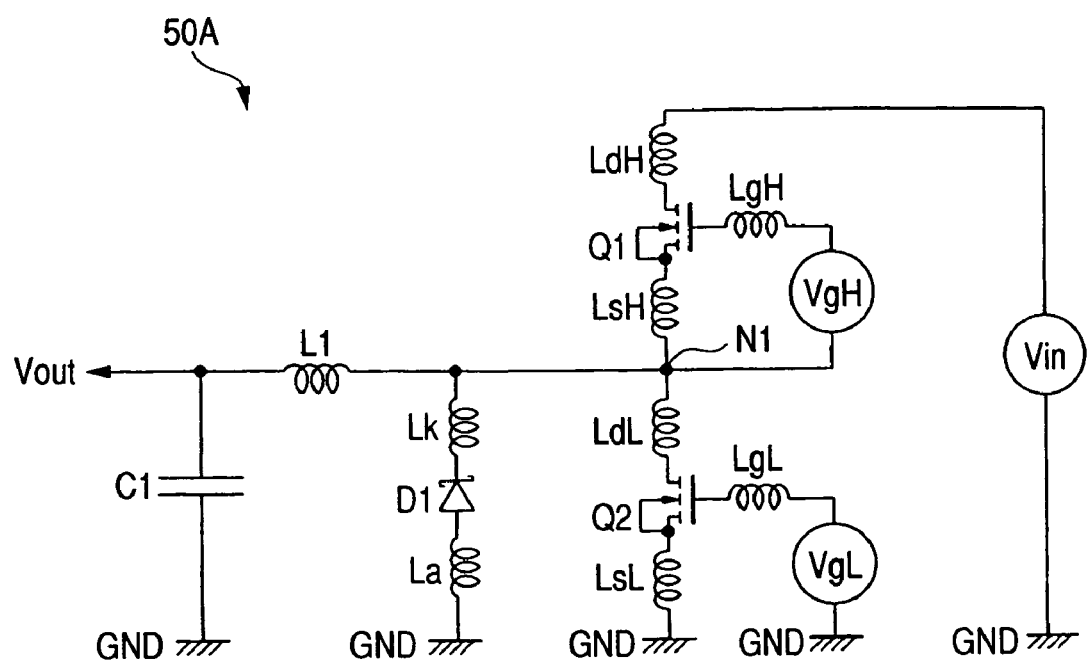
FIG. 7 is an equivalent circuit diagram showing parasitic inductance components on the semiconductor device shown in FIG. 4.

FIG. 7 is an equivalent circuit diagram showing the parasitic inductance components on the non-insulated DC-DC converter 50A. Symbols LdH, LgH, LsH, LdL, LgL and LsL indicate parasitic inductances on wirings or the like of the packages of the power MOSs Q1 and Q2, and a printed wiring board. Symbol VgH indicates a gate voltage for turning on the power MOS Q1, and symbol VgL indicates a gate voltage for turning on the power MOS Q2. Due to the influences of the parasitic inductance LsH on the source side of the power MOS Q1 for the highside switch, the parasitic inductance LgH on the gate side thereof, and the parasitic inductance LsL on the source side of the power MOS Q2 for the lowside switch, the voltage conversion efficiency of the non-insulated DC-DC converter 50A is decreased. Particularly, when the parasitic inductance LsH increases, a turn-on loss and a turn-off loss (turn-on loss in particular) of the power MOS Q1 for the highside switch become significantly large, so that the voltage conversion efficiency of the non-insulated DC-DC converter 50A is significantly reduced. Since the turn-on loss and the turn-off loss are proportional to the frequency and the output current, loss components become large as the increase in the current of the non-insulated DC-DC converter 50A and the increase in its frequency proceed as described above.

Figure 8:
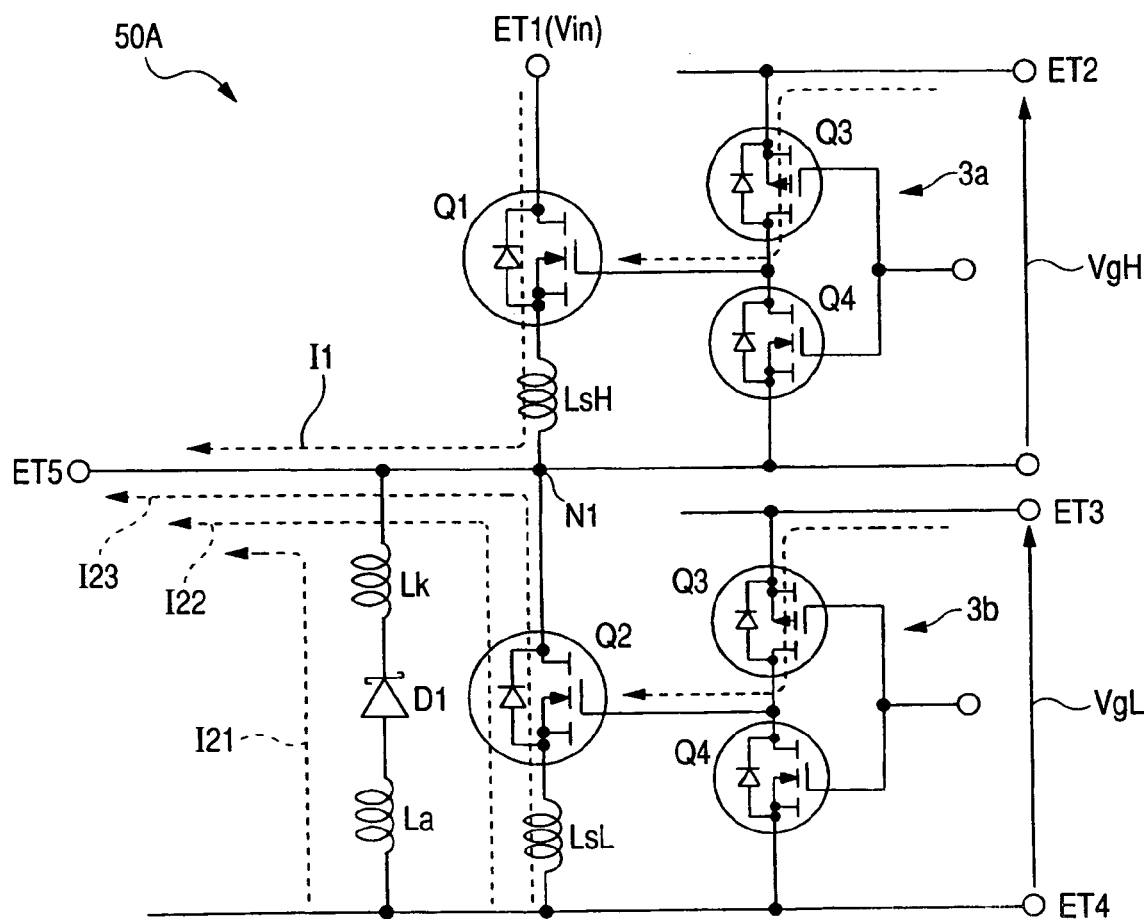
FIG. 8 is a schematic diagram showing a circuit operation of the semiconductor device.
Figure 9:
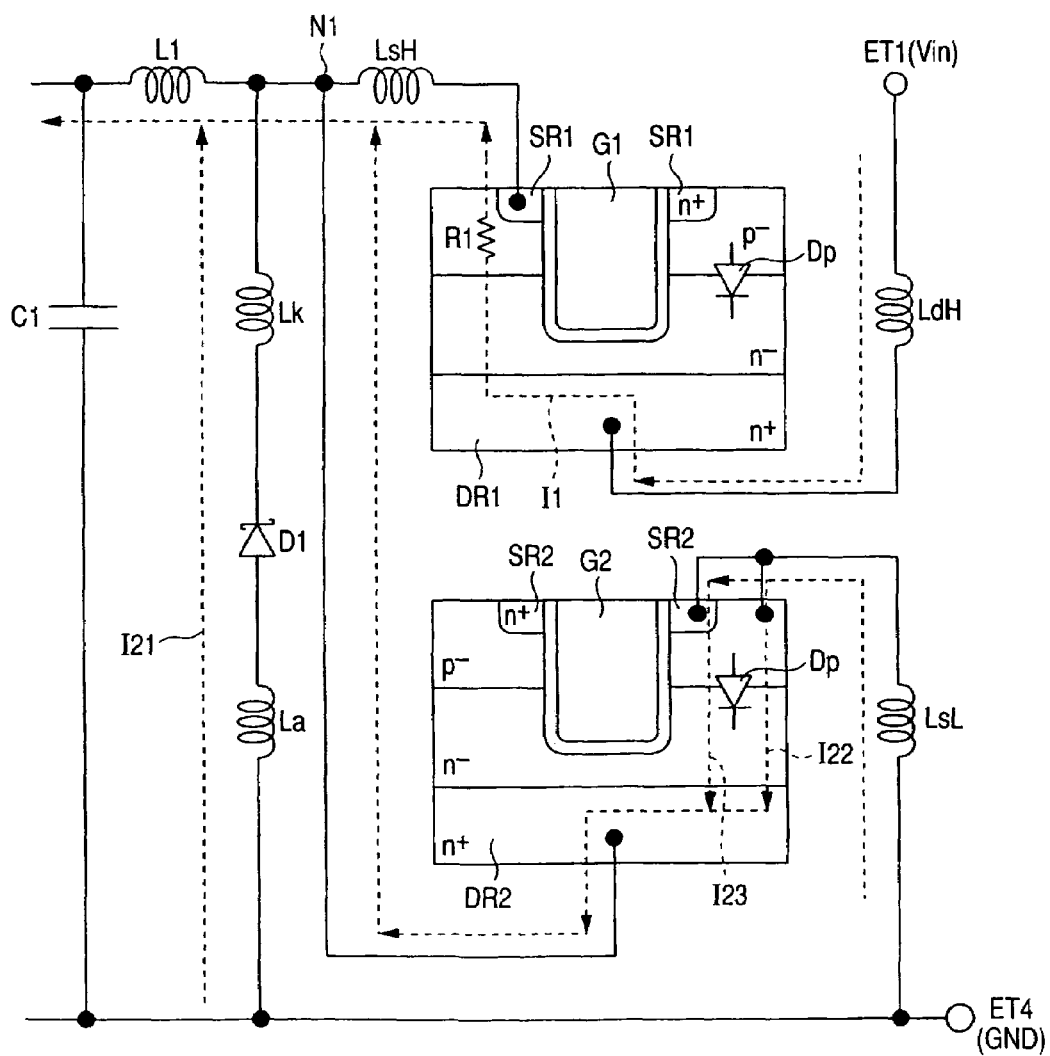
FIG. 9 is a diagram showing a device section at the circuit operation of FIG. 8.

A description will next be made of the cause of the problem in which, when the parasitic inductance LsH increases, turn-on and turn-off become slow so that the turn-on loss and the turn-off loss increase. FIG. 8 is a diagram illustrating the circuit operation of the non-insulated DC-DC converter 50A, and FIG. 9 is a diagram showing a device section at the time of the circuit operation shown in FIG. 8.

When the gate voltage of the power MOS Q1 for the highside switch exceeds a threshold voltage and a current (first current) I1 starts to flow from a drain region DR1 of the power MOS Q1 to a source region SR1 thereof, a back electromotive force (LsH×di/dt) is generated due to the parasitic inductance LsH, and, hence, the source potential of the power MOS Q1 for the highside switch becomes high as compared with the output node N1. Since the gate voltage of the power MOS Q1 is supplied from the driver circuit 3a with the output node N1 as the reference, the voltage applied between a gate electrode G1 connected to the gate of the power MOS Q1 for the highside switch and the source region SR1 becomes lower than the gate voltage VgH. Therefore, a loss of the current I1 is generated since the channel resistance R1 of the power MOS Q1 for the highside switch has not been sufficiently lowered. That is, the turn-on time becomes long. The reason why the turn-on loss and the turn-off loss increase due to the increases in power and frequency, as described above, is that the back electromotive force (LsH×di/dt) increases due to the increases in power and frequency.

Since the power MOS Q1 for the highside switch has a switch function for storing energy into the coil L1 that supplies power to the output (the input of the load circuit 4) of the non-insulated DC-DC converter 50A, a speeding up of the switching operation is required upon an increase in frequency. However, since the parasitic inductance LgH is present between the driver circuit 3a and the power MOS Q1, the switching operation becomes slow. That is, a switching loss is produced, and the efficiency of voltage conversion is reduced.

On the other hand, the power MOS Q2 for the lowside switch has a configuration in which it is hard to cause the above-described switching loss, as compared with the power MOS Q1. That is, when the power MOS Q1 for the highside switch is turned off, a current (second current) I2 flows into the output side through the Schottky barrier diode D1 that is parallel-connected to the power MOS Q2 for the lowside switch. Further, a current (second current) I22 flows from the reference potential GND to a drain region DR2 of the power MOS Q2 through the parasitic diode Dp. When the gate voltage VgL is applied to its corresponding gate electrode G2 connected to the gate of the power MOS Q2 for the lowside switch to turn on the power MOS Q2 in this state, a current (third current) I23 flows from a source region SR2 of the power MOS Q2 to the drain region DR2 through a channel region thereof. However, since the currents I21 and I22 already flow before the current I23 flows and the amount of change in current per unit time, at the time that the current I23 flows, is small, the back electromotive force produced due to the parasitic inductance LsL is negligibly small, thus leading to no substantial loss. However, when the parasitic inductances La and Lk parasitized on the anode and cathode sides of the Schottky barrier diode D1 are large, as described above, the current I21 flowing on the Schottky barrier diode D1 side becomes small, and, hence, a sufficient effect cannot be obtained by connecting the Schottky barrier diode D1, which has a smaller forward voltage than the parasitic diode Dp. Incidentally, while the parasitic diode Dp exists even in the power MOS Q1 for the highside switch, in a like manner, the parasitic diode Dp on the power MOS Q1 for the highside switch is formed with an anode on the source region SR1 side of the power MOS Q1 and a cathode on the drain region DR1 side thereof. Thus, the parasitic diode Dp is not connected in the forward direction with respect to the same direction as the current (first current) I1 that flows from the drain region DR1 of the power MOS Q1 to the source region SR1 thereof. Therefore, no current flows through the power MOS Q1 before the gate voltage VgH is applied to turn on the power MOS Q1, and the amount of change in current per unit time is not reduced, thus leading to the occurrence of a switching loss.

The power MOS Q2 is a rectifying transistor for the non-insulated DC-DC converter 50A and has the function of performing rectification in sync with a frequency sent from the control circuit 2 with its resistance being held low. Therefore, since the on time of the power MOS Q2 is longer than that of the power MOS Q1, as described above, a loss caused by its on resistance rather than the switching loss becomes remarkable, and so there is a need to reduce the on resistance. However, since a wiring resistance (wiring impedance) caused by the parasitic inductance LsL exists between the power MOS Q2 and the terminal (second power supply terminal) ET4, which is supplied with the reference potential GND, the on resistance increases and the efficiency of the current conversion is reduced.

Figure 10:
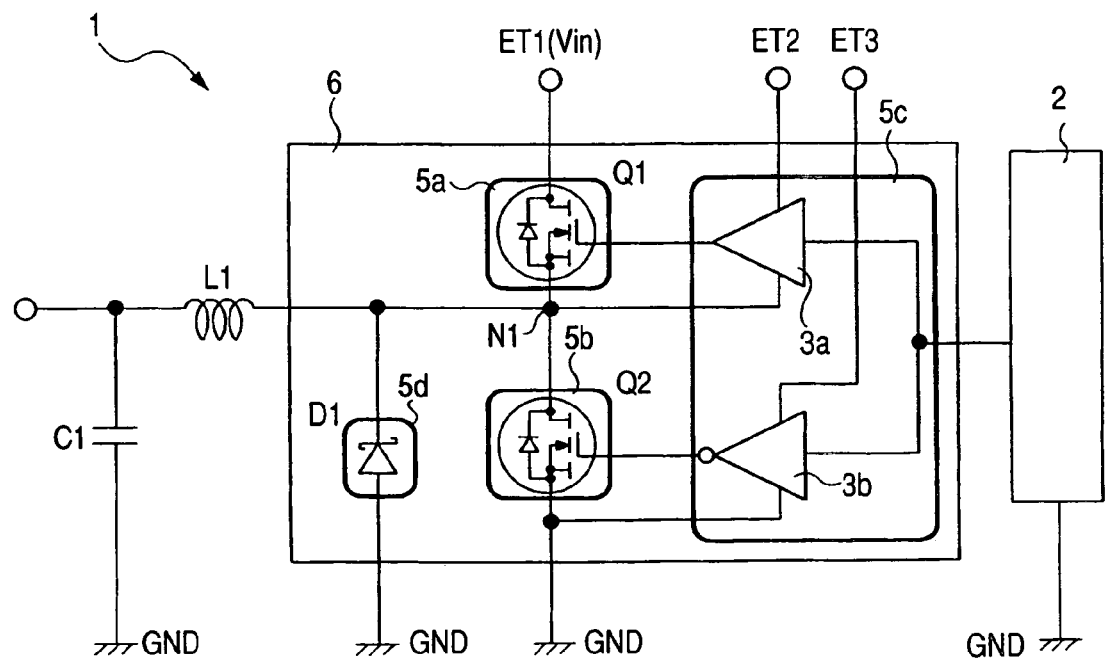
FIG. 10 is a schematic diagram showing an a configuration example of the semiconductor device according to the first embodiment of the present invention.

Thus, the present first embodiment is constructed as illustrated in FIG. 10 by way of example, wherein the power MOS Q1 for the highside switch, the power MOS Q2 for the lowside switch, the driver circuits 3a and 3b and the Schottky barrier diode D1 that constitute the non-insulated DC-DC converter 1 are respectively formed in discrete semiconductor chips 5a through 5d (first through fourth semiconductor chips), and the plurality of semiconductor chips 5a through 5d are accommodated in the same package 6. First, the power MOS Q2 for the lowside switch and the Schottky barrier diode D1 are accommodated in the same package 6. Consequently, the wiring extending between the power MOS Q2 and the Schottky barrier diode D1 can be shortened as compared with a construction in which they are respectively accommodated in discrete packages. Therefore, it is possible to reduce the parasitic inductances La and Lk on the wiring. Thus, since the effect of the Schottky barrier diode D1 can be sufficiently brought about, the diode conduction loss, and the diode recovery loss caused due to a reverse recovery time (trr) being made fast, can be reduced, and the voltage conversion efficiency of the non-insulated DC-DC converter 1 can be improved. Since the effect of the Schottky barrier diode D1 can be sufficiently brought about, it is possible to suppress or prevent the turning on of a parasitic npn type bipolar transistor Qp within the semiconductor chip 5c formed with the driver circuits 3a and 3b and to suppress or prevent an increase in the current consumption of a circuit lying within the semiconductor chip 5a. It is further possible to suppress a pulling out of an electrical charge from the terminal ET6, to inhibit or prevent the potential between both terminals ET5 and ET6 from becoming lower than a prescribed potential value, and to suppress or prevent a stop operation (malfunction) of the power MOS Q1 due to the operation of the protection circuit UVL. Therefore, the reliability of operation of the non-insulated DC-DC converter 1 can be enhanced. Furthermore, since the Schottky barrier diode D1 is accommodated in the same package 6, the system can be small-sized.

Accommodating the semiconductor chips 5a through 5d in the same package 6 makes it possible to shorten the paths for wirings of the respective semiconductor chips 5a through 5d. It is thus possible to reduce the parasitic inductances LdH, LgH, LsH, LdL, LgL and LsL on their wirings. Therefore, the voltage conversion efficiency of the non-insulated DC-DC converter 1 can be enhanced. Also, the non-insulated DC-DC converter 1 can be miniaturized.

When attention is now paid only to a size reduction and a reduction in inductance, it can also be considered that the power MOS Q2 for the lowside switch and the Schottky barrier diode D1 may be preferably formed in the same semiconductor chip. However, it is not possible to sufficiently bring out their device characteristics in this case. Since the thickness of an epitaxial layer is required to some degree to ensure a withstand voltage on the Schottky barrier diode D1 side in particular, the performance of the power MOS Q2 for the lowside switch is degraded where the MOS Q2 is provided in the semiconductor chip formed with the Schottky barrier diode D1. Further, a problem also arises in that the manufacturing process becomes complex, time is taken to manufacture each semiconductor chip, and its cost increases. In the present embodiment, from such a viewpoint, the power MOS Q2 for the lowside switch and the Schottky barrier diode D1 are respectively formed in the discrete semiconductor chips 5b and 5a in parts. Thus, their device characteristics can sufficiently be brought out as compared with the case in which the power MOS Q2 for the lowside switch and the Schottky barrier diode D1 are formed in the same semiconductor chip. Therefore, it is possible to enhance the operating characteristics of the non-insulated DC-DC converter 1. Since the manufacturing process of the non-insulated DC-DC converter 1 can be facilitated, the time required to manufacture the non-insulated DC-DC converter 1 can be shortened, and its cost can be lowered.

If attention is paid only to a size reduction and a reduction in inductance in like manner, it is then considered that the power MOS Q1 for the highside switch and the power MOS Q2 for the lowside switch may preferably be formed in the same semiconductor chip. Likewise, even in this case, however, their device characteristics cannot be brought out sufficiently where the respective transistors are formed in the same semiconductor chip. Further, a problem also arises in that the manufacturing process becomes complex, the time required to manufacture the semiconductor chip is increased, and its cost increases. Since the power MOS Q2 for the lowside switch is longer than the power MOS Q1 for the highside switch in on time, as mentioned above, it is easy to generate heat. Thus, there is also a fear that, when both power MOSs Q1 and Q2 are formed in the same semiconductor chip, the heat generated upon the operation of the power MOS Q2 for the lowside switch exerts an influence on the power MOS Q1 for the highside switch through the semiconductor substrate. In the present embodiment, from such a viewpoint, the power MOS Q1 for the highside switch, the power MOS Q2 for the lowside switch and the driver circuits 3a and 3b are formed in their corresponding discrete semiconductor chips 5a through 5c in parts. Thus, their device characteristics can sufficiently be brought out as compared with the case where the power MOS Q1 for the highside switch, the power MOS Q2 for the lowside switch and the driver circuits 3a and 3b are formed in the same semiconductor chip. Since the manufacturing process of the non-insulated DC-DC converter 1 can be facilitated, the time required to manufacture the non-insulated DC-DC converter 1 can be shortened and its cost can be reduced. Since it is possible to prevent the power MOS Q1 for the highside switch and the driver circuits 3a and 3b from being adversely affected by heat generated upon the operation of the power MOS Q2 for the lowside switch, the stability of the operation of the non-insulated DC-DC converter 1 can be enhanced.

Incidentally, since the driver circuits 3a and 3b are alternately operated in sync with each other, they are formed in the same semiconductor chip 5c in terms of the stability of an overall circuit operation.

Meanwhile, it is important that the Schottky barrier diode D1 is accommodated in the same package 6 as the power MOSs Q1 and Q2 and the driver circuits 3a and 3b as described above in order to enhance the voltage conversion efficiency of the non-insulated DC-DC converter 1. However, a sufficient effect cannot be obtained in terms of the improvement in voltage conversion efficiency where the Schottky barrier diode D1 is merely accommodated in the same package 6. A description will therefore be made of an example of a specific configuration of the inside of the package 6 that is important to enhance the voltage conversion efficiency of the non-insulated DC-DC converter 1.

Figure 11:
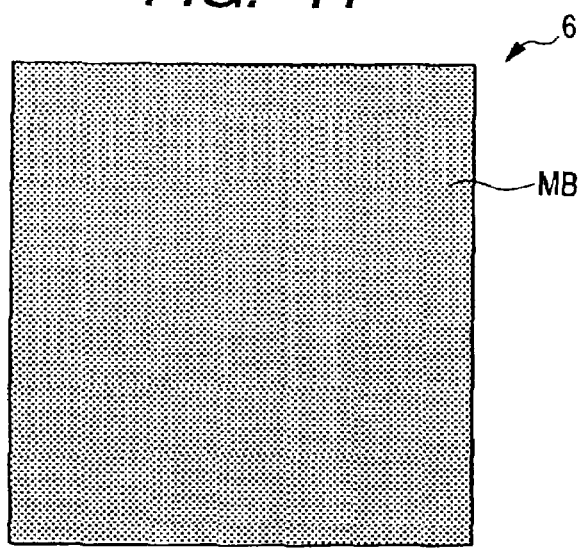
FIG. 11 is an overall plan view showing a main surface side of the semiconductor device shown in FIG. 10.
Figure 12:
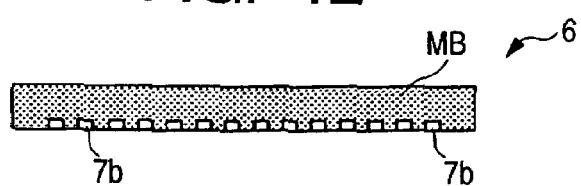
FIG. 12 is a side view showing the semiconductor device shown in FIG. 11.
Figure 13:
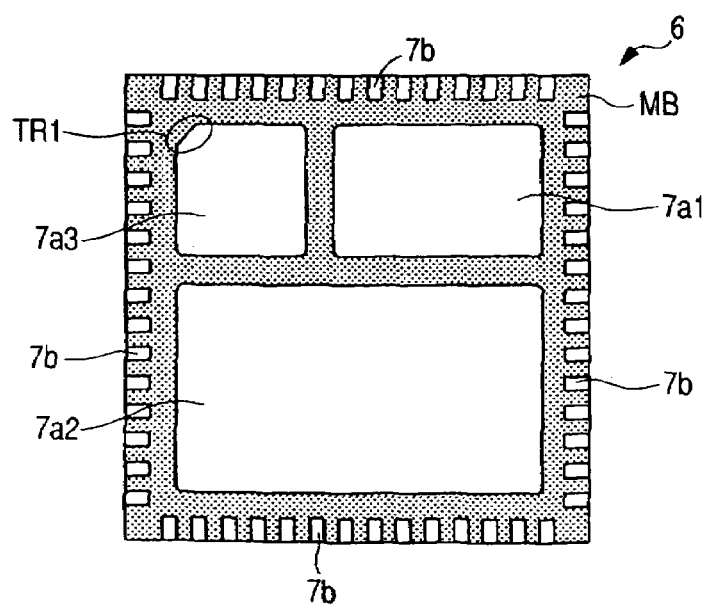
FIG. 13 is an overall plan view illustrating a back surface side of the semiconductor device shown in FIG. 11.
Figure 14:
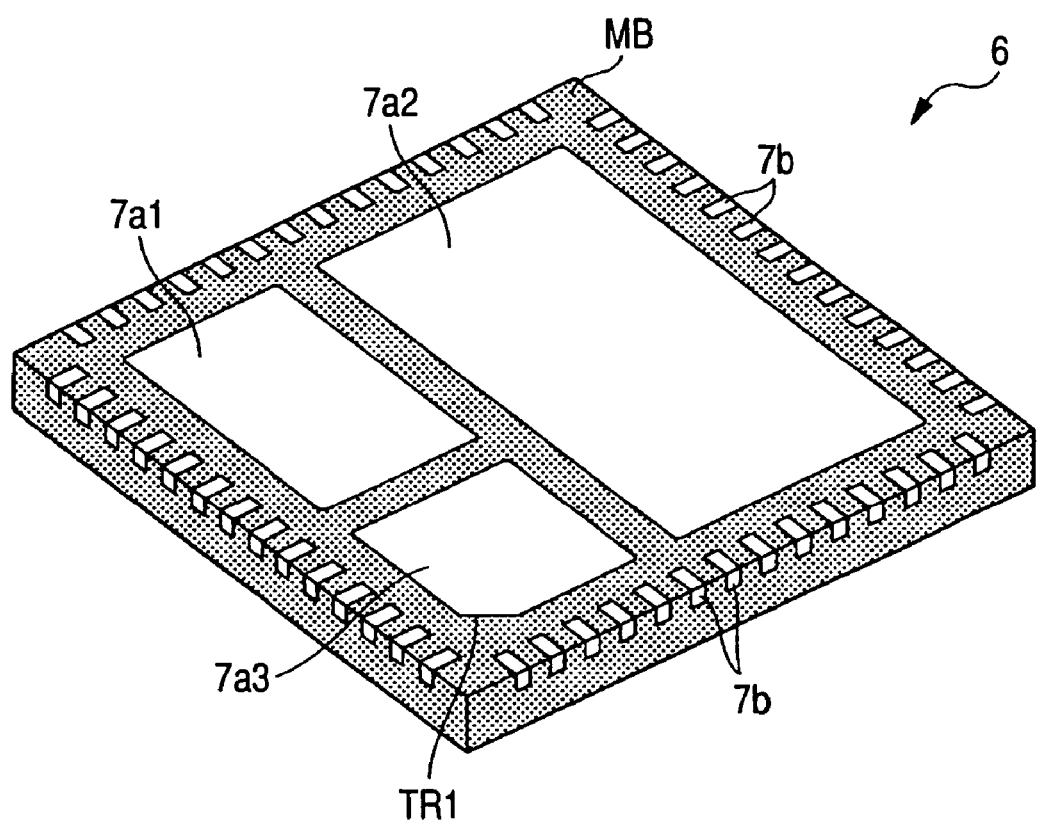
FIG. 14 is a perspective view showing an outward appearance of the semiconductor device shown in FIG. 11.

FIG. 11 is an overall plan view showing a main surface side of the package 6, FIG. 12 is a side view of the package 6 shown in FIG. 11, FIG. 13 is an overall plan view showing a back surface side of the package 6 shown in FIG. 11, and FIG. 14 is a perspective view showing an outward appearance of the package 6 shown in FIG. 11.

The package 6 of the present embodiment is provided in the form of, for example, a QFN (Quad Flat Non-leaded package) configuration. However, the package is not limited to a QFN configuration and can be changed in various ways. The package may be provided as a flat package configuration, like a QFP (Quad Flat Package) or an SOP (Small Out-line Package) or the like.

A resin molded body MB that constitutes the package 6 has an outward appearance shaped in the form of a thin plate. The resin molded body MB is formed of, for example, an epoxy resin. As a material for the resin molded body MB, for example, a phenol curing agent, silicone rubber and a biphenyl thermosetting resin added to a filler or the like may be used for reasons such as a reduction in stress, etc. As a method of forming the resin molded body MB, a transfer molding method suitable for mass production is used. The back surfaces of three die pads 7a1, 7a2 and 7a3 (first through third chip mounting sections) whose plane or flat surfaces are substantially rectangular, for example, are exposed from a back surface of the resin molded body MB. Parts of a plurality of leads (external terminals) 7b are exposed from the four side surfaces of the resin molded body MB and the outer periphery of the back surface thereof along the outer periphery of the resin molded body MB. The die pads 7a1, 7a2 and 7a3 and the leads 7b are formed with a metal material like, for example, a 42-alloy or the like as a main material. The thickness of each of the die pads is about 200 µm, for example. As another material for the die pads 7a1, 7a2 and 7a3 and the leads 7b, for example, one in which copper (Cu) or the surface thereof is plated with nickel (Ni), palladium (Pd) and gold (Au) in order from the surface, may also be used. As will be described later, the semiconductor chips 5a and 5b are mounted over their corresponding main surfaces of the die pads 7a1 and 7a2. Further, the semiconductor chips 5c and 5d are mounted over their corresponding main surface of the die pad 7a3. A positioning taper TR1 (index mark) is formed at one corner of the die pad 7a3. The taper TR1 is used, for example, for face-to-face alignment at the time of shipment of the package 6 and provides a distinction between the main and back surfaces of the package 6 when a trade mark or the like is applied onto the package 6. The taper TR1 is formed by etching, for example. There is a fear that, since the die pads 7a1 and 7a2, with the semiconductor chips 5a and 5b formed with the power MOSs Q1 and Q2 being mounted thereon, respectively correspond to sections supplied with the currents I1 and I2 from the first and second power supply terminals, their outer dimensions become small when the taper TR1 is formed, and, hence, this exerts an influence on current characteristics. On the other hand, since no dynamic current flows through the die pad 7a3 and the potential is fixed, it is not necessary to worry about or care about the current characteristics so much. Therefore, the positioning taper TR1 is preferably formed at some area of the die pad 7a3.

Incidentally, the back surfaces (surfaces opposite to the surfaces over which the semiconductor chips 5a, 5b and 5c are mounted) and the back surfaces (junction surface bonded to terminals of a wiring board) of the leads 7b both exist in the mounting surface (surface opposite to the wiring board when the package 6 is mounted over the wiring board) of the package 6.

Figure 15:
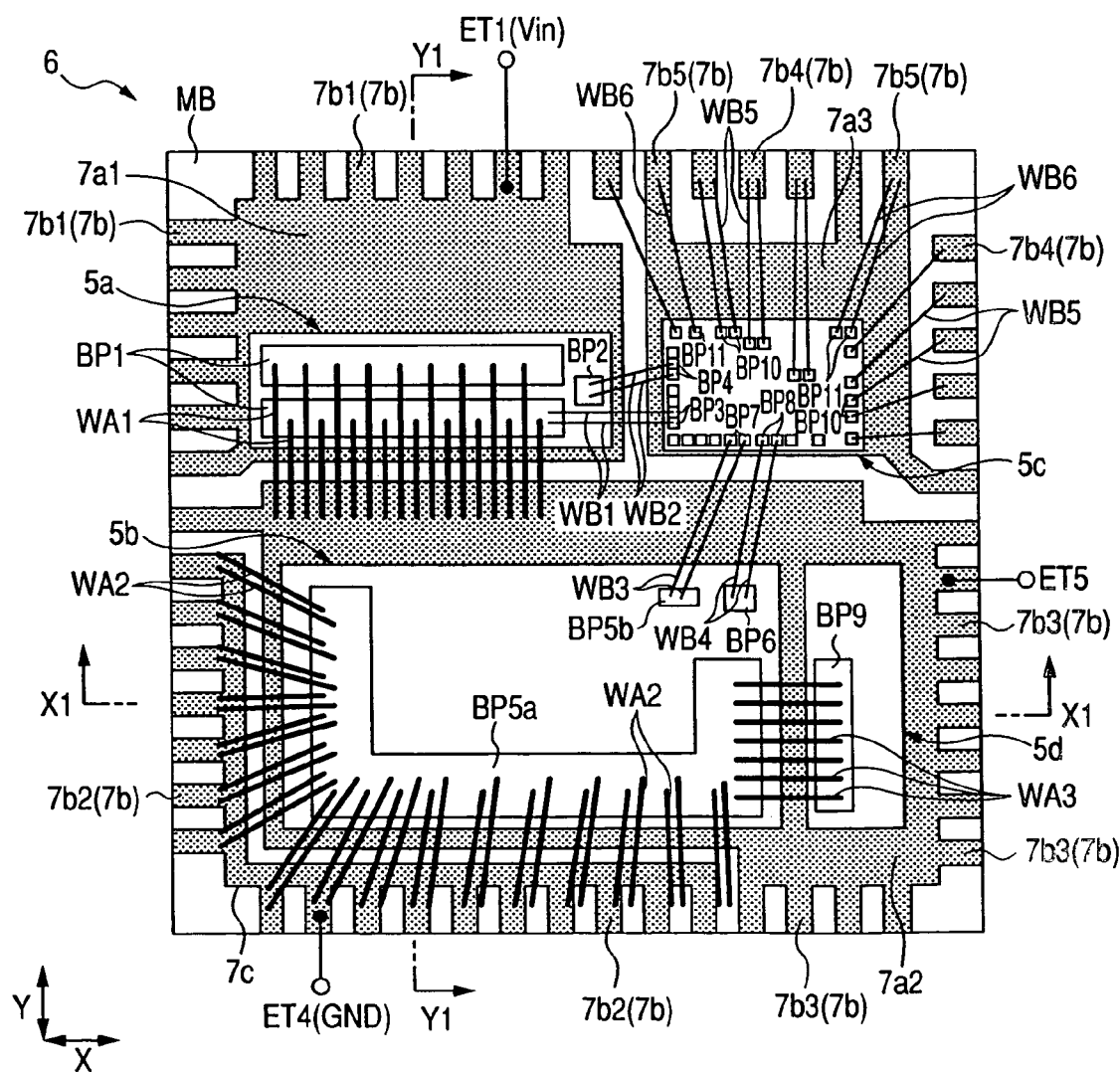
FIG. 15 is an overall plan view showing a main surface side of a package as seen through the inside of the package of the semiconductor device shown in FIG. 11.
Figure 16:
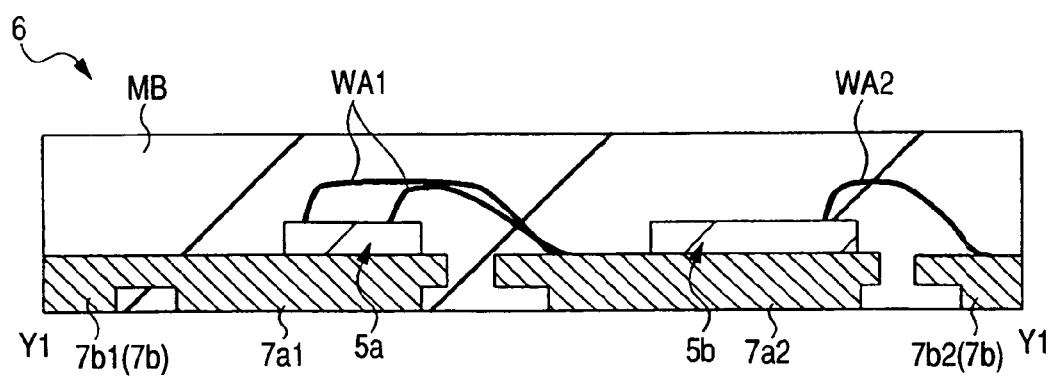
FIG. 16 is a cross-sectional view taken along line Y1-Y1 of FIG. 15.
Figure 17:
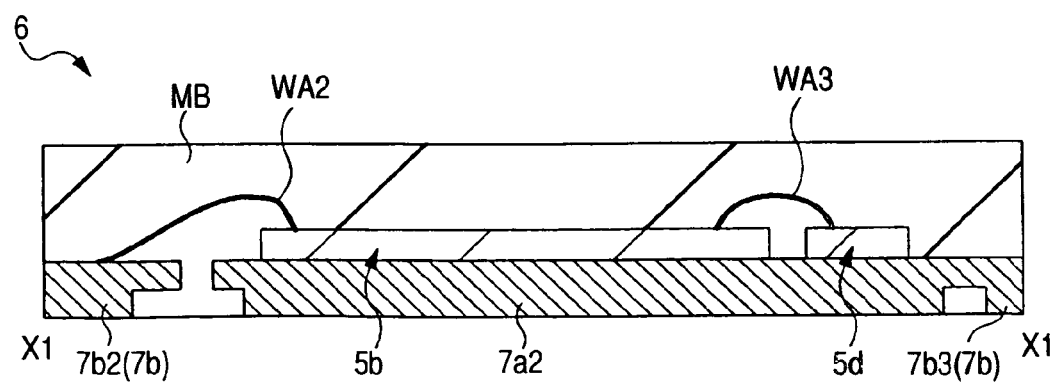
FIG. 17 is a cross-sectional view taken along line X1-X1 of FIG. 15.

FIG. 15 is an overall plan view showing the main surface side of the package 6 as seen through the inside of the package 6, FIG. 16 is a cross-sectional view taken along line Y1-Y1 of FIG. 15, and FIG. 17 is a cross-sectional view taken along X1-X1 of FIG. 15. Incidentally, while FIG. 15 is a plan view, the die pads 7a1 through 7a3, leads 7b and wiring section 7c have been hatched to make it easy to see these elements in the drawings.

The three die pads 7a1 through 7a3 (first through third chip mounting sections); a plurality of semiconductor chips 5a through 5d respectively mounted over the die pads 7a1 through 7a3 as will be described later, and bonding wires (hereinafter called simply "wires") WA1 through WA3 and WB1 through WB6 for electrically connecting bonding pads (hereinafter called simply "pads") BP1 through BP11 of the semiconductor chips 5a through 5d to respective parts or sections are encapsulated in the package 6.

The die pads 7a1 through 7a3 are disposed adjacent to one another in a state in which they are spaced away from one another at predetermined intervals. Heat generated when the semiconductor chips 5a through 5c are operated is principally radiated from the back surface sides of the die pads 7a1 through 7a3 to the outside through the die pads 7a1 through 7a3, as viewed from the back surfaces of the semiconductor chips 5a through 5c. Therefore, the die pads 7a1 through 7a3 are respectively formed to be greater in area than the areas of the semiconductor chips 5a through 5c. Thus, the radiation of the non-insulated DC-DC converter 1 can be improved and its operational stability can be enhanced. Some of the outer peripheries on the back surface sides of the die pads 7a1 through 7a3 and leads 7b are formed with half etching areas in such a manner that their thicknesses become thin. This is done to enhance the adhesion between the die pads 7a1 through 7a3 and leads 7b and the resin molded body MB so as to reduce or prevent peeling of the die pads 7a1 through 7a3 and leads 7b and deformation and failures thereof.

The semiconductor chip 5a formed with the power MOS Q1 for the highside switch is disposed over the upper left die pad 7a1 shown in FIG. 15 in a state in which its main surface is turned up. The pads BP1 for a source electrode of the power MOS Q1 and the pad BP2 for its gate electrode are disposed over the main surface of the semiconductor chip 5a. The pads BP1 are electrically connected to the die pad 7a2 through the plurality of wires WA1, and they are electrically connected to the pads BP3 for the source electrode of the driver circuit 3a of the semiconductor chip 5c through the plurality of wires WB1. The pad BP2 for the gate electrode is electrically connected to the pads BP4 for the output (drain) electrode of the driver circuit 3a of the semiconductor chip 5c through the plurality of wires WB2. Further, the back surface of the semiconductor chip 5a is formed as a drain electrode connected to the drain of the power MOS Q1 and is electrically connected to the plurality of leads 7b1 (7b) formed integrally with the outer periphery of the die pad 7a1 through the die pad 7a1. The leads 7b1 are electrically connected to the terminal ET1. Incidentally, the wires WA1 are disposed alternately in such a manner that the wires WA1 adjacent in a first direction X are alternately connected to the upper and lower pads BP1.

The semiconductor chip 5a formed with the power MOS Q1 for the highside switch is shaped in the form of a rectangle in which the length thereof in the first direction X of FIG. 15 is longer than that in a second direction Y orthogonal thereto. The semiconductor chip 5a is disposed out of position so as to approach the die pad 7a2 from the center of the die pad 7a1. That is, the semiconductor chip 5a is disposed so as to approach one side of the die pad 7a1 adjacent to one side of the die pad 7a2. Disposing the semiconductor chip 5a so as to approach the die pad 7a2 in this way makes it possible to shorten the lengths of the wires WA1 for electrically connecting the pads BP1 for the source electrode of the power MOS Q1 and the die pad 7a2. Therefore, it is possible to reduce the parasitic inductance LsH developed between the source of the power MOS Q1 and the drain of the power MOS Q2. The semiconductor chip 5a is disposed in such a manner that its long side extends along the long side adjacent thereto, of the die pad 7a2. Thus, since the length in which the pads BP1 for the source electrode of the semiconductor chip 5a and the die pad 7a2 are opposed to each other, can be ensured, the inductance LsH formed between the source of the power MOS Q1 and the drain of the power MOS Q2 can be reduced by placing the wires WA1 in plural form. Since the length of a gate wiring pattern extending in the second direction Y of FIG. 15 and formed of polysilicon, can be shortened owing to the formation of the semiconductor chip 5a in the form of a rectangle, the gate resistance of the power MOS Q1 can be reduced. Further, the semiconductor chip 5a is disposed in such a manner that the distance between the semiconductor chips 5a and 5c becomes shorter than the distance between the semiconductor chips 5a and 5b, and, particularly, the distance between the pad BP2 for the gate electrode of the semiconductor chip 5a and each pad BP4 for the output electrode of the semiconductor chip 5c decreases. This is a construction having considered that in the power MOS Q1 for the highside switch, an increase in inductance of its gate greatly exerts an influence on an increase in switching loss. By placing the semiconductor chip 5a so as to approach the semiconductor chip 5c, the length of each wire WB2 for electrically connecting the pad BP2 for the gate electrode of the power MOS Q1 and its corresponding pad BP4 for the output electrode of the driver circuit 3a can be shortened. It is therefore possible to reduce the parasitic inductance LgH on the gate of the power MOS Q1 and reduce the switching loss of the power MOS Q1. Owing to the above placement of the semiconductor chip 5a, the switching loss of the power MOS Q1 can be reduced and the voltage conversion efficiency of the non-insulated DC-DC converter 1 can be enhanced.

The two types of wires WA1 and WB1 are electrically connected to the pads BP1 for the source electrode of the semiconductor chip 5a. That is, the wires electrically connected to the pads BP1 for the source electrode of the semiconductor chip 5a are divided into the wires WA1 connected to the die pad 7a2 and the wires WB1 connected to the source of the driver circuit 3a. Thus, since paths for a current I1 that flows from the source of the power MOS Q1 to an output terminal through the die pad 7a2, and a current that flows toward the driver circuit 3a can be dispersed, current loads that occur in the respective wires WA1 and WB1 can be reduced. Therefore, since the parasitic inductance produced between the power MOS Q1 and the driver circuit 3a can be reduced, the switching loss can be further improved.

While the wires WA1, WB1 and WB2 are formed, for example, of gold (Au), the wires WA1 are thicker than the wires WB1 and WB2. Thus, since the wiring inductance on the source side of the power MOS Q1 can be reduced, the switching loss of the non-insulated DC-DC converter 1 can be reduced and its voltage conversion efficiency can be enhanced.

The semiconductor chip 5b, formed with the power MOS Q2 for the lowside switch, and the semiconductor chip 5d, formed with the Schottky barrier diode D1, are disposed over the downside die pad 7a2 of FIG. 15, which is largest in area, in a state in which their main surfaces are turned up. Pads BP5a and BP5b for a source electrode of the power MOS Q2, and a pad BP6 for its gate electrode are disposed over the main surface of the semiconductor chip 5b. The pad BP5a for the source electrode is electrically connected to leads 7b2 (7b) through a plurality of wires WA2, and the pad BP5b is electrically connected to pads BP7 for a source electrode of the driver circuit 3b of the semiconductor chip 5c through a plurality of wires WB3. The pad BP6 for the gate electrode is electrically connected to pads BP8 for the output (drain) of the driver circuit 3b of the semiconductor chip 5c through a plurality of wires WB4. Further, the back surface of the semiconductor chip 5b serves as a drain electrode of the power MOS Q2 and is electrically is connected to a plurality of leads 7b3 (7b) that are formed integrally with the outer periphery of the die pad 7a2 through the die pad 7a2. The leads 7b3 are electrically connected to the terminal ET5 for the output. On the other hand, a pad (corresponding to an area in which wires are connected) BP9 for an anode electrode of the Schottky barrier diode D1 is disposed over the main surface of the semiconductor chip 5d. The pad BP9 for the anode electrode is electrically connected to the pad BP5a for the source electrode of the semiconductor chip 5b through the plurality of wires WA3. The back surface of the semiconductor chip 5d serves as a cathode electrode of the Schottky barrier diode D1 and is electrically connected to the leads 7b3 through the die pad 7a2.

The semiconductor chip 5b, formed with the power MOS Q2 for the lowside switch, is shaped in the form of a rectangle in which the length thereof in the first direction X in FIG. 15 is longer than that in the second direction Y. While the semiconductor chip 5b is disposed along the semiconductor chip 5a, it is spaced away from the semiconductor chip 5a and is disposed so as to be shifted from the center of the die pad 7a2 so as to approach the leads 7b2. That is, the semiconductor chip 5b is disposed so as to approach the corner (the left corner of FIG. 15) of the die pad 7a2 close to the leads 7b2 connected with the terminal ET4 that is supplied with the reference potential GND. The length, in the second direction Y, of the semiconductor chip 5b is substantially equal to the length, in the second direction Y, of a frame section to which the plurality of leads 7b2 are connected. Further, the length, in the first direction X, of the semiconductor chip 5b is substantially equal to the length, in the first direction X, of the frame section to which the plural leads 7b2 are connected. With such a configuration, the lengths of the wires WA2 for electrically connecting the pad BP5a for the source electrode of the power MOS Q2 and the leads 7b2 can be shortened. The two of the long and short sides of the semiconductor chip 5a, which intersect each other, are disposed along a layout configuration (flat L shape) of the plural leads 7b2. In particular, the pad BP5a for the source electrode of the power MOS Q2 is shaped so as to extend along the layout configuration of the plural leads 7b2. Thus, since the length, in which the pad BP5a and a group of the plural leads 7b2 are opposed, can be ensured to be long, the wires WA2 can be disposed in plural form. Further, the plurality of leads 7b are disposed along the two sides intersecting each other of the die pad 7a2, and they are connected to a flat L-shaped wiring section 7c extending along the two sides. Since the volume increases rather than the division of the plural leads 7b by collectively connecting the plural leads 7b to the wiring section 7c in this way, each wiring resistance can be reduced and the reference potential GND can be enhanced. Such a configuration takes into consideration the fact that an increase in on resistance on the source side of the power MOS Q2 for the lowside switch greatly exerts an influence on an increase in switching loss. Since the on resistance on the source side of the power MOS Q2 can be reduced with the above-described configuration, the conduction loss of the power MOS Q2 can be reduced. Since variations in parasitic impedance that occur in each wire WA2 can be reduced, variations in the magnitude of a current flowing through the wire WA2 can also be reduced. Owing to these considerations, the voltage conversion efficiency of the non-insulated DC-DC converter 1 can be enhanced. Further, the reference potential GND can be enhanced and the operational stability of the non-insulated DC-DC converter 1 can be improved.

Since the amount of heat generated during operation of the power MOS Q2 for the lowside switch is the highest, as described above, the power MOS Q2 is mounted over the die pad 7a2 that is largest in area. Thus, since the radiation of heat generated at the power MOS Q2 can be improved, the operational stability of the non-insulated DC-DC converter 1 can be enhanced.

The semiconductor chip 5d, formed with the Schottky barrier diode D1, is mounted over the die pad 7a2 with the semiconductor chip 5b, which is largest in chip size, being mounted thereon. This is done for the following reasons. First, the Schottky barrier diode D1 is mounted on the die pad 7a2 that is large in area. Consequently, the cathode electrode of the Schottky barrier diode D1 is electrically connected to its corresponding output wiring and the drain electrode of the power MOS Q1 through the die pad 7a2. Therefore, it is possible to greatly reduce the parasitic inductance Lk parasitic on the cathode. Since the semiconductor chip 5d, formed with the Schottky barrier diode D1, can be disposed near the semiconductor chip 5b, formed with the power MOS Q2, the lengths of the wires WA3 for electrically connecting the pad BP9 for the anode electrode of the Schottky barrier diode D1 and the BP5a for the source electrode of the power MOS Q2 can be shortened, and, hence, a parasitic inductance La on the anode can be reduced. The pad BP9 for the anode electrode of the Schottky barrier diode D1 is shaped so as to extend along the pad BP5a for the source electrode of the power MOS Q2. Thus, since the length at which the pad BP9 and the pad BP5a are opposed can be ensured to be long, the wires WA3 can be disposed in plural form. Further, since the semiconductor chip 5d is disposed along the short side of the semiconductor chip 5b, the number of the wires WA2 for electrically connecting the pad BP5a for the source electrode of the power MOS Q2 for the lowside switch of the semiconductor chip 5b and the leads 7b2 is not reduced even though the semiconductor chip 5d is placed in the die pad 7a2 with the semiconductor chip 5b disposed therein. Therefore, the on resistance of the power MOS Q2 is not reduced. Since the inductances La and Lk can be reduced owing to a configuration such as described above, the effect of the Schottky barrier diode D1 can be sufficiently brought out as described above. Further, the diode conduction loss and the diode recovery loss due to the reverse recovery time (trr) being made fast can be reduced, and the voltage conversion efficiency of the non-insulated DC-DC converter 1 can be enhanced. Since the inductances La and Lk can be reduced, the noise can be reduced.

The pad BP9 for the anode electrode of the semiconductor chip 5d and the pad BP5a of the semiconductor chip 5b are electrically connected by the wires WA3. Consequently, the heat generated at the power MOS Q2, which is high in the generated amount of heat, can be dispersed into the Schottky barrier diode D1 in which heat is not so generated. Thus, the voltage conversion efficiency and operational stability of the non-insulated DC-DC converter 1 can be enhanced.

Further, the pad BP9 for the anode electrode of the semiconductor chip 5d is formed in such a manner that the area thereof becomes smaller than the area of a region covered with an insulating film around the pad BP9 in the main surface of the semiconductor chip 5d. That is, the area of the pad BP9 formed of a metal that has a low adhesion relative to the resin molded body MB is configured as the minimum region necessary for the connections of the wires WA3. Consequently, the adhesion of the resin molded body MB can be enhanced.

While the wires WA2, WA3, WB3 and WB4 are all formed, for example, of gold (Au), the wires WA2 and WA3 are thicker than the wires WB3 and WB4. Thus, since the wiring inductance on the source side of the power MOS Q2 can be reduced owing to the use of the thick wire WA2 as the wire electrically connected to the source of the power MOS Q2, it is possible to reduce the on resistance of the power MOS Q2 and enhance the voltage conversion efficiency. Since the wiring resistance on the anode side of the Schottky barrier diode D1 can be reduced owing to the use of the thick wire WA3 as the wire electrically connected to the anode of the Schottky barrier diode D1, the loss of the non-insulated DC-DC converter 1 can be reduced, and, hence, its voltage conversion efficiency can be enhanced.

The semiconductor chip 5c, formed with the driver circuits 3a and 3b, are disposed over the upper right die pad 7a3 of FIG. 15, which is smallest in area, in a state in which its main surface is turned up. Pads BP10 for the respective signal input (gate) electrodes of the driver circuits 3a and 3b, and the pads BP11 for their source electrodes are disposed over the main surface of the semiconductor chip 5c in addition to the pads BP3, BP4, BP7 and BP8. The pads BP10 for the gate electrodes are electrically connected to the corresponding leads 7b4 (7b) through the plural wires WB5. The pads BP11 for the source electrodes are electrically connected to their corresponding leads 7b5 (7b) formed integrally with the die pad 7a3 via the plurality of wires WB6.

The semiconductor chip 5c, formed with the driver circuits 3a and 3b, is also shaped in the form of a plane rectangle. The pads BP3, BP4, BP7 and BP8 connected to the power MOSs Q1 and Q2 are disposed over the main surface of the semiconductor chip 5c along the two sides located on the sides adjacent to the respective semiconductor chips 5a and 5b. Thus, since the lengths of the wires WB1, WB2, WB3 and WB4 can further be shortened, the parasitic inductances LgH, LsH, LgL and LsL produced in the wiring paths can be further reduced. Since it is desired to reduce the switching loss rather than the on resistance in the semiconductor chip 5a, the wires WB1 and WB2, which are respectively electrically connected to the source and gate of the power MOS Q1, are formed to be shorter than the wires WB3 and WB4, which are respectively electrically connected to the source and gate of the power MOS Q2 even with respect to the wires WB1, WB2, WB3 and WB4, in addition to the point which was described above, that the semiconductor chips are disposed in such a manner that the distance between the semiconductor chips 5c and 5a becomes short or decreases as the distance between the semiconductor chips 5c and 5b.

The semiconductor chips 5a through 5c are different in outer size (area) in terms of differences among their characteristics. The outer size of the semiconductor chip 5a is formed to be larger than that of the semiconductor chip 5c. The outer size of the semiconductor chip 5b is formed to be larger than that of the semiconductor chip 5a. Since the semiconductor chip 5c having the driver circuits 3a and 3b is a control circuit for controlling the gates of the power MOSs Q1 and Q2, it is described to reduce the outer size of the same device as much as possible in consideration of the size of the overall package. On the other hand, it is desirable to set the on resistance produced in each transistor as low as possible because the currents I1 and I2 flow through the power MOSs Q1 and Q2. Reducing the on resistance can be realized by expanding to channel width per unit cell area. Therefore, the outer sizes of the semiconductor chips 5a and 5b are formed to be larger than the outer size of the semiconductor chip 5c. Further, since the power MOS Q2 for the lowside switch is longer in on time than the power MOS Q1 for the highside switch, as shown in FIG. 3, there is a need to further reduce the on resistance of the power MOS Q2 as compared with the on resistance of the power MOS Q1. Therefore, the outer size of the semiconductor chip 5b is formed to be larger than that of the semiconductor chip 5a.

Incidentally, there is a fear that, while the wires WA1 through WA3 and WB1 through WB6 are connected by, for example, an ultrasonic thermocompression bonding method, bonding failures occur where ultrasonic energy is not well transferred to wiring bonding portions of the die pads 7a1 through 7a3 and leads 7b. Therefore, they are wire-bonded in avoidance of the half etching areas. It is thus possible to reduce or prevent bonding failures.

Thin wires are used for the wires WB1 through WB6 connected to the semiconductor chip 5c because, when thick wires are used therefor, the pads BP3, BP4, BP7, BP8, BP10 and BP11 and the like must be made large, so that the size of each chip increases and its cost becomes high.

Figure 18:
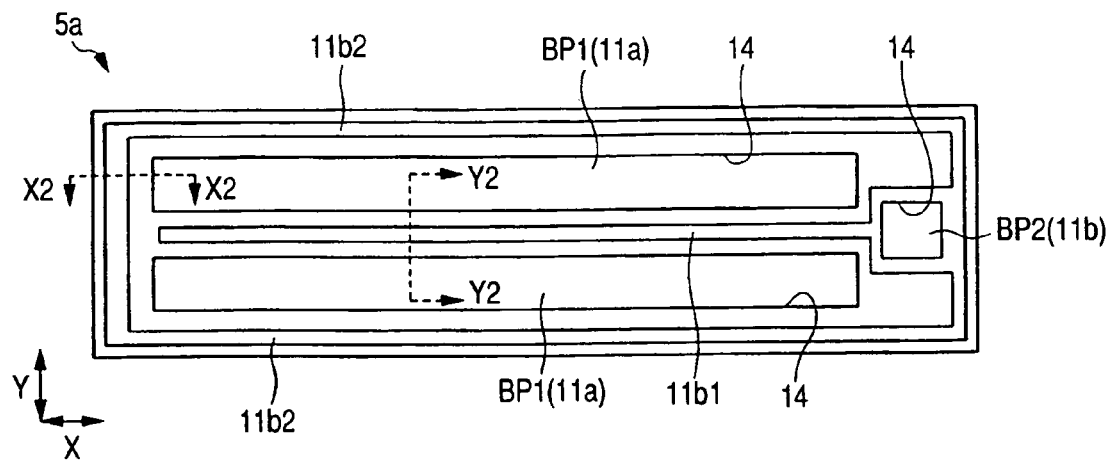
FIG. 18 is an overall plan view showing a main surface side of a first semiconductor chip that constitutes the semiconductor device shown in FIG. 11.
Figure 19:
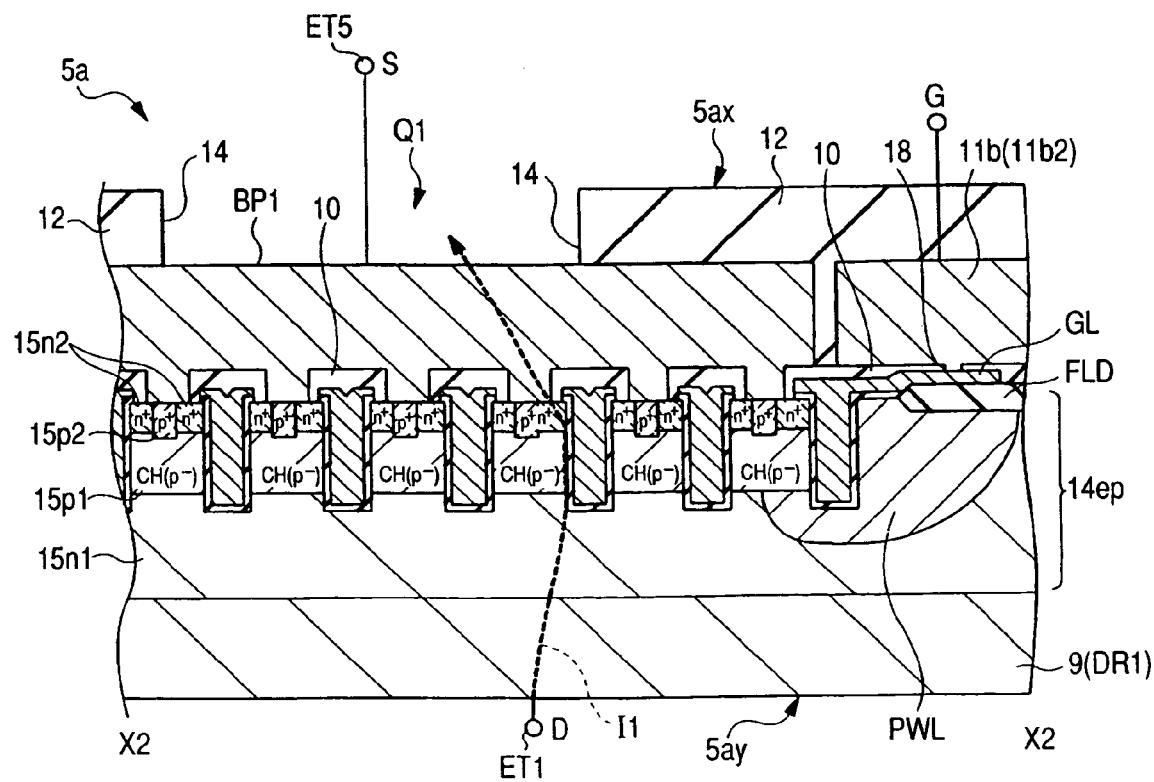
FIG. 19 is a cross-sectional view taken along line X2-X2 of FIG. 18.
Figure 20:
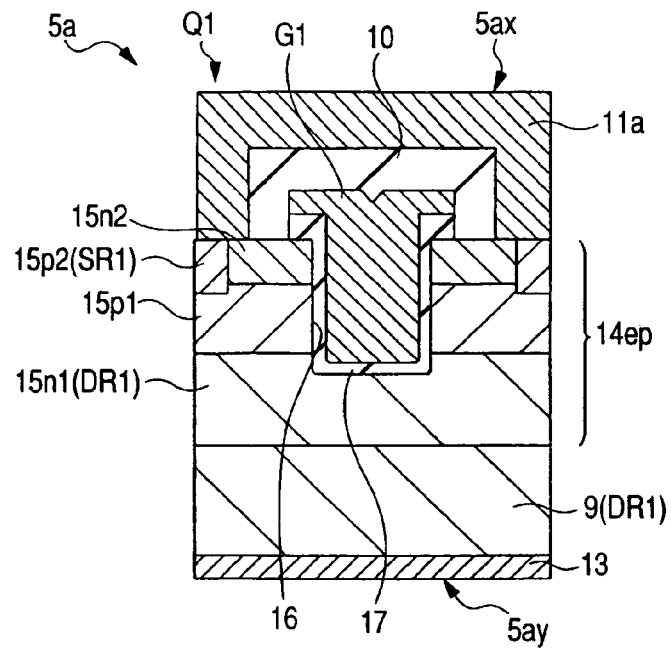
FIG. 20 is a fragmentary cross-sectional view showing the first semiconductor chip shown in FIG. 18.
Figure 21:
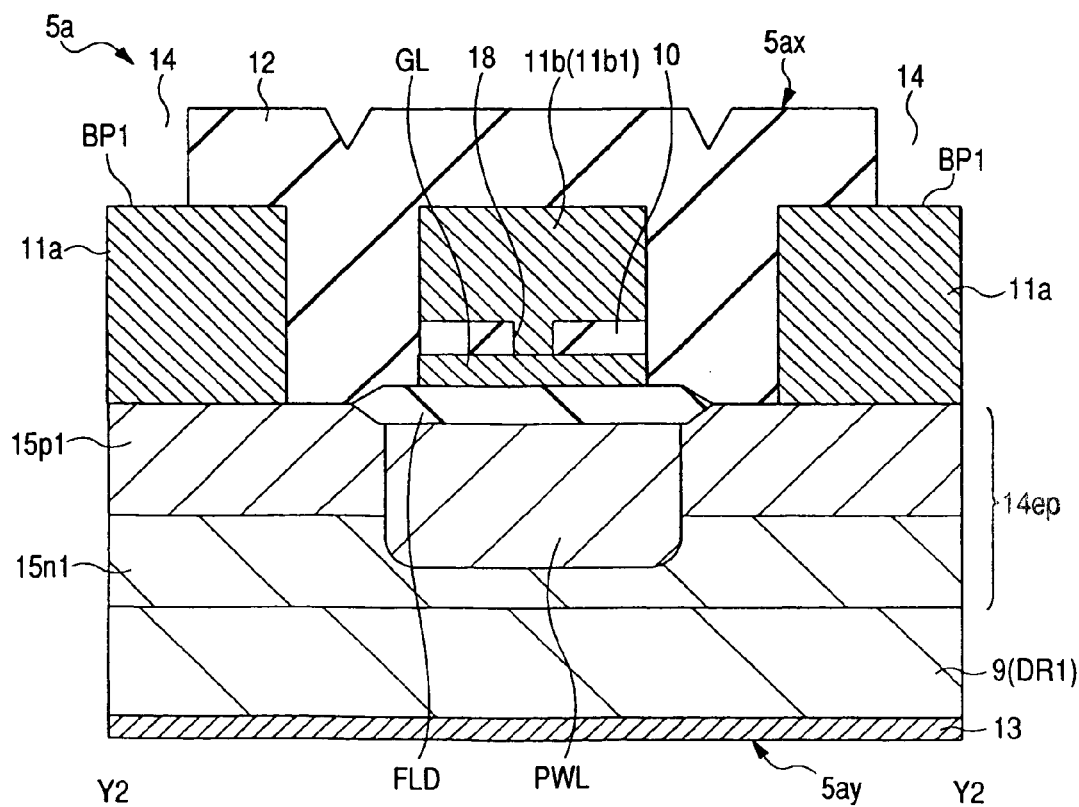
FIG. 21 is a cross-sectional view taken along line Y2-Y2 of FIG. 18.

FIG. 18 is an enlarged plan view of the semiconductor chip 5a, FIG. 19 is a cross-sectional view taken along line X2-X2 of FIG. 18, FIG. 20 is a fragmentary cross-sectional view of the semiconductor chip 5a, and FIG. 21 is a cross-sectional view taken along line Y2-Y2 of FIG. 18.

The semiconductor chip 5a includes a semiconductor substrate 9, a plurality of transistor devices formed in a main surface (forming surface sides of pads BP1 and BP2) of the semiconductor substrate 9, a multilayer wiring layer in which an insulating layer 10 and wiring layers 11a and 11b are respectively stacked over the main surface of the semiconductor substrate 9 in plural stages, a surface protective film (final protective film) 12 formed so as to cover the wiring layers 11, etc. The semiconductor substrate 9 is formed of, for example, an $n^+$ type silicon (Si) monocrystal. The insulating layer 10 is constituted of, for example, a silicon oxide ($SiO_2$) film. Each of the wiring layers 11a and 11b is formed of a metal material like aluminum (Al), for example, and corresponds to the top wiring layer here. The surface protective film 12 is formed by laminating an organic film, like a polyimide film (PiQ), over the silicon oxide film, silicon nitride ($Si_3N_4$) film or a laminated film thereof.

The semiconductor chip 5a has a main surface (circuit forming surface) 5ax and a back surface (back electrode forming surface) 5ay located on sides opposite to each other. An integrated circuit and the pads BP1 and BP2 are formed on the main surface 5ax side of the semiconductor chip 5a, and a drain electrode 13 electrically connected to a drain region DR is formed over the back surface 5ay. The integrated circuit principally comprises the transistor devices and wiring layers 11a and 11b formed in the main surface 5ax of the semiconductor substrate 9. The drain electrode 13 is formed by evaporating a metal, such as gold (Au), and it is connected to the die pad 7a2 as described above. Such openings 14 as to expose parts of the wiring layers 11a and 11b are defined in the surface protective film 12. The parts of the wiring layers 11a and 11b, which are exposed from the openings 14, are configured as the pads BP1 for the source electrode of the power MOS Q1 and the pad BP2 for its gate electrode.

Two source electrode pads BP1 are formed in a width direction of the semiconductor chip 5a. The respective pads BP2 are formed so as to extend along the longitudinal direction (first direction X) of the semiconductor chip 5a so as to be opposed to each other. The gate electrode pad BP2 is disposed in the neighborhood of one short side of the semiconductor chip 5a. The plane form of the pad BP2 is a square, for example, and its plane size is about 280 μm×280 μm, for example. The wiring layer 11b formed with the pad BP2 has wiring sections 11b1 and 11b2 formed integrally therewith. The wiring section 11b is a pattern which extends along the longitudinal direction of the semiconductor chip 5a and is disposed between the two pads BP1. One wiring section 11b2 is a pattern which extends along the outer periphery of the semiconductor chip 5a and is disposed so as to surround the two pads BP1. The widths of the wiring sections 11b1 and 11b2 are respectively about 25 μm, for example. Owing to the provision of such a configuration, the pads BP1 can be disposed so as to approach the die pad 7a2 and extend along a pair of long sides. Thus, the lengths of the wires WA1 for electrically connecting the pads BP1 and the die pad 7a2 can be shortened and more wires WA1 can be disposed side by side. Therefore, it is possible to reduce the parasitic inductance LsH. One end (end located opposite to the side connected to the pad BP2) of the semiconductor chip 5a is formed so as not to connect to part of each wire 11b2 at the wiring section 11b1 for the gate electrode. Consequently, the source region SR1 of the power MOS Q1 can be formed without its isolation. That is, the on resistance can be reduced by forming the source region SR1 without the isolation thereof.

An epitaxial layer 14ep formed of, for example, an n type silicon monocrystal is formed over the main surface of the semiconductor substrate 9. An n⁻ type semiconductor region 15n1, a p type semiconductor region 15p1 provided thereon, an n⁺ type semiconductor region 15n2 provided thereon, and a p⁺ type semiconductor region 15p2 which extends from the main surface of the semiconductor substrate 9 so as to connect to the p type semiconductor region 15p1 are formed in the epitaxial layer 14ep. For example, an n channel vertical power MOS Q1 having a trench gate structure is formed in the semiconductor substrate 9 and epitaxial layer 14ep referred to above.

The power MOS Q1 includes the n⁺ type semiconductor region 15n2 which functions as a source region SR1, the n⁻ type semiconductor region 15n1 which functions as a drain region DR1, the p type semiconductor region 15p which functions as a channel forming region CH1, a gate insulating film 17 formed over an inner wall surface of a trench 16 dug in the thickness direction of the epitaxial layer 14ep, and a gate electrode G1 embedded into the trench 16 with the gate insulating film 17 interposed therebetween. The gate electrode G1 is formed, for example, of a low-resistance polycrystal silicon. With the formation of such a trench gate structure, the unit area of the power MOS Q1 can be scaled down or miniaturized and brought into high integration.

The gate electrode G1 of each cell is pulled out onto a field insulating film FLD through a gate wiring GL formed of polycrystal silicon, which is formed integrally therewith, and is electrically connected to the corresponding wiring layer 11b through a contact hole 18. The surfaces of the gate electrode G1 and gate wiring GL are covered with the insulating layer (cap insulating layer) 10 and are isolated from the wring layers 11a. Each of the wiring layers 11a is electrically connected even to its corresponding p type semiconductor region 15p1 for channel formation through the p⁺ type semiconductor region 15p2 in addition to the n⁺ type semiconductor region 15n2 for the source. The current I1 at the operation of the power MOS Q1 flows between the source region SR1 and the drain region DR1 along the depth direction of the trench 16 (flows in the direction of thickness of a drift layer) and flows along the side surfaces of the gate insulating film 17. In such a vertical power MOS Q1, its gate area per unit cell area is large and the junction area of the gate electrode G1 and the drain's drift layer is large, so that a parasitic capacitance between the gate and drain thereof becomes large, as compared with the horizontal field effect transistor whose channel is formed in the direction horizontal to the main surface of the semiconductor substrate. On the other hand, the channel width per unit cell area can be increased and the on resistance can be reduced. Incidentally, PWL indicates a p⁻ type well.

Since a semiconductor chip 5b formed with a power MOS Q2 for a lowside switch is substantially identical to the semiconductor chip 5a in device configuration, a description thereof is omitted. However, the threshold voltage of the power MOS Q2 for the lowside switch is controlled at a value higher than the threshold voltage of the power MOS Q1 for the highside switch. This is a configuration for suppressing the occurrence of a phenomenon (self turn-on) in which, when the switch is changed over from the power MOS Q1 for the highside switch to the power MOS Q2 for the lowside switch, a current (through current) flows from the terminal ET1 to the terminal ET4. Since a path for the through current can be restrained or cut off owing to the above configuration, the self turn-on phenomenon can be inhibited or prevented.

Figure 22:
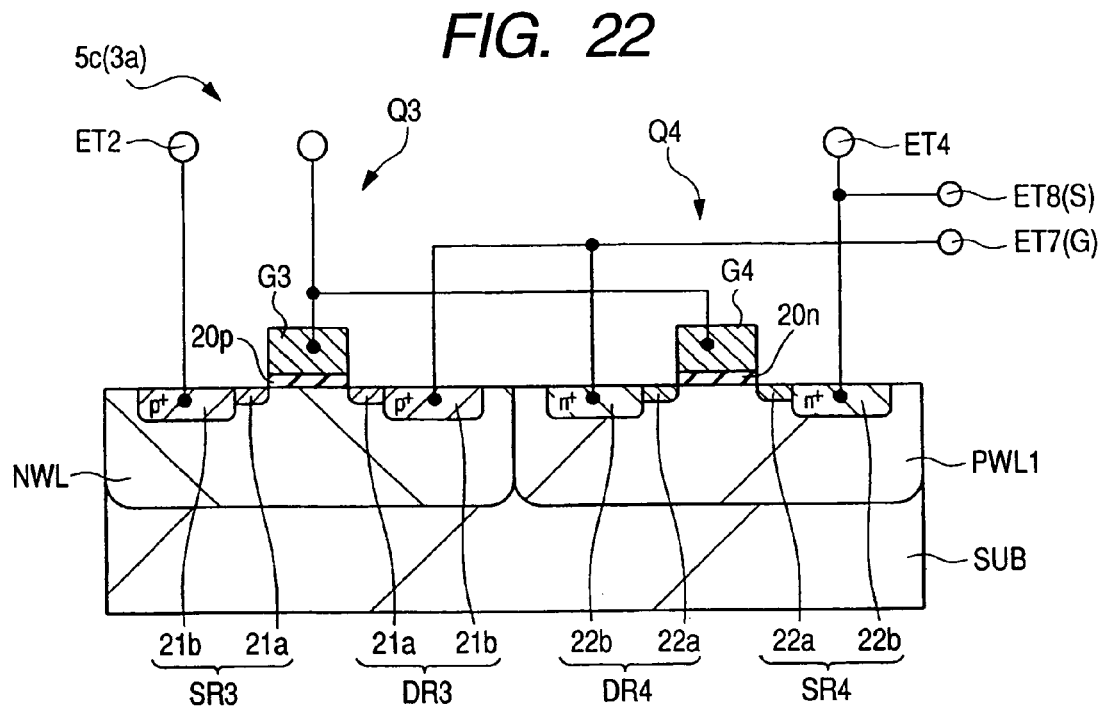
FIG. 22 is a fragmentary cross-sectional view illustrating a third semiconductor chip that constitutes the semiconductor device shown in FIG. 11.

A semiconductor chip 5c formed with control driver circuits 3a and 3b will be explained next. The circuit configuration and the device sectional configuration of the semiconductor chip 5c are identical to those shown in FIGS. 5 and 6. A basic configurational example of the driver 3a is shown in FIG. 22. Incidentally, since the driver circuit 3b is substantially identical to the driver circuit 3a in device configuration, the driver circuit 3a will be explained and the description of the driver circuit 3b will be omitted.

The driver circuit 3a has a power MOS Q3 of a p channel horizontal type (corresponding to such a type that its channel is formed in the direction horizontal to a main surface of a semiconductor substrate SUB) formed in an n type well NWL1 and an n channel horizontal type power MOS Q4 formed in a p type well PWL1. The power MOS Q3 includes a source region SR3, a drain region DR3, a gate insulating film 20p, and a gate electrode G3. Each of the source region SR3 and the drain region DR3 has a p⁻ type semiconductor region 21a and a p⁺ type semiconductor region 21b. The power MOS Q4 includes a source region SR4, a drain region DR4, a gate insulting film 20n, and a gate region G4. Each of the source region SR4 and the drain region DR4 has an n⁻ type semiconductor region 22a and an n⁺ type semiconductor region 22b. Further, the drain regions DR3 and DR4 are connected to an output terminal ET7 and are electrically connected to the gate of the power MOS Q1 for the highside switch through the output terminal ET7. The source region SR4 is connected to a terminal ET8 and is electrically connected to the source of the power MOS Q1 for the highside switch through the terminal ET8.

Figure 23:
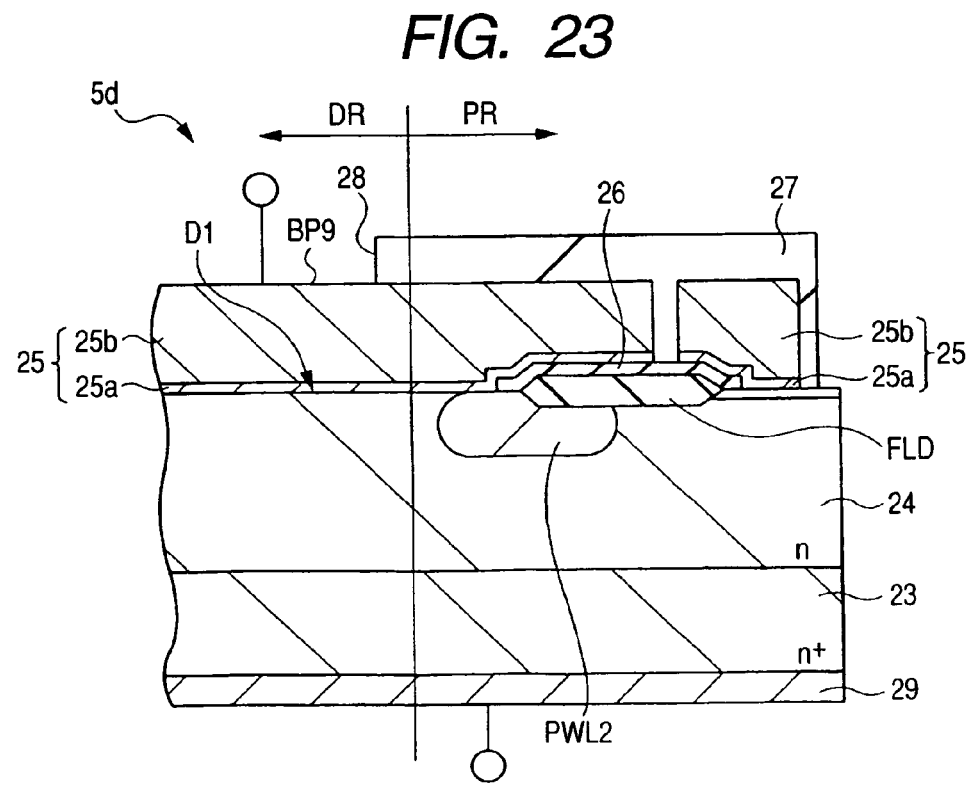
FIG. 23 is a fragmentary cross-sectional view depicting a fourth semiconductor chip that constitutes the semiconductor device shown in FIG. 11.

A semiconductor chip 5d formed with a Schottky barrier diode D1 will be explained next. FIG. 23 shows a fragmentary cross-sectional view of the semiconductor chip 5d. The left side of FIG. 23 indicates a device region DR, and the right side thereof indicates a peripheral region PR. A semiconductor substrate 23 is formed of, for example, an n⁺ type silicon monocrystal. An epitaxial layer 24 formed of, for example, an n type silicon monocrystal is formed over a main surface of the semiconductor substrate 23. Further, a wiring layer 25 is formed over a main surface of the epitaxial layer 24 so as to make contact with it. The wiring layer 25 has a structure formed by stacking a barrier metal layer 25a like, for example, tungsten titanium (TiW) or the like, and a metal layer 25b like, for example, aluminum (Al) or the like, in this order from the lower layer. The Schottky barrier diode D1 is formed at a portion where the barrier metal layer 25a and the epitaxial layer 24 contact each other in the device region DR. A field insulating film FLD is formed in the peripheral region PR at the outer periphery of the device region DR. A p type well PWL2 is formed in a layer, below an end on the device region DR side, of the field insulating film FLD. An insulating film 26 like, for example, PGS (Phospho Silicate Glass) or the like is deposited over the field insulating film FLD. The wiring layer 25 is covered by a surface protective film 27. The surface protective film 27 is identical to the surface protective film 12 in construction. An opening 28 is formed at part of the surface protective film 27, and, hence, part of the wiring layer 25 is exposed. The exposed portion of the wiring layer 25 serves as the pad BP9. On the other hand, a cathode electrode 29 is formed over a back surface of the semiconductor substrate 23, which is placed on the side opposite to the main surface of the semiconductor substrate 23. The cathode electrode 29 is formed by adhering, for example, gold (Au) or the like by means of a vapor deposition method or the like.

Figure 24:
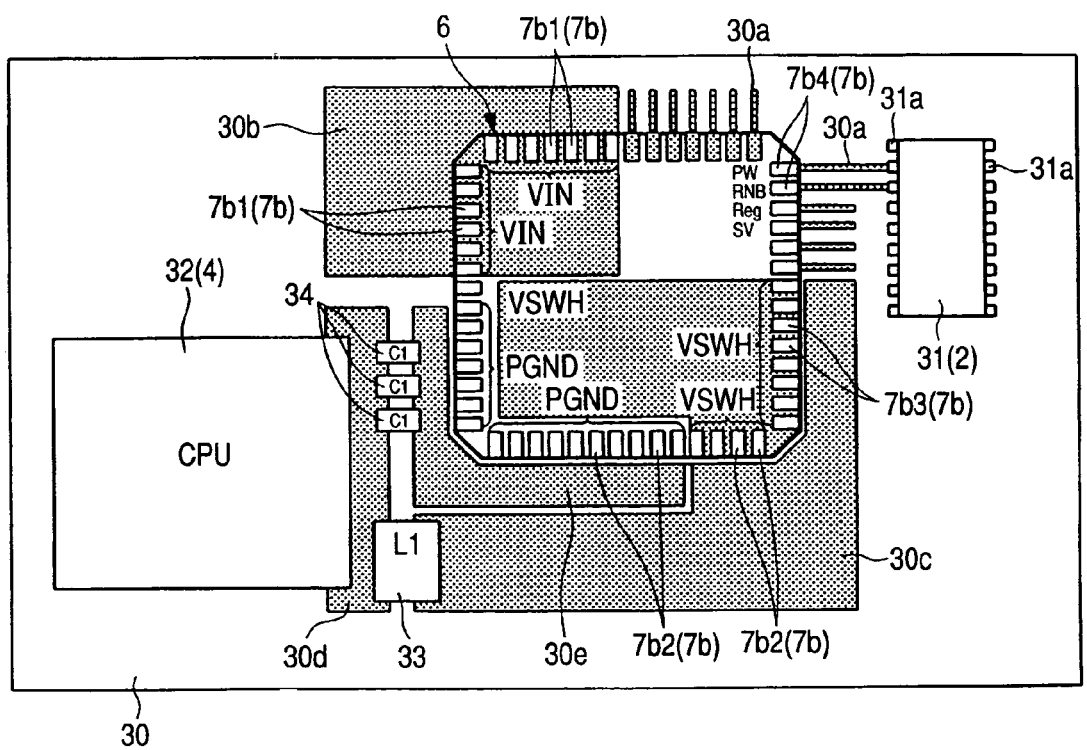
FIG. 24 is a plan view showing one example of the packaging of the semiconductor device shown in FIG. 11.
Figure 25:
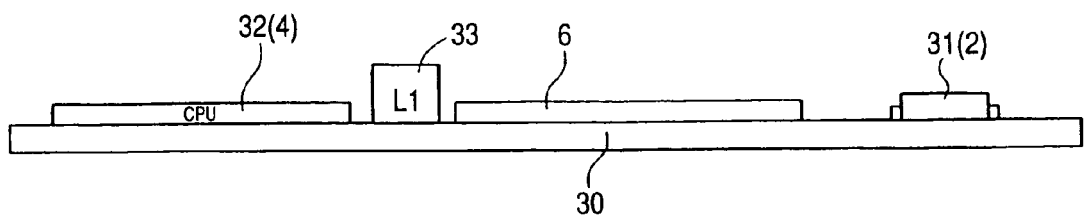
FIG. 25 is a side view illustrating the semiconductor device shown in FIG. 24.

FIG. 24 is a plan view showing one example of the state of packaging of the package 6, and FIG. 25 is a side view of the package 6 shown in FIG. 24. Incidentally, FIG. 24 shows the package 6 as seen therethrough to understand the manner of wiring the wiring board 30.

The wiring board 30 is formed of, for example, a printed wiring board. Packages 6, 31 and 32 and chip parts 33 and 34 are mounted over a main surface of the wiring board 30. The control circuit 2 is formed in the package 31, and the load circuit 4 is formed in the package 32. The coil L1 is formed in the chip part 33, and the capacitor C1 is formed in each chip part 34. Leads 31a of the package 31 are electrically connected to their corresponding leads 7b (7b4) of the package 6 through wirings 30a of the wiring board 30. Leads 7b1 of the package 6 are electrically connected to a wiring 30b of the wiring board 30. Output leads (output terminals) 7b3 of the package 6 are electrically connected to one end of the coil L1 of the chip part 33 through a wiring (output wiring) 30c of the wiring board 30. The other end of the coil L1 of the chip part 33 is electrically connected to the load circuit 4 through a wiring (output wiring) 30d of the wiring board 30. Leads 7b2 for a reference potential GND of the package 6 are electrically connected to one end of the capacitors C1 of the plural chip parts 34 through a wiring 30e of the wiring board 30. The other end of the capacitors C1 of the chip parts 34 is electrically connected to the load circuit 4 through the wiring 30d of the wiring board 30.

Figure 26:
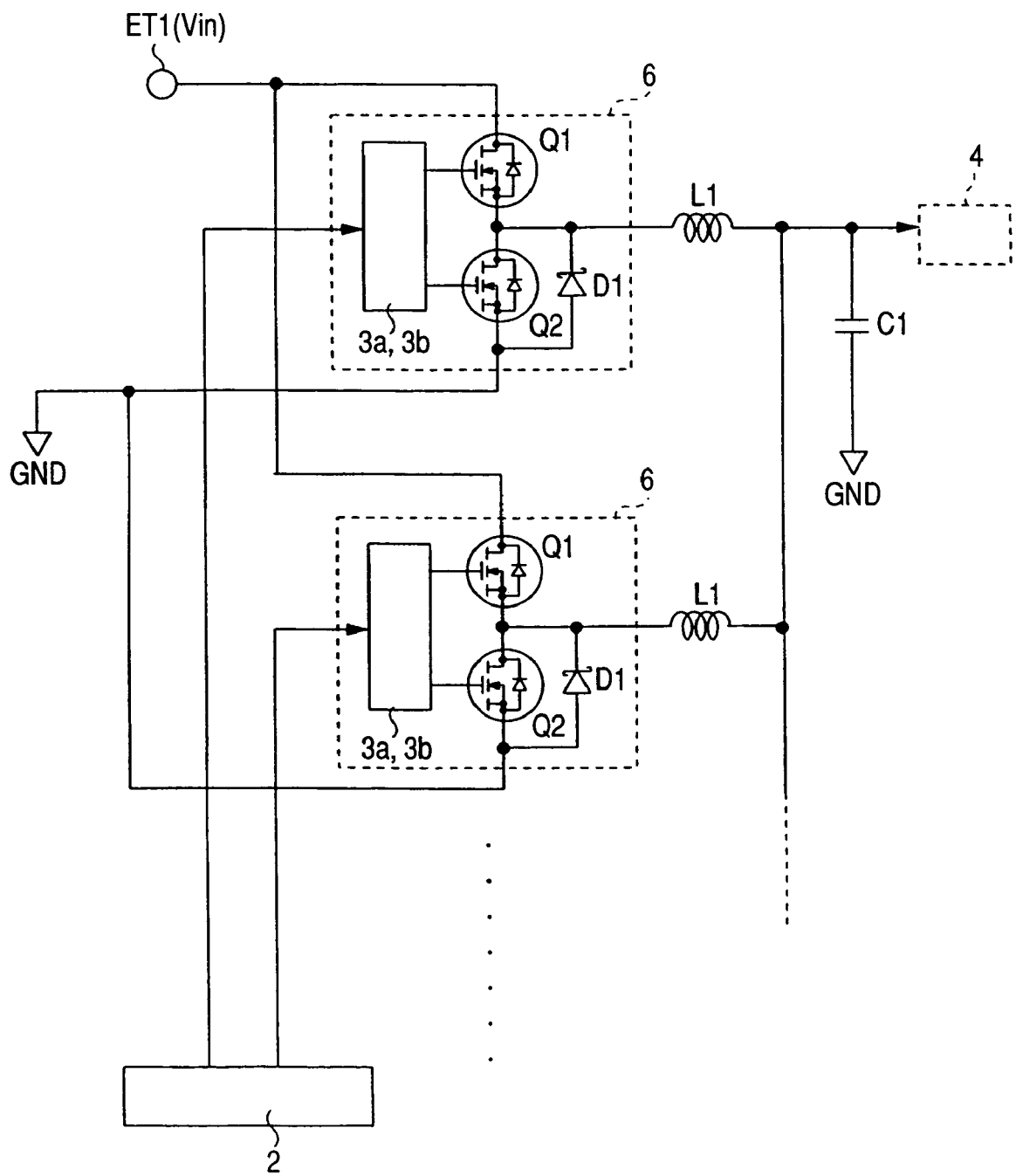
FIG. 26 is a circuit diagram showing one example of a circuit system configuration including the semiconductor device shown in FIG. 11.

FIG. 26 shows one example of a circuit system configuration of the non-insulated DC-DC converter 1, including the package 6 according to the first embodiment. In the present circuit system, a plurality of packages 6 are connected in parallel with one load circuit 4. An input power supply potential Vin, a reference potential GND and a control circuit 2 are shared among the plural packages 6. In this type of circuit system, the miniaturization of the overall system is impaired assuming that a configuration (see FIG. 4) is adopted in which power MOSs Q1 and Q2, driver circuits 3a and 3b and a Schottky barrier diode D1 are respectively separately packaged. On the other hand, since the power MOSs Q1 and Q2, driver circuits 3a and 3b and Schottky barrier diode D1 are accommodated in the same package 6 in the present first embodiment, the overall system can be rendered small-sized.

Figure 27:
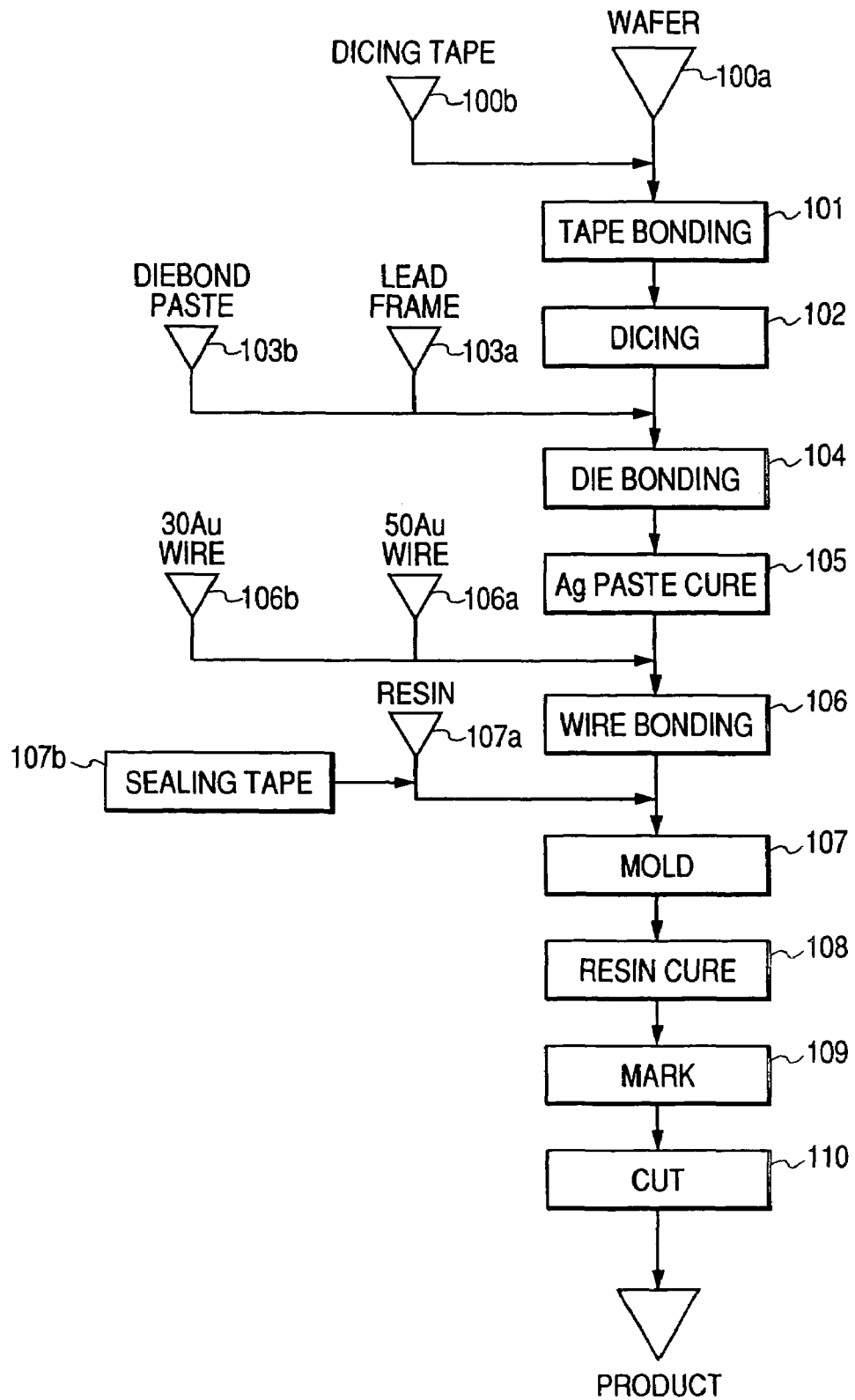
FIG. 27 is a flow diagram depicting an assembly process of the semiconductor device shown in FIG. 11.

A method for assembling the package 6 according to the first embodiment will be explained next with reference to the assembly flow diagram of FIG. 27.

Four types of semiconductor wafers and a dicing tape are first prepared (Steps 100a and 100b). A plurality of semiconductor chips 5a through 5d are respectively formed over main surfaces of the four types of semiconductor wafers. Subsequently, the dicing tape is bonded onto back surfaces of the semiconductor wafers, and the semiconductor chips 5a through 5d are respectively cut out from the respective semiconductor wafers by a dicing blade (Steps 101 and 102).

Figure 28:
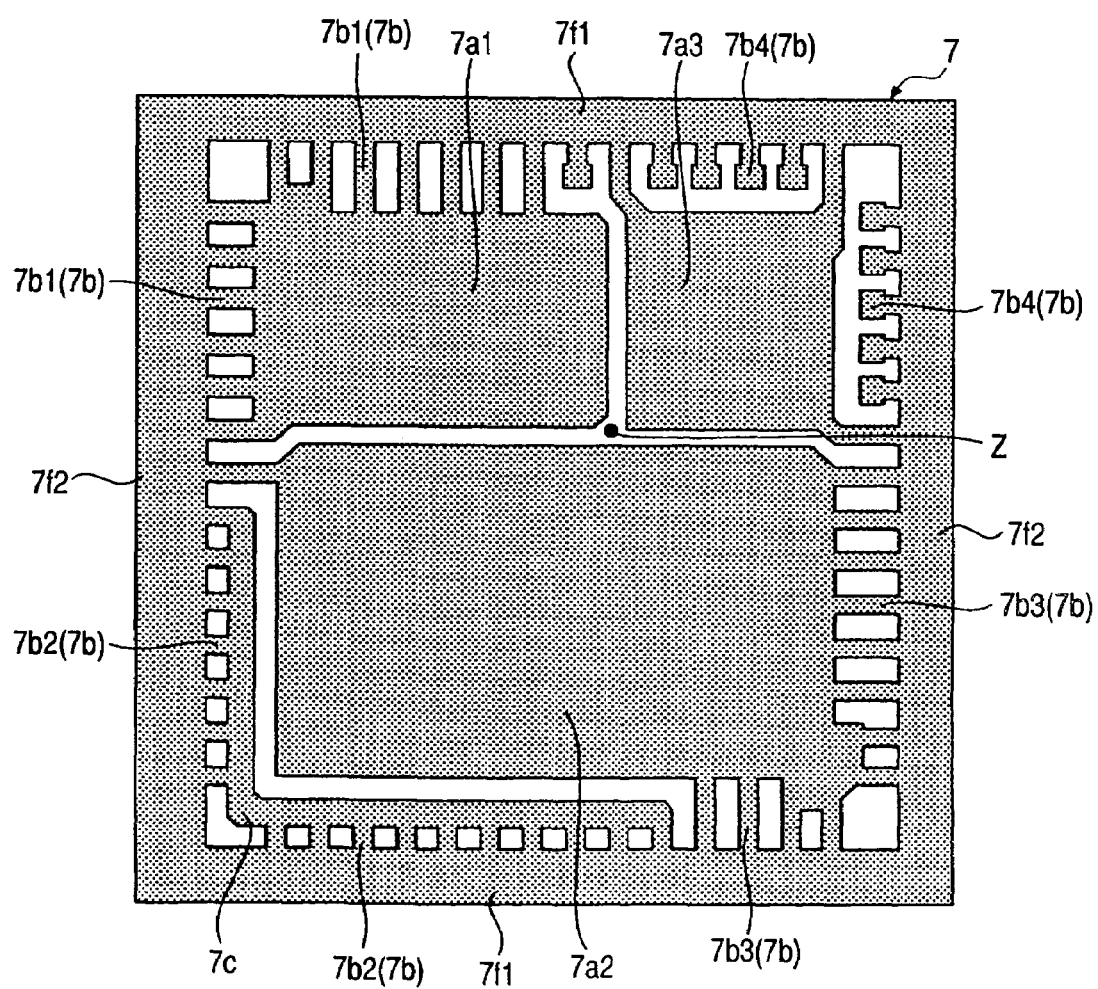
FIG. 28 is a fragmentary plan view showing one example illustrative of a main surface side of each unit area of a lead frame employed in the assembly process of the semiconductor device shown in FIG. 11.
Figure 29:
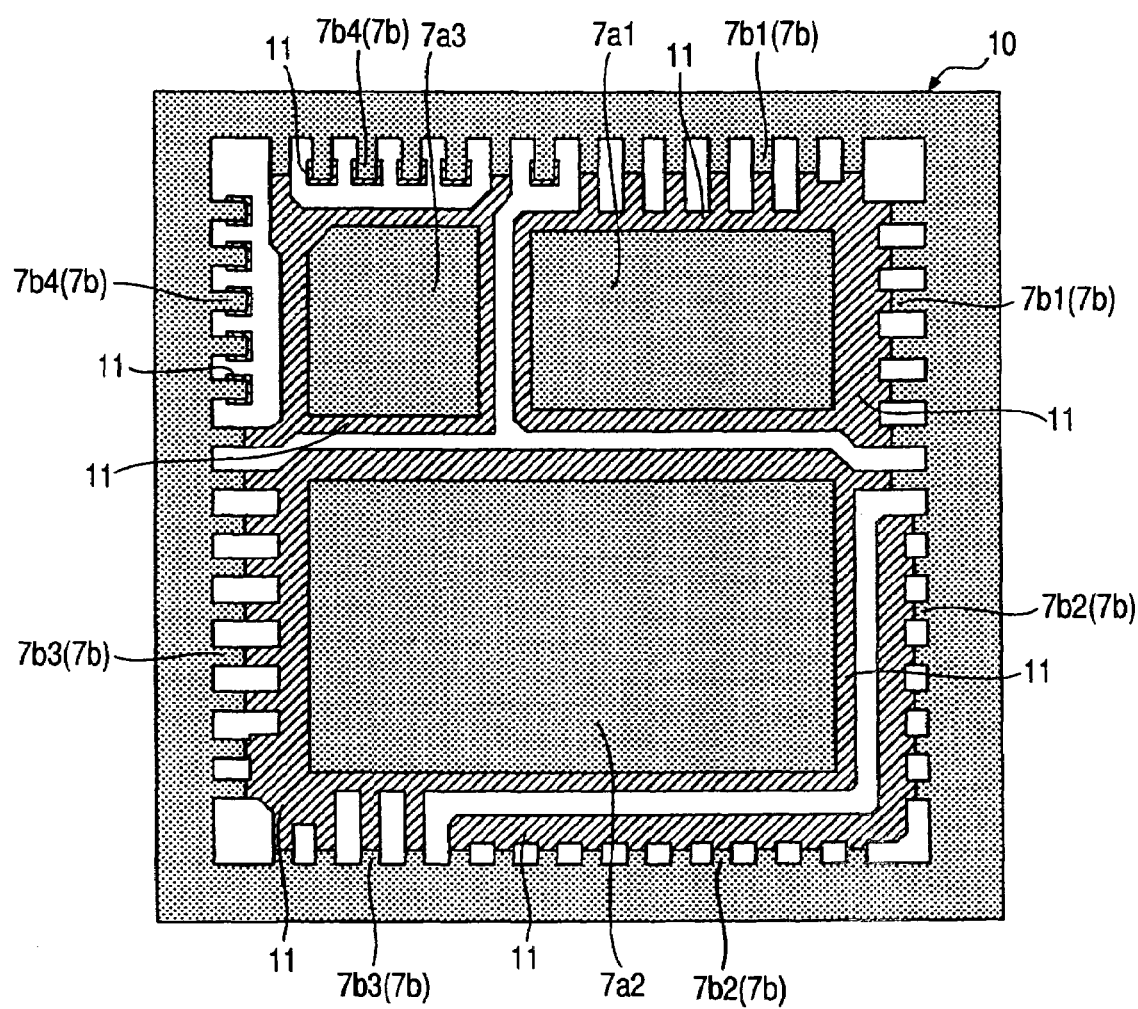
FIG. 29 is a plan view illustrating a back surface side of each unit area of the lead frame shown in FIG. 28.

Next, a lead frame and die bond paste are prepared (Steps 103a and 103b). FIGS. 28 and 29 respectively show one example of a fragmentary plan view illustrative of each unit area of a lead frame 7. FIG. 28 shows a main surface of the lead frame 7, and FIG. 29 shows a back surface of the lead frame 7. The lead frame 7 includes two frame body sections 7f1 that extend along the right and left directions of FIG. 28, frame body sections 7f2 that extend in the direction orthogonal to the frame body sections 7f1 so as to act as an intermediary between the two frame body sections 7f1, a plurality of leads 7b that extend from the inner peripheries of the frame body sections 7f1 and 7f2 to the center of the unit area, and three die pads 7a1 through 7a3 and an L-shaped wiring section 7c formed integrally with the plural leads 7b and supported by the frame body sections 7f1 and 7f2 through the leads 7b. Half etching areas are formed over the outer peripheries on the back surface sides, of the leads 7b and die pads 7a1 through 7a3, and they are made thin as compared with the other sections. Incidentally, the half etching areas are diagonally hatched to make it easy to see them in the drawing in FIG. 29. As the die bond paste, for example, silver (Ag) paste is used.

Figure 30:
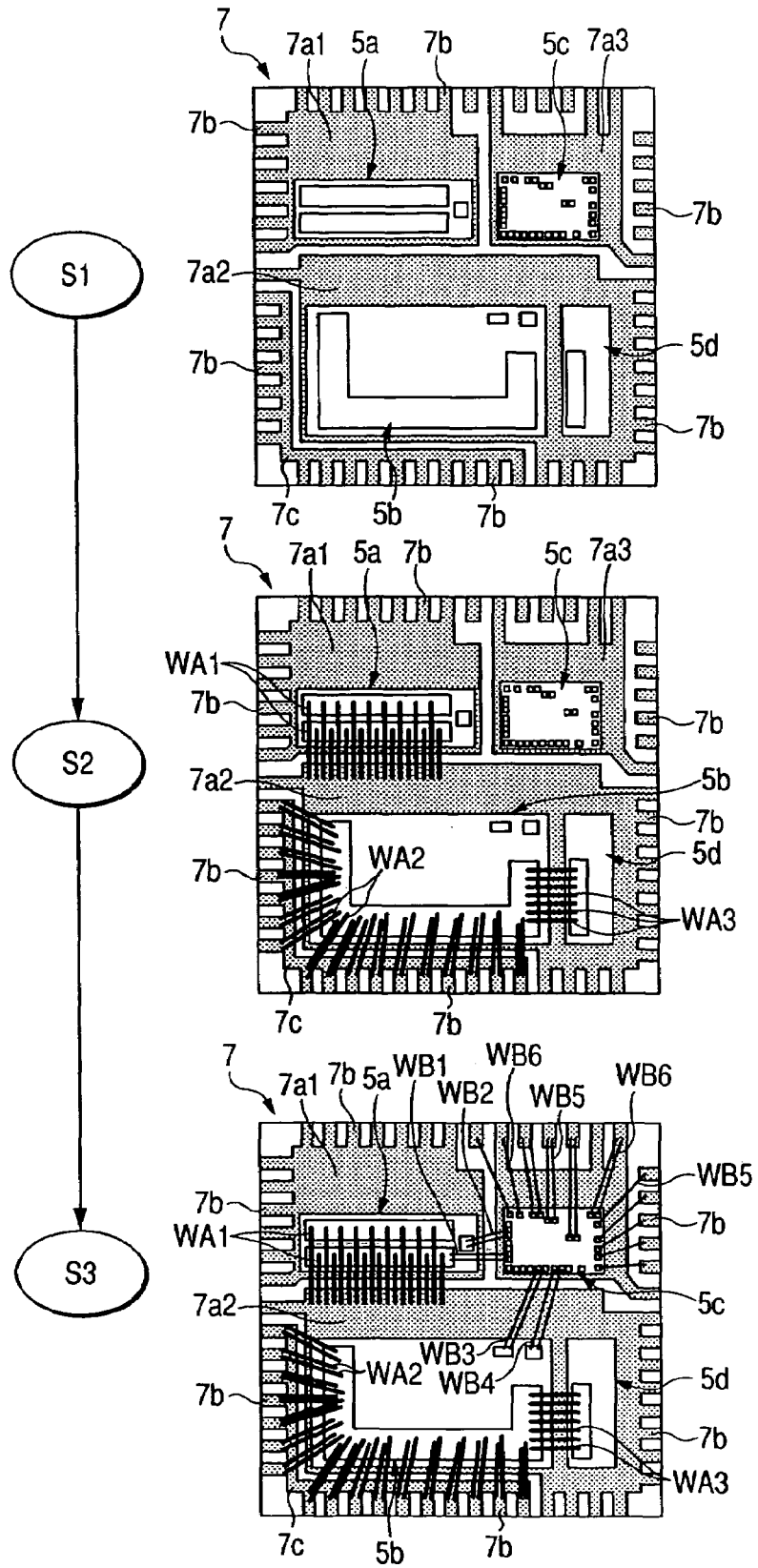
FIG. 30 is a plan view showing each unit area of the lead frame employed in the assembly process of the semiconductor device shown in FIG. 11.

Subsequently, the semiconductor chips 5a through 5d are mounted over the main surfaces of the die pads 7a1 through 7a3 of the respective unit areas of the lead frame 7 through the die bond paste interposed therebetween. Thereafter, annealing or heat treatment is effected to cure the die bond paste. Thus, as shown in Step S1 of FIG. 30, the semiconductor chips 5a through 5d are adhered onto the die pads 7a1 through 7a3 (Steps 104 and 105). By mounting the small semiconductor chips 5d, 5c, 5a and 5b in that order, an improvement in productivity can also be achieved.

Next, two types of wires WA1 through WA3 and WB1 through WB6 are prepared (Steps 106a and 106b). While any of the wires WA1 through WA3 and WB1 through WB6 are being formed, for example, of gold (Au), the wires WA1 through WA3 are heavy wires that are 50 μm thick, for example, and the wires WB1 through WB6 are thin wires that are 30 μm thick, for example. Subsequently, the two types of wires WA1 through WA3 and WB1 through WB6 are bonded by an ultrasonic thermocompression method (Step 106). There is now a fear that, since the bonding processing of the thick wires WA1 through WA3 needs a load larger than that at the bonding processing of the thin wires WB1 through WB6, the thin wires WB1 through WB6 may be broken or disconnected due to the large load at the time of bonding of the thick wires, when the thick wires WA1 through WA3 are bonded after the thin wires WB1 through WB6 are first bonded. According to the discussions of the present inventors in particular, the wire-broken failures easily occur where the die pads 7a1 through 7a3 are in isolation. Consequently, in the wire bonding process of the present embodiment, the thick wires WA1 through WA3 are bonded, and, thereafter, the thin wires WB1 through WB6 are bonded, as indicated at Steps S2 and S3 of FIG. 30. It is thus possible to restrain or prevent breaks and failures in the thin wires WB1 through WB6.

Next, a sealing or encapsulating resin and a sealing tape are prepared (Steps 107a and 107b). Subsequently, a resin sealing (mold) process step is performed by a transfer mold method (Step 108). The transfer molding method is a method for using a shaping die (mold die) provided with a pot, a runner, a resin injection gate and a cavity and the like and injecting a thermosetting resin into the cavity from the pot via the runner and the resin injection gate to thereby form a resin molded body MB. Upon fabrication of a QFN type package 6, there have been adopted an individual type transfer mold method using a multicavity lead frame having a plurality of product forming areas (device forming areas and product acquiring areas) and resin molding or sealing semiconductor chips mounted to the product forming areas every product forming areas, and a batch type transfer mold method for collectively resin molding semiconductor chips mounted to respective product forming areas. The present embodiment adopts, for example, the individual type transfer mold method.

The resin sealing process is performed as follows, for example. The sealing tape is first placed over a mold lower die of a resin-molded die. Thereafter, the lead frame 7 is disposed over the sealing tape, and the resin-molded die is clamped in such a manner that the back surfaces of both some of the plural leads 7b and the die pads 7a1 through 7a3 adhere to the sealing tape. The reason why the sealing tape is bonded onto the back surface of the lead frame 7 prior to the resin sealing process, is as follows: In the process of resin sealing, when dealing with a construction in which the plural die pads 7a1 through 7a3 are contained in one package 6, as in the present embodiment, the resin will easily leak at a portion Z where slits for forming the boundary among the three die pads 7a1 through 7a3 shown in FIG. 28 intersect, and the resin (resin burrs) that has barged or intruded into the back surfaces (packaging or mounting surface at the time that the package 6 is packaged on the wiring board) of the die pads 7a1 through 7a3 through the intersecting point Z interferes with the packaging or mounting of the package 6, to thereby incur a failure in the packaging. Therefore, the bonding of the sealing tape is done to prevent the occurrence of such a state. In the present embodiment, the sealing tape is securely bonded onto the back surfaces (containing the slits for forming the boundary among the three die pads) of the three die pads prior to the sealing process in order to avoid the above leakage of resin and to thereby prevent the sealing resin from leaking to the back surfaces of the die pads 7a1 through 7a3 out of the intersecting point Z or the like. Thus, the failure in the mounting of the package 6 due to the resin burring can be prevented. Since it is preferable to securely bond the sealing tape onto the die pads 7a1 through 7a3 and the like during the sealing process as described above, the sealing tape may preferably be one capable of obtaining a high viscosity strength greater than or equal to, for example, 0.5 N as the strength of adhesion of the sealing tape from such a viewpoint. On the other hand, in the lead frame 7, for example, nickel (Ni)/palladium (Pd)/ gold (Au) flash plating has been used in recent years. This is because the Pd (palladium)-plated lead frame 7 has the advantage that the use of lead-free solder can be realized upon packaging of the package 6 on the wiring board, and it is easy on the environment, and, further, it has the advantage that, although a general lead frame requires the application of silver (Ag) paste onto a wire bonding section of the lead frame in advance for the purpose of wire bonding, wires can be connected even though such Ag paste is not applied thereto. On the other hand, since a problem concerning the above-described packaging failure due to the resin burrs arises even in the case of the Pd-plated lead frame 7, the resin burrs are removed by a cleaning process or the like where the resin burrs are formed. However, a problem arises in that, since the lead frame 7 is subjected to plating prior to the resin sealing process to eliminate a manufacturing process in the case of the Pd-plated lead frame 7, the Pd-plated film that has been plated in advance is also peeled off when an attempt is made to peel away the resin burrs by means of the subsequent cleaning process or the like. That is, there is a probability that the Pd-plated lead frame 7 cannot be used. On the other hand, since the formation of the resin burrs can be prevented, as described above, and a strong cleaning process subsequent to the sealing process is unnecessary in the present embodiment, the Pd-plated lead frame 7 having the above-mentioned satisfactory advantages can be used.

Subsequently, the sealing resin is injected into a mold upper die (cavity). Semiconductor chips 5a through 5c and a plurality of wires WA1 through WA3 and WB1 through WB6 are resin-sealed such that some of the die pads 7a1 through 7a3 and some of the plural leads 7b are exposed from a resin molded body MB (sealing member), thereby to form the corresponding resin molded body MB. In the present embodiment, the half etching areas are formed at the peripheral portions of the back surfaces of the die pads 7a1 through 7a3 and leads 7b, as described above. Forming the half etching areas (diagonally-hatched areas) in this way makes it possible to strengthen the adhesive forces among the die pads 7a1 through 7a3 and the leads 7b and the resin molded body MB. That is, a lead escape can be restrained or prevented. The thickness of the lead frame has also been made thin in response to a demand for reduction in the thickness and weight of a semiconductor device in particular. In addition to it, the leads 7b are thin as compared with other portions, and their tips are in a floating state without being connected to other portions. Therefore, the lead portions might be deformed or peeled off where the resin sealing or molding is done without executing any means. Thus, the outer peripheral portions, on the tip sides of the leads 7b, of the back surfaces thereof are also half-etched to form steps on the outer peripheries of the back surfaces of the leads 7b. Consequently, the sealing resin flows into their half-etched portions during the sealing process to cover the half-etched portions and press and hold the outer peripheral portions on the tip sides of the leads 7b. It is therefore possible to restrain or prevent deformation and peeling off of the leads 7b.

After the above-described resin sealing process, the injected sealing resin is cured (resin cure step 108). After execution of a mark step 109, individual product parts are divided from the lead frame 7 (Step 110).

Second Preferred Embodiment

Figure 31:
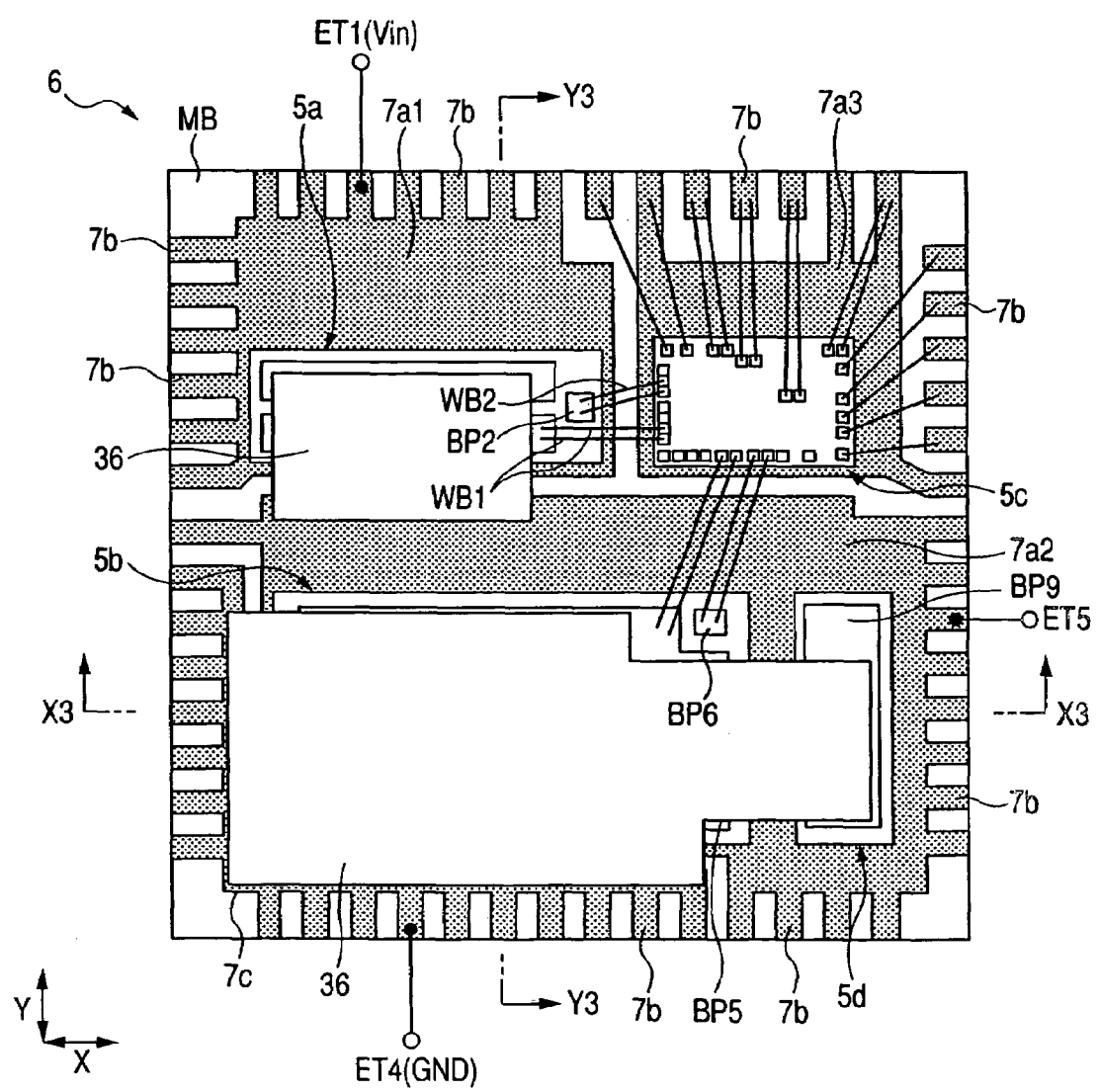
FIG. 31 is a plan view depicting an example of a semiconductor device according to a second embodiment of the present invention.
Figure 32:
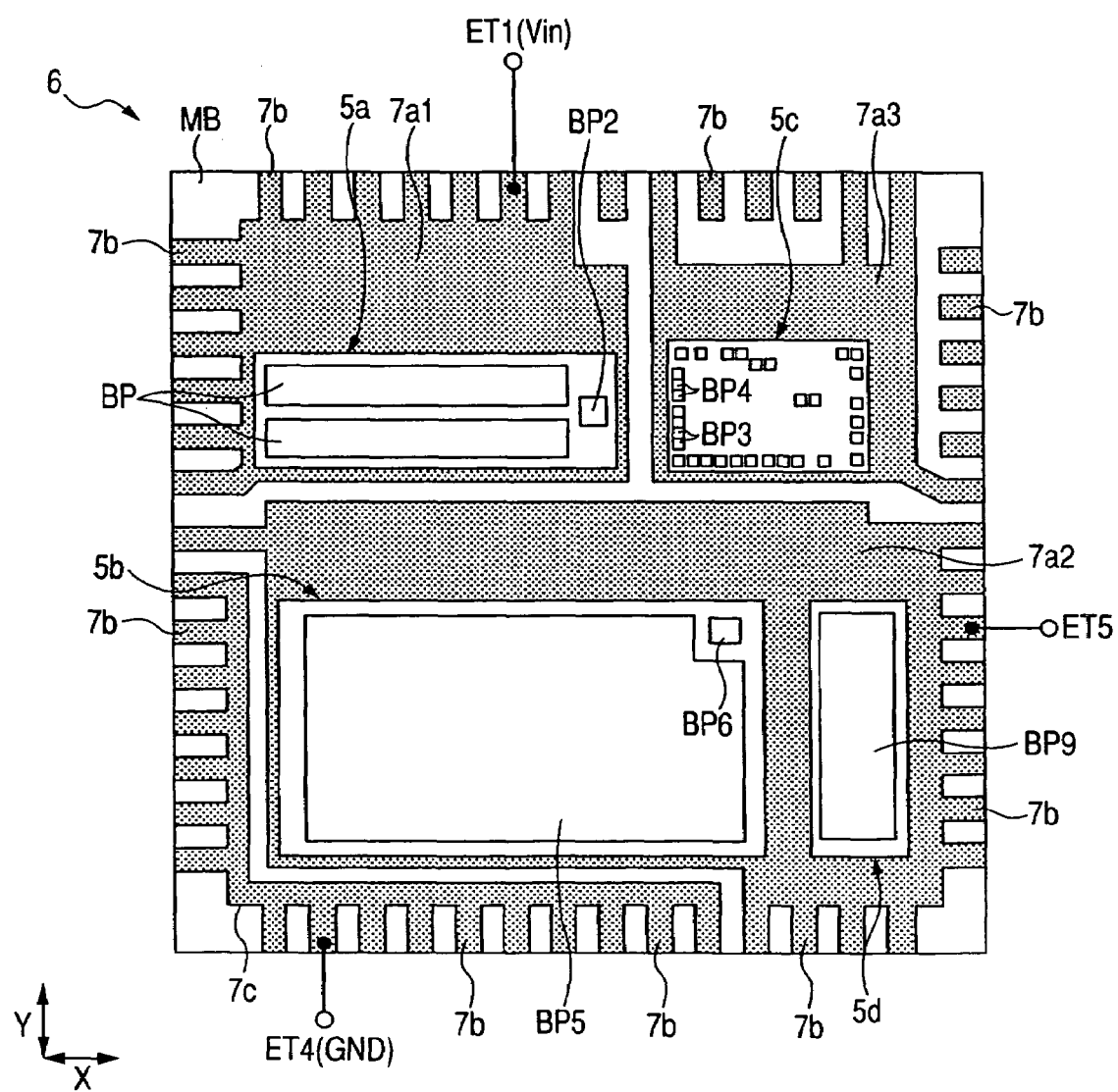
FIG. 32 is a plan view showing an example, exclusive of metal wiring boards, of the semiconductor device shown in FIG. 31.
Figure 33:
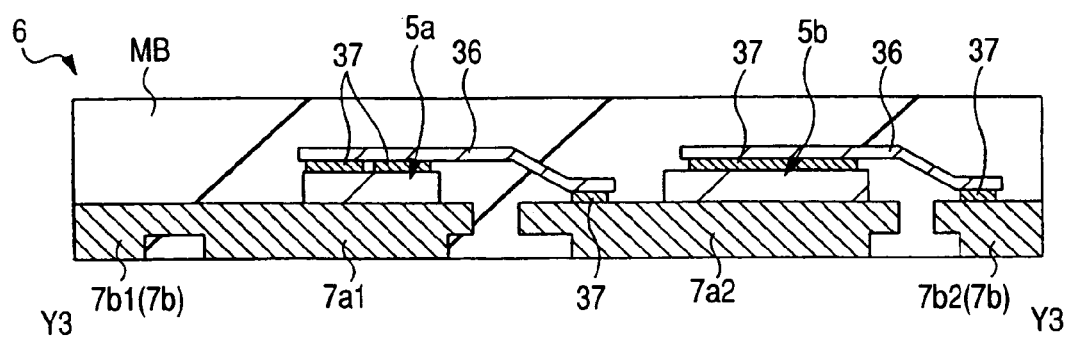
FIG. 33 is a cross-sectional view taken along line Y3-Y3 of FIG. 31.
Figure 34:
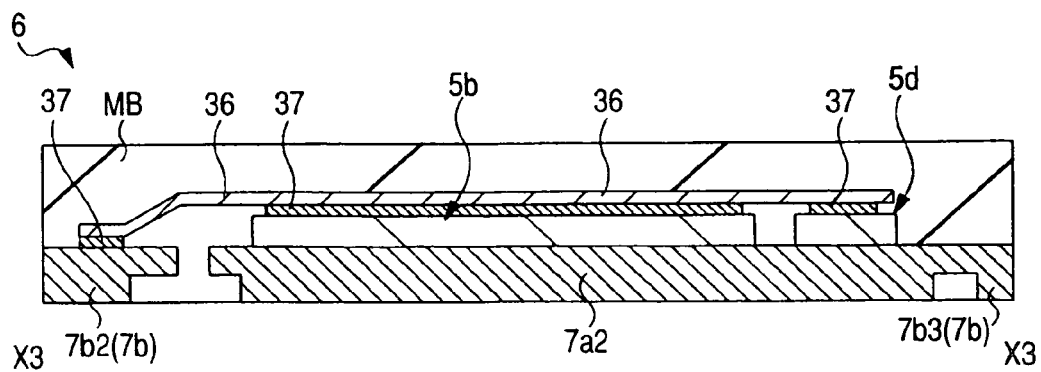
FIG. 34 is a cross-sectional view taken along line X3-X3 of FIG. 31.

FIG. 31 is a plan view showing an example of a package 6 according to a second embodiment, FIG. 32 is a plan view showing an example of the package 6 except for metal plate wirings of FIG. 31, FIG. 33 is a cross-sectional view taken along line Y3-Y3 of FIG. 31, and FIG. 34 is a cross-sectional view taken along line X3-X3 of FIG. 31. Incidentally, FIGS. 31 and 32 also show a sealing member MB as seen therethrough to make it easy to see the elements in the drawings. Further, die pads 7a1 and 7a2, leads 7b and a wiring section 7c are given hatching.

In the second embodiment, some of wirings for electrically connecting pads and respective portions are configured as metal plate wirings 36 in place of wires. That is, pads BP1 for a source electrode of a power MOS Q1 of a semiconductor chip 5a are electrically connected to a die pad 7a2 through one metal plate wiring 36. A BP5 for a source electrode of a power MOS Q2 of a semiconductor chip 5b is electrically connected to leads 7b2 (7b) through one metal plate wiring 36. The metal plate wirings 36 are formed of a metal such as, for example, copper (Cu) or aluminum (Al) or the like, and they are electrically connected to the pads BP1 and BP5 and leads 7b through bump electrodes 37. Each of the bump electrodes 37 is formed of a metal such as, for example, lead (Pb)/tin (Sn) or gold (Au) or the like. A conductive resin may be used in place of the bump electrodes 37. Each of the metal plate wirings 36 is also covered with the resin molded body MB over its entirety.

Thus, according to the second embodiment, the parasitic inductance on each wiring path can be further reduced owing to the use of the metal plate wirings 36 in place of the wires. Therefore, the switching loss can be further reduced and the voltage conversion efficiency of the non-insulated DC-DC converter 1 can be further enhanced as compared with the first embodiment.

Since an anode electrode of a Schottky barrier diode D1 is electrically connected to a reference potential GND by the corresponding metal plate wiring 36, which is large in area, the wiring resistance on the anode side and the parasitic inductance La on the anode electrode side can be greatly reduced. Accordingly, the effect of the Schottky barrier diode D1 can be sufficiently exhibited as compared with the first embodiment. Further, the diode conduction loss, and the diode recovery loss due to a reverse recovery time (trr) being made fast can be reduced. Therefore, it is possible to further enhance the voltage conversion efficiency of the non-insulated DC-DC converter 1. Since the inductances Lk and La can be made low, the noise can be further reduced.

When attention is now paid only to the parasitic inductances on the wiring paths, the wires WB1 through WB6 for electrically connecting a plurality of pads BP3, BP4, BP7, BP8, BP10, and BP11 of the driver circuits 3a and 3b and respective portions may preferably be formed of metal plate wirings 36. However, openings for the plural pads BP3, BP4, BP7, BP8, BP10 and BP11 of the driver circuits 3a and 3b are narrow, such as, for example, 90 μm. If the metal plate wirings 36 are connected in place of the wires WB1 through WB6, then ones narrow in width should inevitably be used even in the case of the metal plate wirings 36. Thus, it is expected that a sufficient effect cannot be obtained in terms of the reduction in parasitic inductance even as compared with the wires. It is also difficult to fabricate a metal plate wiring 36 of 100 μm or less, for example. Further, the connection of each metal plate wiring also becomes difficult as compared with the wires. Therefore, there is a fear of an increase in product cost and degradation of the product yield. Thus, the second embodiment adopts such a construction that the plurality of pads BP3, BP4, BP7, BP8, BP10 and BP11 of the driver circuits 3a and 3b and the respective portions are respectively connected by the wires WB1 through WB6.

However, in the wiring paths for connecting the power MOSs Q1 and Q2 and driver circuits 3a and 3b as described above, a plurality of the wires WB1 and WB2 are connected side by side to reduce the parasitic inductances on the wiring paths. That is, since a wide metal plate wiring 36 of 200 μm wide, for example, can be used at such a portion, the metal plate wiring 36 can be used as an alternative to the wires WB1 and WB2. Since the parasitic inductances can be reduced by providing electric connection between both the power MOSs Q1 and Q2 and the driver circuits 3a and 3b by means of the metal plate wiring 36 in this way, the switching loss can be reduced.

Third Preferred Embodiment

Figure 35:
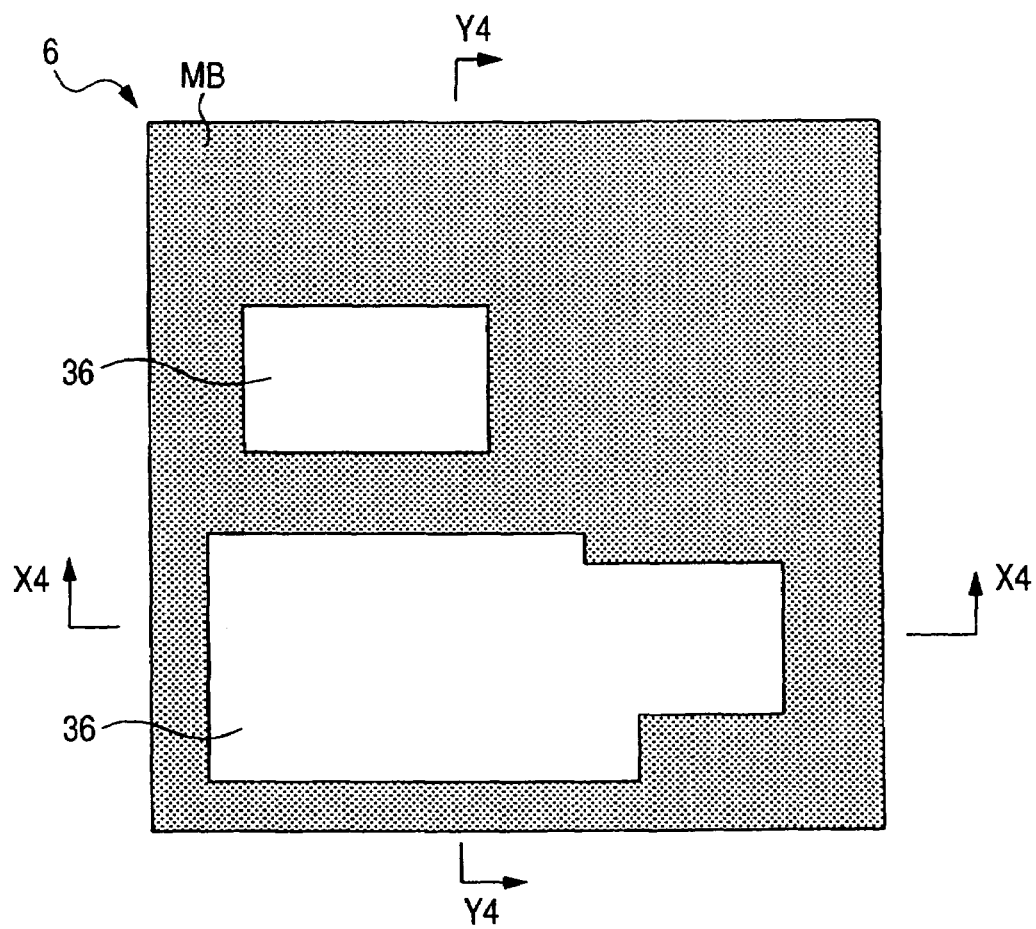
FIG. 35 is a plan view showing a top surface of a semiconductor device according to a third embodiment of the present invention.
Figure 36:
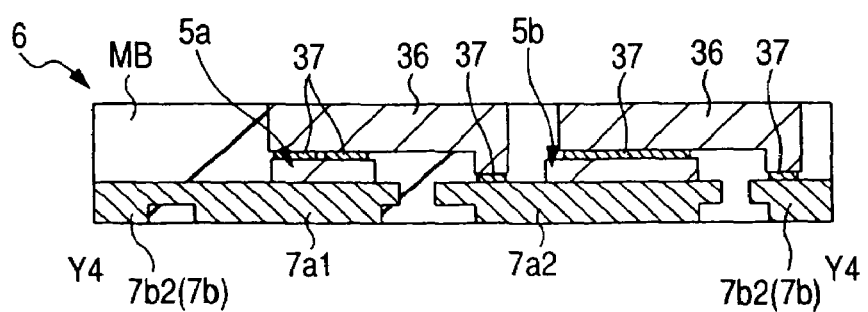
FIG. 36 is a cross-sectional view taken along line Y4-Y4 of FIG. 35.
Figure 37:
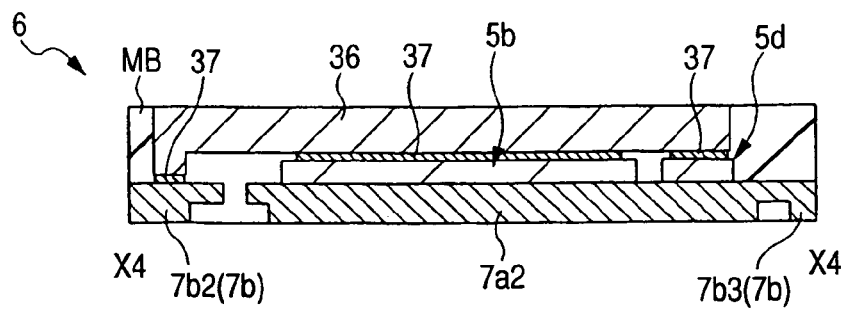
FIG. 37 is a cross-sectional view taken along line X4-X4 of FIG. 35.

FIG. 35 is a plan view showing a top surface of a package 6 according to a third embodiment, and FIGS. 36 and 37 are, respectively, cross-sectional views taken along line Y4-Y4 of FIG. 35 and line X4-X4 thereof. Incidentally, the arrangement of the inside of the package 6 is identical to that shown in FIG. 31. In FIG. 35, the top surface of the package 6 is given hatching to make it easy to see in the drawing. The top surface of the package 6 corresponds to a surface lying on the side opposite to a mounting surface (surface opposite to a wiring board) of the package 6.

In the third embodiment, the pads and respective portions are connected by metal plate wirings 36 in a manner similar to the second embodiment. However, some of the metal plate wirings 36 are exposed from a resin molded body MB. The metal plate wirings 36 are disposed so as to cover regions for forming power MOSs Q1 and Q2 corresponding to heat generation sources of semiconductor chips 5a and 5b. The present embodiment illustrates, as an example, a case in which both of the metal plate wirings 36 that cover the semiconductor chips 5a and 5b are exposed from the top surface of the package 6. However, a configuration in which only the metal plate wiring 36 on the semiconductor chip 5b side formed with the power MOS Q2 for the lowside switch, which generates a relatively high amount of heat, is exposed, may be adopted. A further improvement in radiation can also be obtained by placing a radiating fin over the top surface of the package 6 and bonding it onto the exposed surface of each metal plate wiring 36.

According to the third embodiment, each metal plate wiring 36 is caused to have a radiating function in addition to the advantages obtained in the first and second embodiments. Thus, since there is no need to add other parts for radiation, the process of assembling the package 6 can be reduced as compared with the case in which the radiating parts are added, and the time required to assemble the package 6 can be shortened. Since the number of parts can be reduced, the cost of a semiconductor device can be lowered.

Fourth Preferred Embodiment

As another problem that is caused due to an increase in current of a DC-DC converter and an increase in its frequency, a problem concerning the heat during its operation arises. Since the semiconductor chips 5a and 5b are constructed so as to be accommodated in one package 6 in the first through third embodiments, high radiation is required. The fourth embodiment will provide a construction in which such heat radiation has been taken into consideration.

Figure 38:
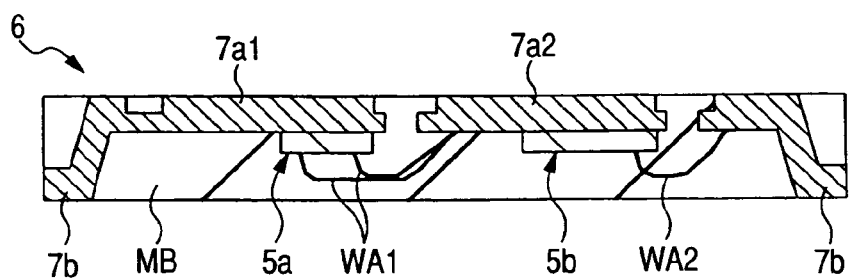
FIG. 38 is a cross-sectional view showing a semiconductor device according to a fourth embodiment of the present invention.

FIG. 38 is a cross-sectional view showing a package 6 according to a fourth embodiment. In the present embodiment, leads 7b are reversely molded in comparison to the leads 7b employed in the first through third embodiments. In the present structure, the back surfaces (corresponding to surfaces on the sides opposite to surfaces over which semiconductor chips 5a and 5b are mounted) of the die pads 7a1 and 7a2 are exposed to the top surface of the package 6. The back surfaces (corresponding to junction surfaces bonded to terminals of a wiring board) of the leads 7b are exposed to a mounting surface of the package 6.

Figure 39:
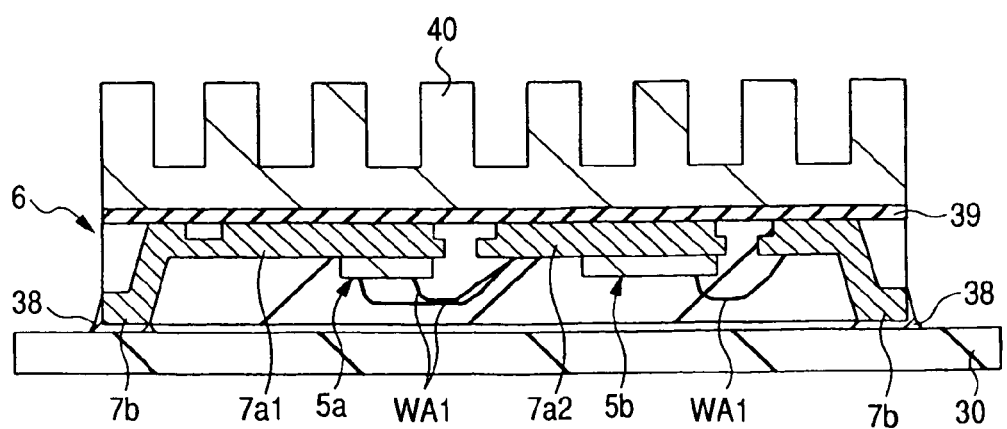
FIG. 39 is a cross-sectional view showing a semiconductor device illustrative of a modification of FIG. 38.

FIG. 39 is a cross-sectional view showing one example illustrative of a state in which the package 6 of FIG. 38 is mounted over a wiring board 30. Leads 7b located over the back surface (mounting surface) of the package 6 are bonded to corresponding terminals of the wiring board 30 through an adhesive 38 such as, for example, lead/tin solder or the like that is interposed therebetween. A radiating fin (heat sink) 40 is bonded onto the top surface of the package 6, i.e., the back surfaces of the die pads 7a1 and 7a2 through an insulating sheet 39 having a high thermal conductivity, such as, for example, silicone rubber or the like. In the present construction, heat generated in the semiconductor chips 5a and 5b is transferred via the die pads 7a1 and 7a2 from the back surfaces of the semiconductor chips 5a and 5b to the radiating fin 40, from which the heat is radiated. Thus, even though a non-insulated DC-DC converter 1 is brought into large-current and high-frequency states in such a construction in which the two semiconductor chips 5a and 5b are contained in one package 6, a high heat radiation can be obtained. Although an air-cooled heat sink has been illustrated by way of example in the present embodiment, for example, a liquid-cooled heat sink may be used which has a flow path to allow cooled flowing or running water to flow into a radiating body.

Fifth Preferred Embodiment

Figure 40:
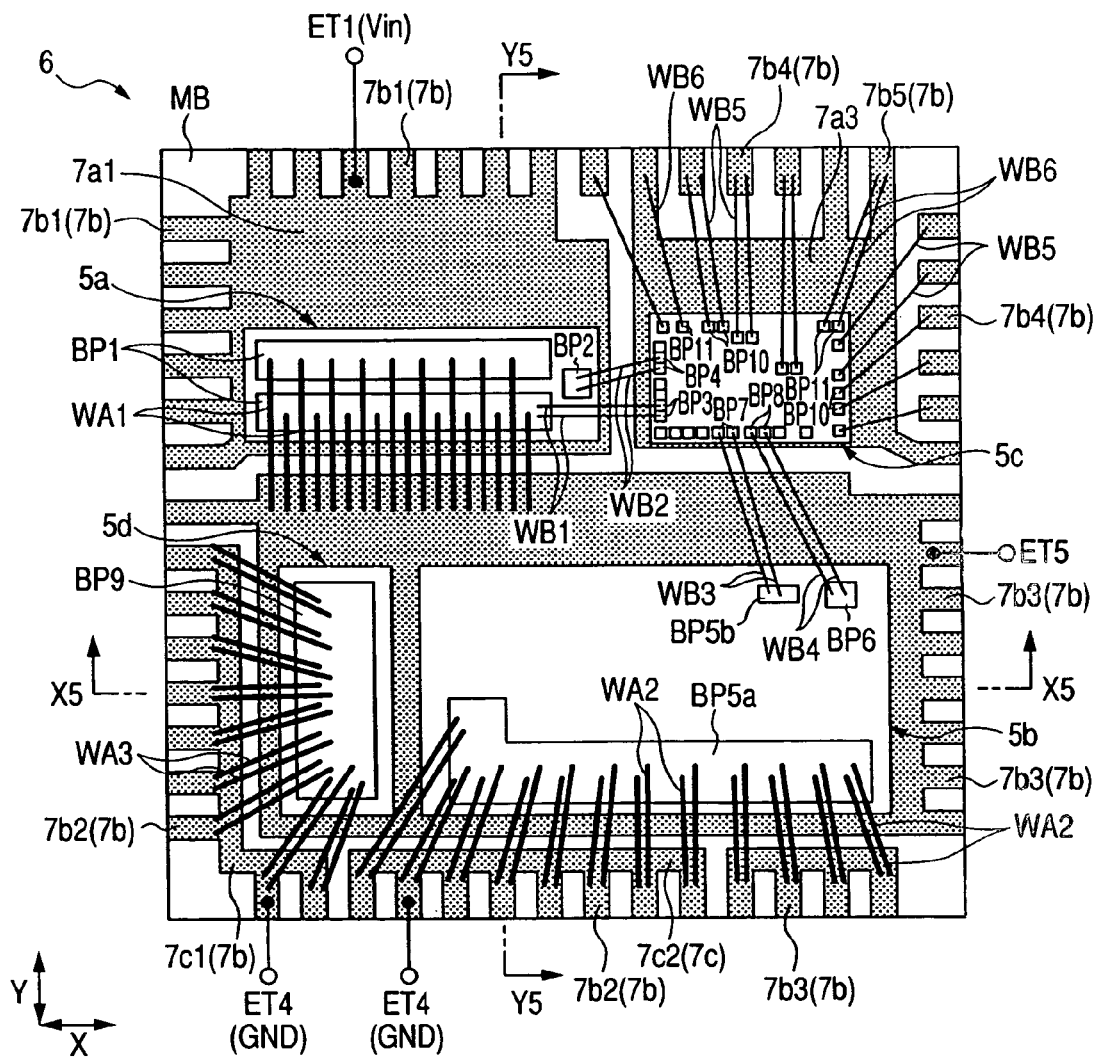
FIG. 40 is a plan view illustrating an example of a semiconductor device according to a fifth embodiment of the present invention.
Figure 41:
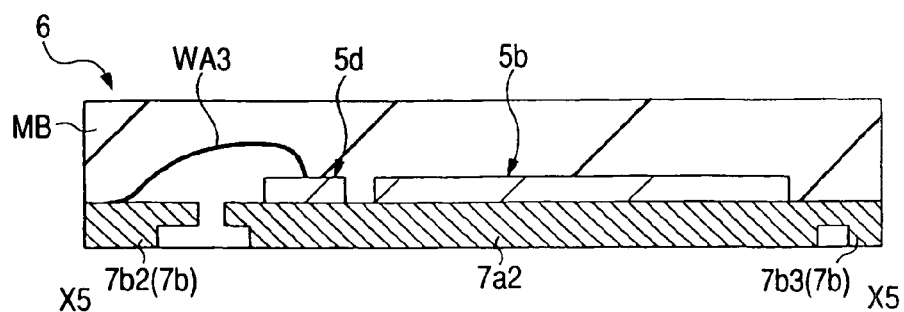
FIG. 41 is a cross-sectional view taken along line X5-X5 of FIG. 40.

FIG. 40 is a plan view showing one example of a configuration of a package 6 according to a fifth embodiment, and FIG. 41 is a cross-sectional view taken along line X5-X5 of FIG. 40. Incidentally, FIG. 40 shows a sealing member MB as seen therethrough to make it easy to see this element in the drawing even in the fifth embodiment. Further, die pads 7a1 and 7a2, leads 7b and wiring sections 7c are given hatching. A cross-section taken along line Y5-Y5 of FIG. 40 is identical to FIG. 16.

In the fifth embodiment, a semiconductor chip 5b formed with a power MOS Q2 is disposed so as to approach one group (terminal ET5 side) of output leads 7b3 rather than a semiconductor chip 5d formed with a Schottky barrier diode D1. The wiring sections 7c that contribute to the supply of a reference potential GND are divided into wiring sections 7c1 and 7c2. A pad BP9 for an anode electrode of the Schottky barrier diode D1 is electrically connected to the wiring section 7c1 through a plurality of wires WA3, whereas a pad BP5a for a source electrode of the power MOS Q2 is electrically connected to the wiring section 7c2 through a plurality of wires WA2. That is, in the present embodiment, the reference potential GND is separated into a reference potential GND for the semiconductor chip 5d and a reference potential GND for the semiconductor chip 5b.

Thus, a thermal resistance measurement (inspecting process) for the package 6 and its sorting can be easily performed. The thermal resistance measurement is a measuring method for determining, using the relation that a forward voltage Vf has a temperature dependence, whether electrical connections of the semiconductor chips 5b and 5d and respective portions are good or bad. When the reference potential GND for the Schottky barrier diode D1 and the reference potential GND for the power MOS Q2 are brought together upon the measurement, the forward voltage Vf on the Schottky barrier diode D1 side and the forward voltage Vf on the power MOS Q2 side are measured together. However, since the forward voltage Vf of the Schottky barrier diode D1 is normally low, the forward voltage Vf on the Schottky barrier diode D1 side comes into consideration, and, hence, the forward voltage Vf on the power MOS Q2 side cannot be sufficiently measured. Therefore, there is a fear that even though a problem occurs in connectivity on the power MOS Q2 side, it becomes unobvious at the time of measurement. Thus, in the present embodiment, the reference voltages GND are separately provided between the Schottky barrier diode D1 and the power MOS Q2 inside the package 6. Consequently, the forward voltages Vf for the Schottky barrier diode D1 and the power MOS Q2 can be measured separately, thereby making it possible to facilitate their measurements. Since the accuracy of measurement can be improved, the reliability of the inspecting process can be enhanced. Thus, it is possible to enhance the reliability of the package 6.

Sixth Preferred Embodiment

Figure 42:
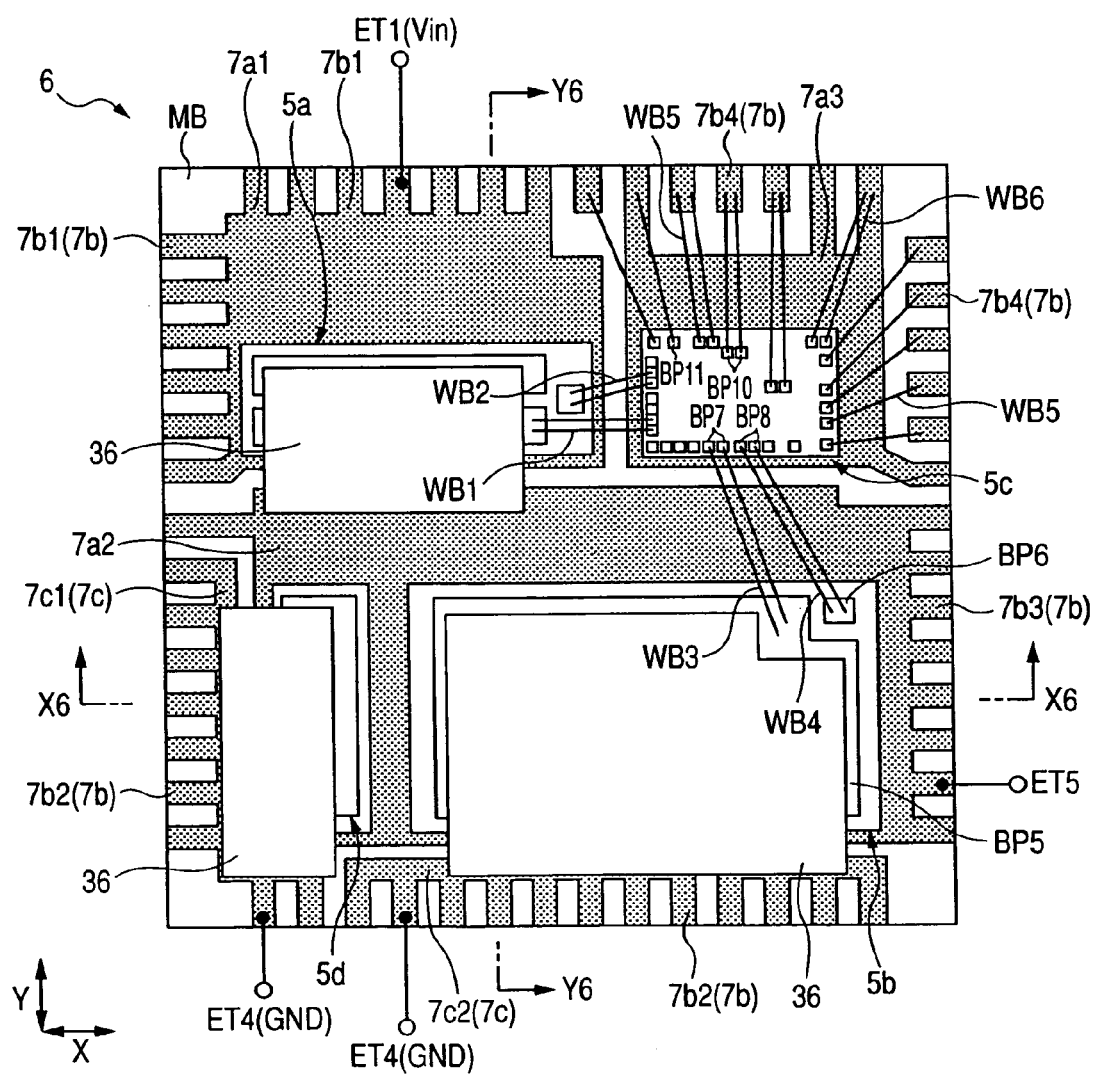
FIG. 42 is a plan view showing an example of a semiconductor device according to a sixth embodiment of the present invention.
Figure 43:
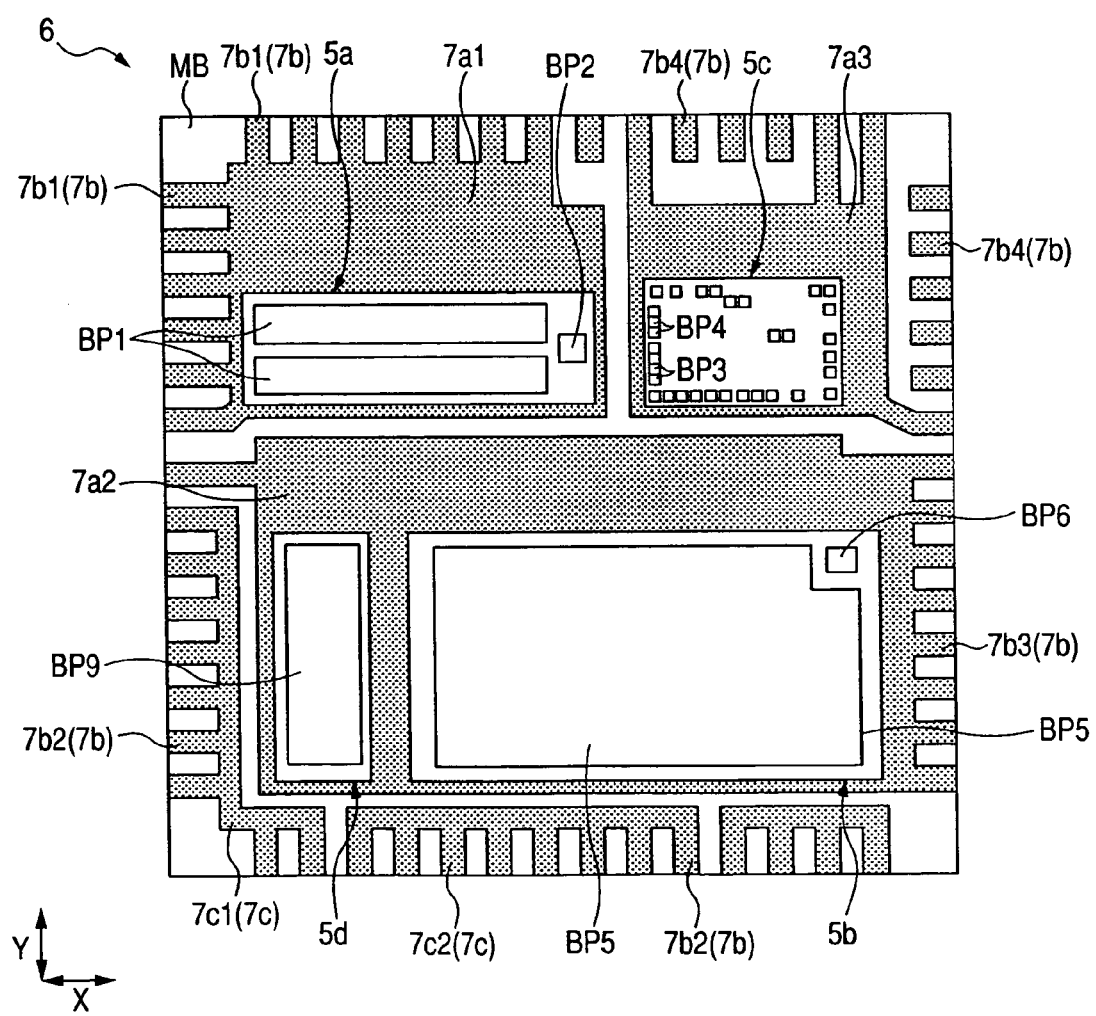
FIG. 43 is a plan view illustrating an example of the semiconductor device, exclusive of a metal wiring board and bonding wires shown in FIG. 42.
Figure 44:
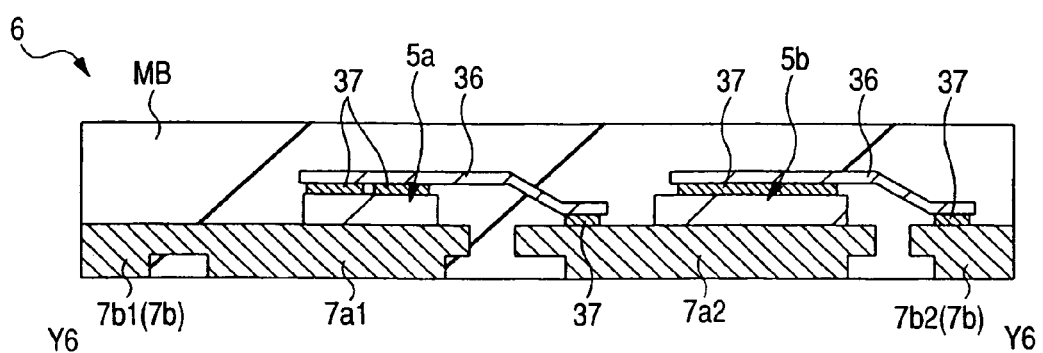
FIG. 44 is a cross-sectional view taken along line Y6-Y6 of FIG. 42.
Figure 45:
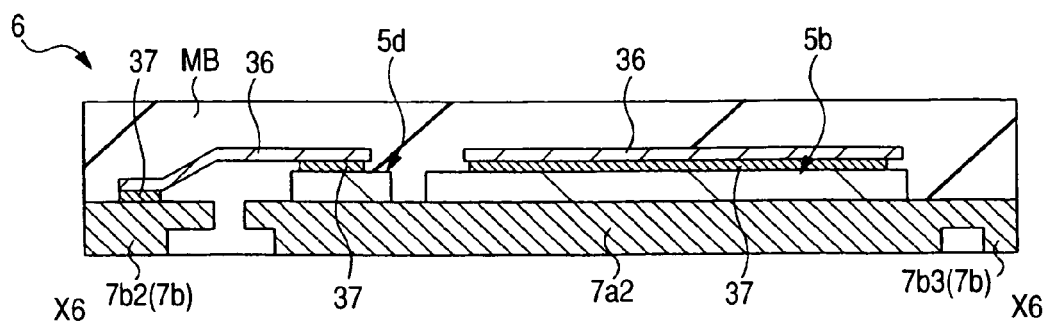
FIG. 45 is a cross-sectional view taken along line X6-X6 of FIG. 42.

FIG. 42 is a plan view showing an example of a package 6 according to a sixth embodiment, FIG. 43 is a plan view showing an example of the package 6 except for the metal plate wirings and wires of FIG. 42, FIG. 44 is a cross-sectional view taken along line Y6-Y6 of FIG. 42, and FIG. 45 is a cross-sectional view taken along line X6-X6 of FIG. 42. Incidentally, FIGS. 42 and 43 also show a sealing member MB as seen therethrough to make it easy to see other elements in the drawings. Further, die pads 7a1 and 7a2, leads 7b and wiring sections 7c are given hatching.

The sixth embodiment will be explained in connection with one example in which the constructions of the second and fifth embodiments are combined. That is, one example will be explained in which, in the construction of the fifth embodiment, some wires are replaced with metal plate wirings 36. Pads BP1 for a source electrode of a power MOS Q1 of a semiconductor chip 5a are electrically connected to a die pad 7a2 through one metal plate wiring 36. A pad BP5 for a source electrode of a power MOS Q2 of a semiconductor chip 5b is electrically connected to a wiring section 7c2 through one metal plate wiring 36 and is electrically connected to its corresponding leads 7b2 (7b) through the wiring section 7c2. Further, a pad BP9 for an anode electrode of a Schottky barrier diode D1 of a semiconductor chip 5d is electrically connected to a wiring section 7c1 through one metal plate wiring 36 and is electrically connected to its corresponding leads 7b2 (7b) through the wiring section 7c1.

According to such a sixth embodiment, an advantageous effect similar to the second and fifth embodiments can be obtained.

Seventh Preferred Embodiment

Figure 46:
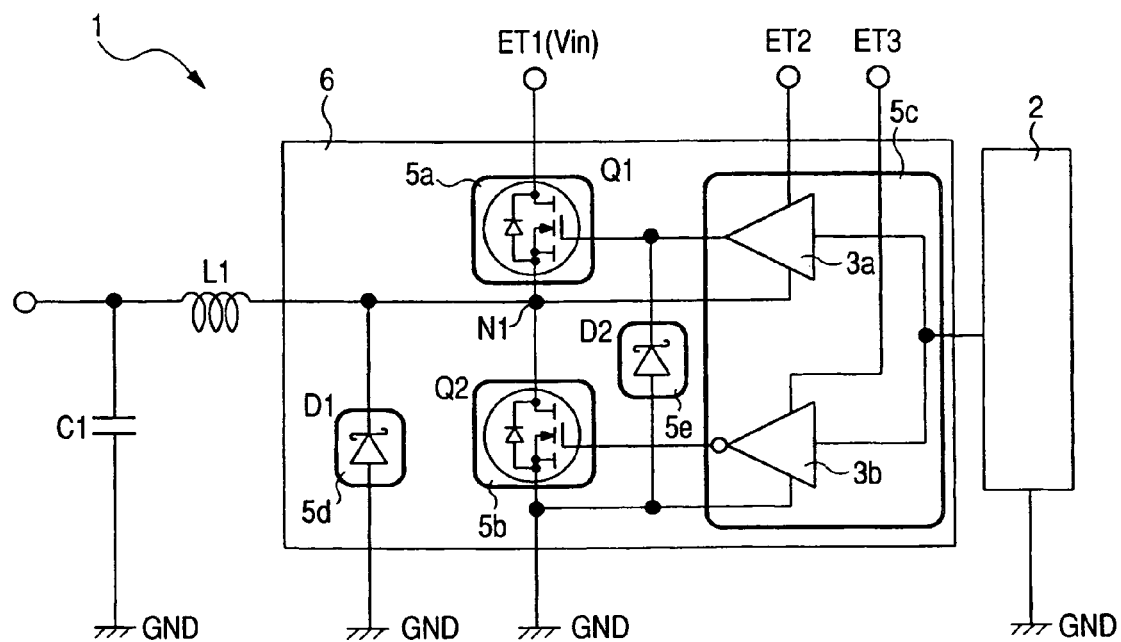
FIG. 46 is a schematic diagram showing an example of a semiconductor device according to a seventh embodiment of the present invention.

A seventh embodiment will explained in connection with an example in which countermeasures are taken against the second problem described with reference to the first embodiment. FIG. 46 is a diagram showing an example of a non-insulated DC-DC converter 1 according to the seventh embodiment. In the present embodiment, a Schottky barrier diode (second Schottky barrier diode) D2 is electrically connected between a gate electrode (the output of a driver circuit 3a) of a power MOS Q1 for a highside switch and a reference potential GND. The anode electrode of the Schottky barrier diode D2 is electrically connected to the reference potential GND, whereas its cathode electrode is electrically connected to the gate electrode (the output of the driver circuit 3a) of the power MOS Q1 for the highside switch. A semiconductor chip 5e formed with the Schottky barrier diode D2 is accommodated in a package 6 together with other semiconductor chips 5a through 5d.

Figure 47:
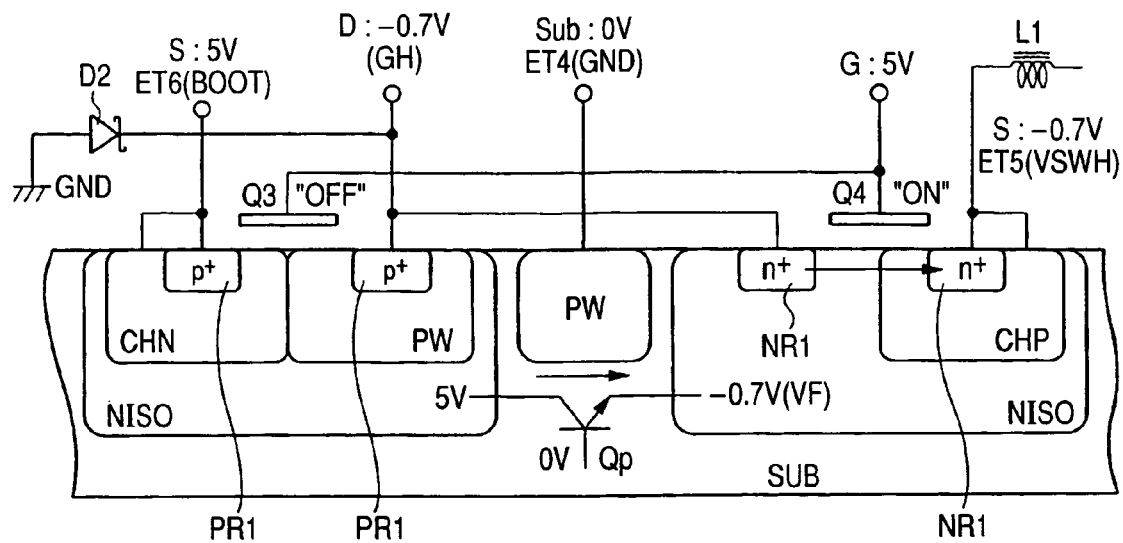
FIG. 47 is a diagram illustrating an operating state of a parasitic device of a third semiconductor chip in the configuration of the semiconductor device shown in FIG. 46.
Figure 48:
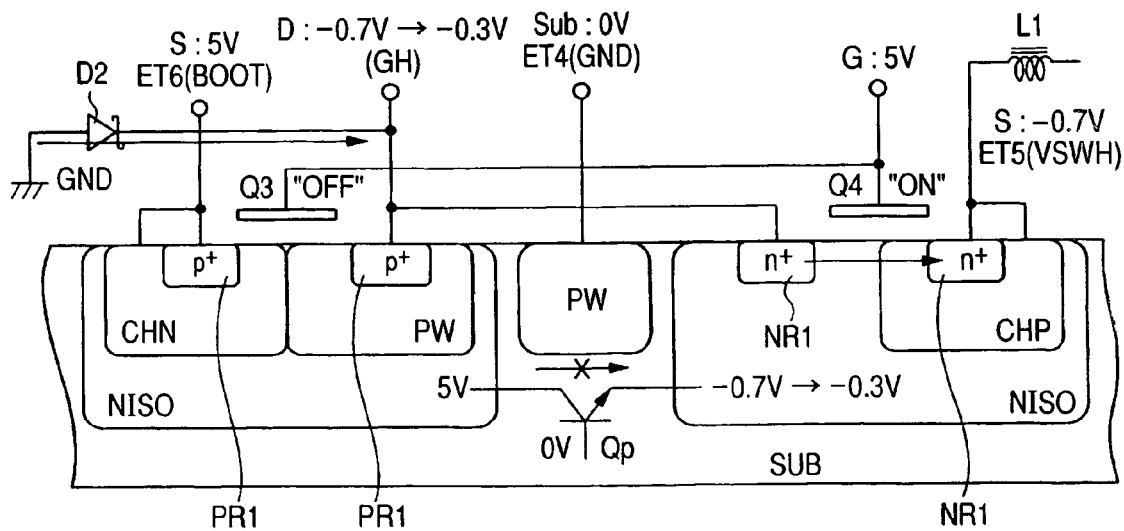
FIG. 48 is a diagram illustrating an operating state of the parasitic device of the third semiconductor chip in the configuration of the semiconductor device shown in FIG. 46.

FIGS. 47 and 48 are, respectively, diagrams showing the operating states of a parasitic device of a semiconductor chip 5c according to the configuration of the package 6 shown in FIG. 46. FIG. 47 shows a state of the parasitic device at a transient state when a power MOS Q3 of the driver circuit 3a is off and a power MOS Q4 thereof is on, and FIG. 48 shows a state of the parasitic device at a steady state when the power MOS Q3 is off and the power MOS Q4 is on.

A load current is supplied via a Schottky barrier diode D1 during the dead times of both power MOSs Q1 and Q2, as described above. However, in the case of a heavy load, when the load current that flows through the Schottky barrier diode D1 due to the wiring inductances Lk and La becomes small, as described above, and the load current flows even into a parasitic diode (body diode) Dp of a power MOS Q2 for a lowside switch, the potential at a terminal ET5 (VSWH) on the output side of the non-insulated DC-DC converter 1 is reduced to a negative potential by a forward voltage Vf of the parasitic diode Dp. If any measure is taken, then the output of the semiconductor chip 5c (driver chip or control IC) electrically connected to the power MOS Q1 is also reduced to a negative potential. As a result, a problem arises in that the parasitic npn type bipolar transistor Qp is turned on within the semiconductor chip 5c so that the current consumption of the driver chip increases. On the other hand, although the terminal ET5 (VSWH) is reduced to the negative potential, as described above, in the seventh embodiment, the Schottky barrier diode D2 having a forward voltage Vf of about 0.3V, for example, is electrically connected between the gate electrode of the power MOS Q1 for the highside switch and the reference potential GND, as described above, thereby making it possible to raise the potential at the gate (GH) of the power MOS Q1 for the highside switch to about −0.3V. Therefore, it is possible to prevent the parasitic bipolar transistor Qp lying within the semiconductor chip 5c from being turned on. Therefore, an increase in current consumption of the semiconductor chip 5c can be suppressed, and a loss consumed by the semiconductor chip 5c can be reduced. Since it is possible to avoid pulling out of an electrical charge from a terminal ET6 (BOOT), the automatic stopping (malfunction) of the power MOS Q1 for the highside switch due to a protection circuit function can be prevented.

Figure 49:
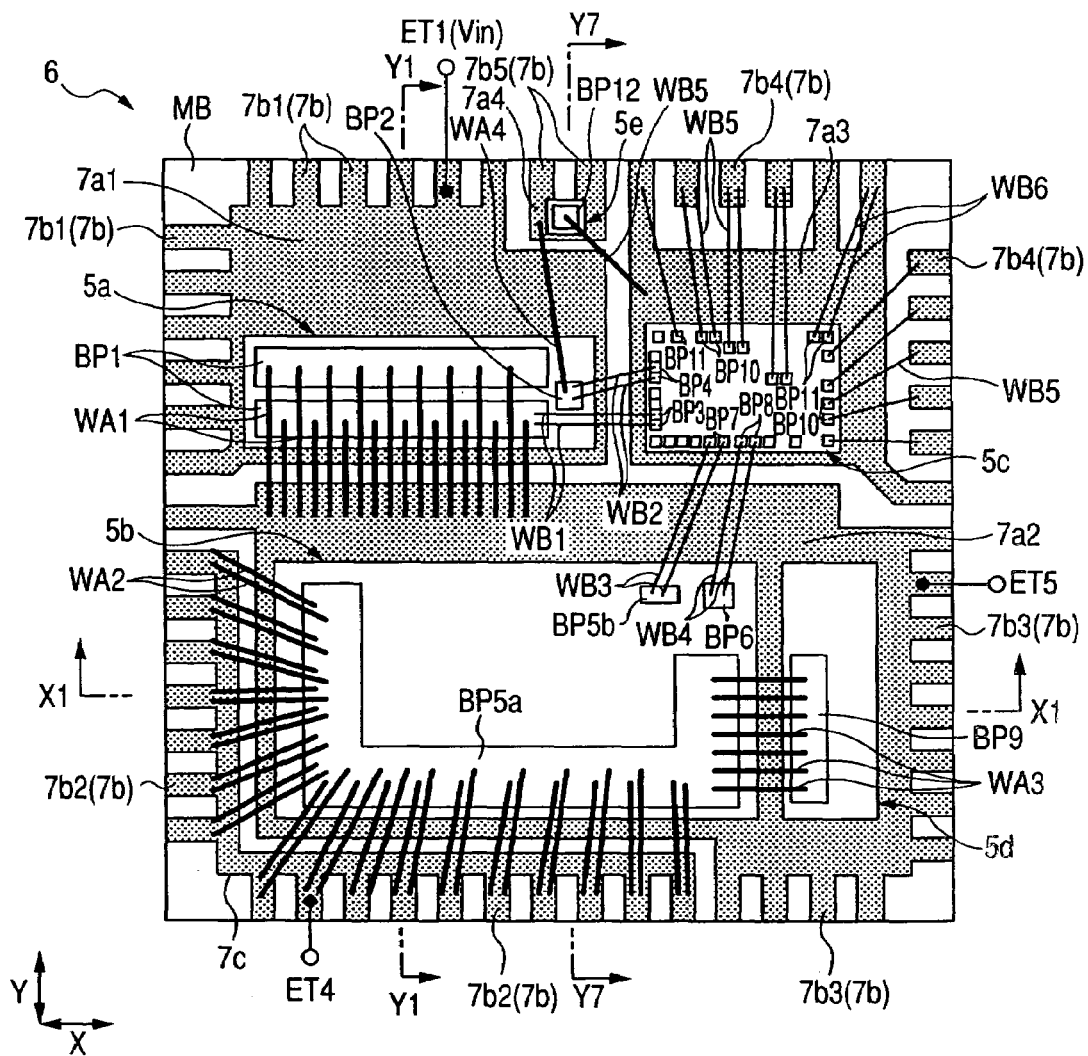
FIG. 49 is a plan view showing an example of the semiconductor device according to the seventh embodiment of the present invention.
Figure 50:
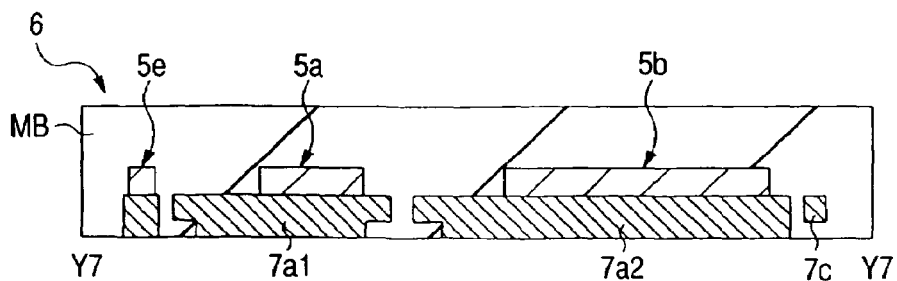
FIG. 50 is a cross-sectional view taken along line Y7-Y7 of FIG. 49.

FIG. 49 is a plan view showing a specific example of the package 6 according to the seventh embodiment, and FIG. 50 is a cross-sectional view taken along line Y7-Y7 of FIG. 49. Incidentally, FIG. 49 also shows a sealing member MB as seen therethrough to make it easy to see other elements in the drawing. Further, die pads 7a1 and 7a2, leads 7b and a wiring section 7c are given hatching. A cross-section taken along line Y1-Y1 of FIG. 49 is identical to FIG. 16, and a cross-section taken along line X1-X1 of FIG. 49 is identical to FIG. 17. Wires are omitted from FIG. 50 to make it easy to see other elements in the drawing.

A semiconductor chip 5e formed with a Schottky barrier diode D2 is mounted over a die pad 7a4 (fourth chip mounting section). A back surface of the semiconductor chip 5e serves as a cathode electrode and is electrically connected to the die pad 7a4. The die pad 7a4 is electrically connected to a pad BP2 of a semiconductor chip 5a formed with a power MOS Q1 through a wire WA4. That is, a cathode electrode of the Schottky barrier diode D2 is electrically connected to its corresponding gate electrode of the power MOS Q1. On the other hand, a pad BP12 for an anode electrode is formed over a main surface of the semiconductor chip 5e. The pad BP12 is electrically connected to its corresponding die pad 7a3 through a wire WA5. The die pad 7a3 is supplied with a reference potential GND. That is, the anode electrode of the Schottky barrier diode D2 is electrically connected to the reference potential GND. Thus, the use of the Schottky barrier diode D2 makes it possible to obtain a necessary forward voltage Vf in a small area. While the Schottky barrier diode D2 is capable of obtaining an advantageous effect similar to the effect described above even if mounted outside the package 6, parasitic inductances on the anode and cathode of the Schottky barrier diode D2 can be reduced owing to the storage of the Schottky barrier diode D2 in the package 6. Therefore, it is possible to enhance the effect of inserting the Schottky barrier diode D2 therein.

Eighth Preferred Embodiment

Figure 51:
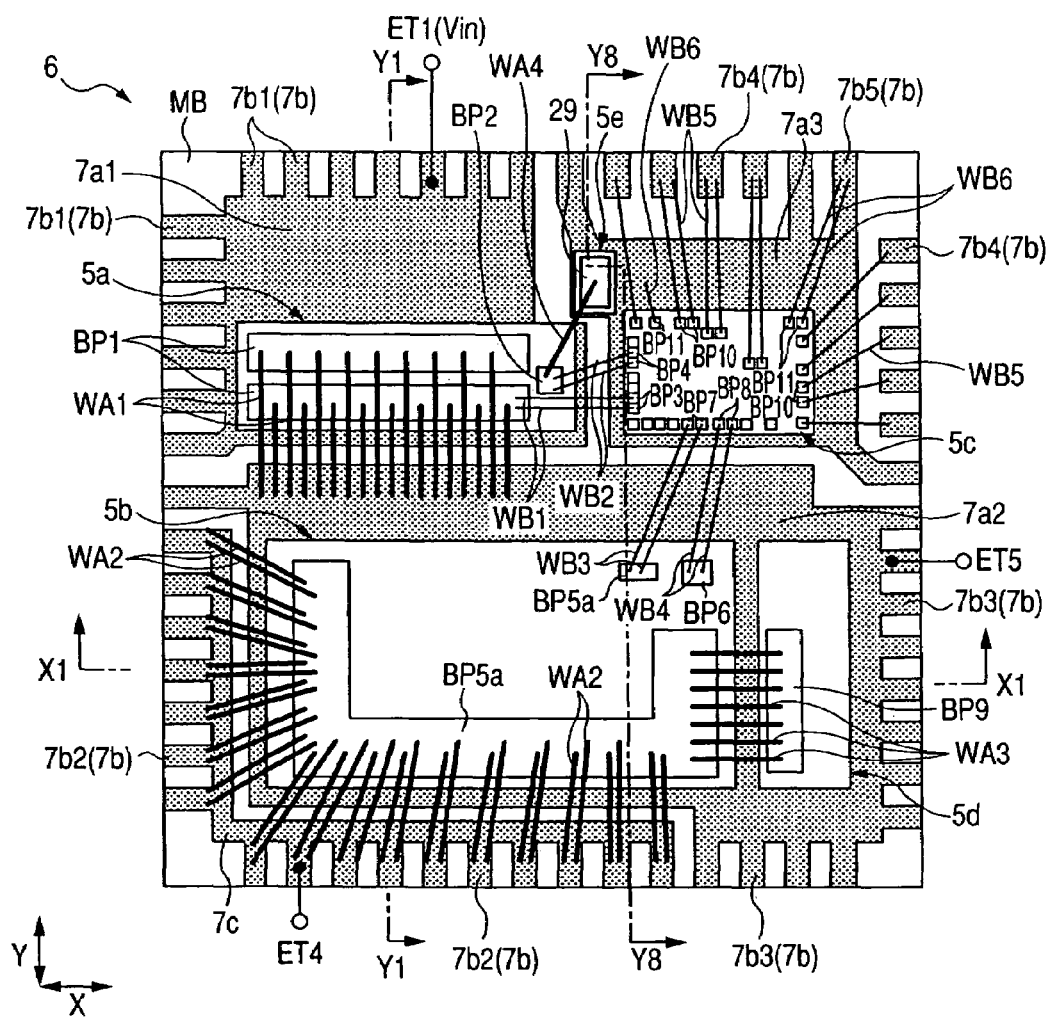
FIG. 51 is a plan view showing an example of a semiconductor device according to an eighth embodiment of the present invention.
Figure 52:
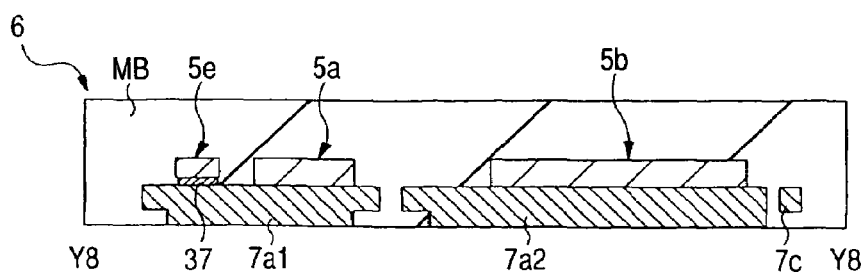
FIG. 52 is a cross-sectional view taken along line Y8-Y8 of FIG. 51.

FIG. 51 is a plan view showing an example of a package 6 according to an eighth embodiment, and FIG. 52 is a cross-sectional view taken along line Y8-Y8 of FIG. 51. Incidentally, FIG. 51 also shows a sealing member MB as seen therethrough to make it easy to see in the drawing. Further, die pads 7a1 and 7a2, leads 7b and a wiring section 7c are given hatching. A cross-section taken along line Y1-Y1 of FIG. 51 is identical to FIG. 16, and a cross-section taken along line X1-X1 of FIG. 51 is identical to FIG. 17. Even in FIG. 51, wires are omitted therefrom to make it easy to see other elements in the drawing.

In the eighth embodiment, a semiconductor chip 5e is mounted over a die pad 7a3. That is, a pad BP12 for an anode electrode of a main surface of the semiconductor chip 5e is electrically connected to the die pad 7a3 through a bump electrode 37. Thus, the anode of a Schottky barrier diode D2 is electrically connected to a reference potential GND through the die pad 7a3. On the other hand, the cathode electrode 29 lying over a back surface of the semiconductor chip 5e is electrically connected to its corresponding pad BP1 of a semiconductor chip 5a through a wire WA4. Thus, the cathode electrode of the Schottky barrier diode D2 is electrically connected to its corresponding gate electrode of a power MOS Q1 through the wire WA4.

According to the eighth embodiment, the following advantageous effects are obtained in addition to the advantageous effect obtained in the seventh embodiment. That is, since the Schottky barrier diode D2 can be placed close to the semiconductor chips 5a and 5c, as compared with the seventh embodiment, parasitic inductances on the anode and cathode sides of the Schottky barrier diode D2 can be reduced. Particularly since the anode electrode of the Schottky barrier diode D2 is electrically connected to the reference potential GND through the die pad 7a3, which is large in area, the parasitic inductance on the anode side of the Schottky barrier diode D2 can be reduced. Accordingly, the effect of inserting the Schottky barrier diode D2 can be further enhanced.

Ninth Preferred Embodiment

Figure 53:
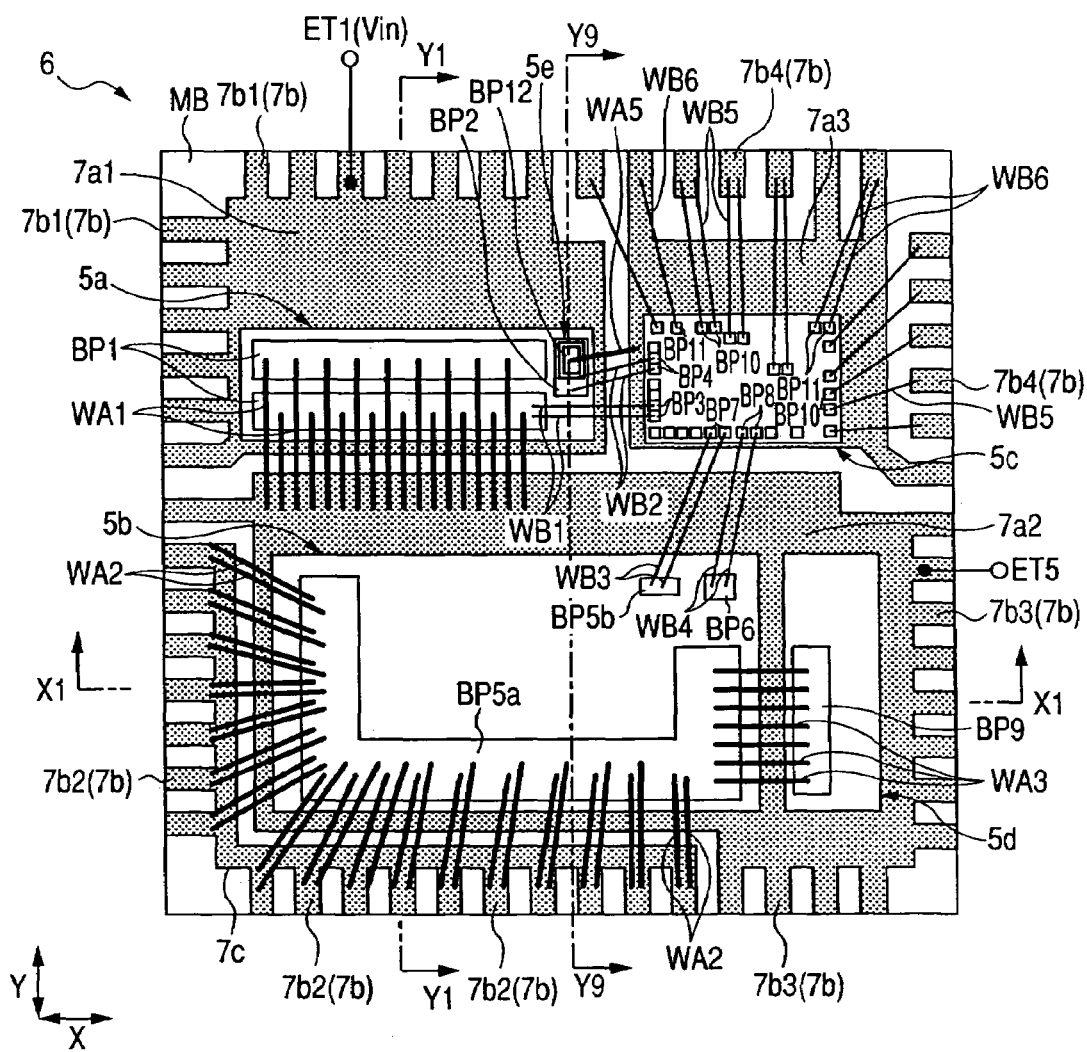
FIG. 53 is a plan view showing an example of a semiconductor device according to a ninth embodiment of the present invention.
Figure 54:
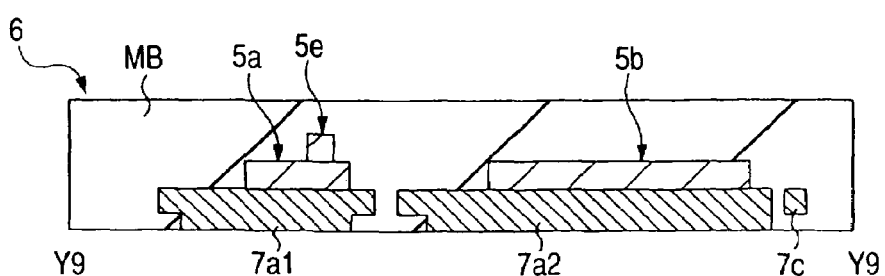
FIG. 54 is a cross-sectional view taken along line Y9-Y9 of FIG. 53.

FIG. 53 is a plan view showing an example of a package 6 according to a ninth embodiment, and FIG. 54 is a cross-sectional view taken along line Y9-Y9 of FIG. 53. Incidentally, FIG. 53 also shows a sealing member MB as seen therethrough to make it easy to see in the drawing. Further, die pads 7a1 and 7a2, leads 7b and a wiring section 7c are given hatching. A cross-section taken along line Y1-Y1 of FIG. 53 is identical to FIG. 16, and a cross-section taken along line X1-X1 of FIG. 53 is identical to FIG. 17. Even in FIG. 54, wires are omitted therefrom to make it easy to see other elements in the drawing.

In the ninth embodiment, a semiconductor chip 5e is mounted over a pad BP1 of a semiconductor chip 5a. That is, a cathode electrode lying over a back surface of the semiconductor chip 5e is electrically connected to its corresponding pad BP1 of the semiconductor chip 5a in a state where it is in direct contact with the pad BP1. Thus, the cathode electrode of a Schottky barrier diode D2 is electrically connected to it's the corresponding gate electrode of a power MOS Q1. On the other hand, a pad BP12 for an anode electrode lying over a main surface of the semiconductor chip 5e is electrically connected to a die pad 7a3 through a wire WA5. Thus, the anode of the Schottky barrier diode D2 is electrically connected to a reference potential GND through the die pad 7a3.

According to the ninth embodiment, the following advantageous effects are obtained in addition to the advantageous effects obtained in the seventh and eighth embodiments. That is, since the semiconductor chip 5e can be positional close to the semiconductor chips 5a and 5c as compared with the eighth embodiment, the parasitic inductances on the anode and cathode sides of the Schottky barrier diode D2 can be greatly reduced. Particularly, since the cathode electrode 29 of the Schottky barrier diode D2 is directly connected to the pad BP1 of the semiconductor chip 5a, the parasitic inductance on the cathode side of the Schottky barrier diode D2 can be further reduced. Accordingly, the effect of inserting the Schottky barrier diode D2 can be further enhanced. Since there is no need to change the design of each pattern for a lead frame 7 even though the Schottky barrier diode D2 is inserted, the fabrication of a semiconductor device can be facilitated and product cost also can be reduced. Further, since the semiconductor chips are divided into the semiconductor chip 5a formed with the Schottky barrier diode D2 and the semiconductor chip 5a formed with the power MOS Q1, their device characteristics can be sufficiently brought out.

While the invention made by the present inventors has been described specifically on the basis of the preferred embodiments thereof, the present invention is not limited to the embodiments referred to above. It is needless to say that various changes can be made thereto within a scope not departing from the gist thereof.

Although the embodiments respectively have been illustrated by way of example with reference to a flat package structure, for example, the present invention is not limited to it. For example, a BGA (Ball Grid Array) package structure may be adopted.

While the above description has principally been directed to a case in which the invention made by the present inventors is applied to a power supply circuit for driving a CPU and a DSP, which belongs to the general field of application of the invention, the present invention is not limited to it, but is applicable in various ways. The present invention can be applied even to a power supply circuit for driving other circuits, for example.

The present invention can be applied to the manufacturing industry of a semiconductor device.

What is claimed is:

1. A semiconductor device comprising:
    a first chip mounting section, a second chip mounting section and a third chip mounting section respectively disposed at intervals;
    a plurality of external terminals disposed around the first, second and third chip mounting sections;
    a first semiconductor chip disposed over the first chip mounting section and having a first field effect transistor;
    a second semiconductor chip disposed over the second chip mounting section and having a second field effect transistor;
    a third semiconductor chip disposed over the third chip mounting section and including a control circuit which controls operations of the first and second field effect transistors;
    a fourth semiconductor chip disposed over the second chip mounting section and having a first Schottky barrier diode; and
    a sealing body which seals the first, second, third and fourth semiconductor chips, the first, second and third chip mounting sections and some of the plurality of external terminals,
    wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside,
    wherein the first field effect transistor has a source-drain path series-connected between the first power supply terminal and the output terminal;
    wherein the second field effect transistor has a source-drain path series-connected between the output terminal and the second power supply terminal,
    wherein the control circuit of the third semiconductor chip controls respective operations of the first and second field effect transistors in accordance with a control signal inputted to the signal terminal,
    wherein the third semiconductor chip is disposed in such a manner that a distance between the third semiconductor chip and the first semiconductor chip is set shorter than a distance between the third semiconductor chip and the second semiconductor chip, and
    wherein the first Schottky barrier diode of the fourth semiconductor chip has a cathode electrically connected to the output terminal and an anode electrically connected to the second power supply terminal, and is electrically connected so as to be parallel with the second field effect transistor,
    wherein the control circuit of the third semiconductor chip includes a first control circuit which controls the operation of the first field effect transistor, and a second control circuit which controls the operation of the second field effect transistor,
    wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal,
    wherein the sealing body further includes:
    (a) a fifth semiconductor chip having the second Schottky barrier diode;
    (b) a fourth chip mounting section with the fifth semiconductor chip mounted thereover, and electrically connected to the cathode of the second Schottky barrier diode;
    (c) a wire which electrically connects the fourth chip mounting section to the output of the first control circuit; and
    (d) a wire which electrically connects the anode of the second Schottky barrier diode to the second power supply terminal.

2. A semiconductor device comprising:
    a first chip mounting section, a second chip mounting section and a third chip mounting section respectively disposed at intervals;
    a plurality of external terminals disposed around the first, second and third chip mounting sections:
    a first semiconductor chip disposed over the first chip mounting section and having a first field effect transistor;
    a second semiconductor chip disposed over the second chip mounting section and having a second field effect transistor;
    a third semiconductor chip disposed over the third chip mounting section and including a control circuit which controls operations of the first and second field effect transistors;
    a fourth semiconductor chip disposed over the second chip mounting section and having a first Schottky barrier diode; and
    a sealing body which seals the first, second, third and fourth semiconductor chips, the first, second and third chip mounting sections and some of the plurality of external terminals,
    wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside,
    wherein the first field effect transistor has a source-drain path series-connected between the first power supply terminal and the output terminal;

wherein the second field effect transistor has a source-drain path series-connected between the output terminal and the second power supply terminal, wherein the control circuit of the third semiconductor chip controls respective operations of the first and second field effect transistors in accordance with a control signal inputted to the signal terminal, wherein the third semiconductor chip is disposed in such a manner that a distance between the third semiconductor chip and the first semiconductor chip is set shorter than a distance between the third semiconductor chip and the second semiconductor chip, and wherein the first Schottky barrier diode of the fourth semiconductor chip has a cathode electrically connected to the output terminal and an anode electrically connected to the second power supply terminal, and is electrically connected so as to be parallel with the second field effect transistor, wherein the control circuit of the third semiconductor chip includes a first control circuit which controls the operation of the first field effect transistor, and a second control circuit which controls the operation of the second field effect transistor, wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal, wherein the sealing body further includes:

(a) a fifth semiconductor chip having the second Schottky barrier diode; and (b) a wire which electrically connects the cathode of the second Schottky barrier diode to the output of the first control circuit, and wherein the fifth semiconductor chip is mounted over the third chip mounting section in a state in which the anode of the second Schottky barrier diode is electrically connected to the second power supply terminal through the third chip mounting section.

3. A semiconductor device comprising:

a first chip mounting section, a second chip mounting section and a third chip mounting section respectively disposed at intervals;

a plurality of external terminals disposed around the first, second and third chip mounting sections;

a first semiconductor chip disposed over the first chip mounting section and having a first field effect transistor;

a second semiconductor chip disposed over the second chip mounting section and having a second field effect transistor;

a third semiconductor chip disposed over the third chip mounting section and including a control circuit which controls operations of the first and second field effect transistors;

a fourth semiconductor chip disposed over the second chip mounting section and having a first Schottky barrier diode; and a sealing body which seals the first, second, third and fourth semiconductor chips, the first, second and third chip mounting sections and some of the plurality of external terminals, wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside, wherein the first field effect transistor has a source-drain path series-connected between the first power supply terminal and the output terminal;

wherein the second field effect transistor has a source-drain path series-connected between the output terminal and the second power supply terminal, wherein the control circuit of the third semiconductor chip controls respective operations of the first and second field effect transistors in accordance with a control signal inputted to the signal terminal, wherein the third semiconductor chip is disposed in such a manner that a distance between the third semiconductor chip and the first semiconductor chip is set shorter than a distance between the third semiconductor chip and the second semiconductor chip, and wherein the first Schottky barrier diode of the fourth semiconductor chip has a cathode electrically connected to the output terminal and an anode electrically connected to the second power supply terminal, and is electrically connected so as to be parallel with the second field effect transistor, wherein the control circuit of the third semiconductor chip includes a first control circuit which controls the operation of the first field effect transistor, and a second control circuit which controls the operation of the second field effect transistor, wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal, wherein the sealing body further includes:

(a) a fifth semiconductor chip having the second Schottky barrier diode; and (b) a wire which electrically connects the anode of the second Schottky barrier diode to the second power supply terminal, and wherein the fifth semiconductor chip is mounted over the first semiconductor chip in a state in which the cathode of the second Schottky barrier diode is electrically connected to a gate electrode of the first field effect transistor of the first semiconductor chip.

4. A semiconductor device comprising:

a first chip mounting section, a second chip mounting section and a third chip mounting section respectively disposed at intervals;

a plurality of external terminals disposed around the first, second and third chip mounting sections;

a first semiconductor chip disposed over the first chip mounting section and having a first field effect transistor;

a second semiconductor chip disposed over the second chip mounting section and having a second field effect transistor;

a third semiconductor chip disposed over the third chip mounting section and including a control circuit which controls operations of the first and second field effect transistors;

a fourth semiconductor chip disposed over the second chip mounting section and having a first Schottky barrier diode; and a sealing body which seals the first, second, third and fourth semiconductor chips, the first, second and third chip mounting sections and some of the plurality of external terminals, wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside, wherein the first field effect transistor has a source-drain path series-connected between the first power supply terminal and the output terminal;

wherein the second field effect transistor has a source-drain path series-connected between the output terminal and the second power supply terminal, wherein the control circuit of the third semiconductor chip controls respective gates of the first and second field effect transistors in accordance with a control signal inputted to the signal terminal, wherein the second semiconductor chip is placed in a position closer to the second power supply terminal than the output terminal, and wherein the first Schottky barrier diode of the fourth semiconductor chip has a cathode electrically connected to the output terminal and an anode electrically connected to the second power supply terminal, and is electrically connected so as to be parallel with the second field effect transistor, wherein the control circuit of the third semiconductor chip includes a first control circuit for control of the operation of the first field effect transistor, and a second control circuit for control of the operation of the second field effect transistor, wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal, wherein the sealing body further includes:

(a) a fifth semiconductor chip having the second Schottky barrier diode;

(b) a fourth chip mounting section with the fifth semiconductor chip mounted thereover, and electrically connected to the cathode of the second Schottky barrier diode;

(c) a wire which electrically connects the fourth chip mounting section to the output of the first control circuit; and (d) a wire which electrically connects the anode of the second Schottky barrier diode to the second power supply terminal.

5. A semiconductor device, comprising:

a first chip mounting section, a second chip mounting section and a third chip mounting section respectively disposed at intervals;

a plurality of external terminals disposed around the first, second and third chip mounting sections;

a first semiconductor chip disposed over the first chip mounting section and having a first field effect transistor;

a second semiconductor chip disposed over the second chip mounting section and having a second field effect transistor;

a third semiconductor chip disposed over the third chip mounting section and including a control circuit which controls operations of the first and second field effect transistors;

a fourth semiconductor chip disposed over the second chip mounting section and having a first Schottky barrier diode; and a sealing body which seals the first, second, third and fourth semiconductor chips, the first, second and third chip mounting sections and some of the plurality of external terminals, wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside, wherein the first field effect transistor has a source-drain path series-connected between the first power supply terminal and the output terminal;

wherein the second field effect transistor has a source-drain path series-connected between the output terminal and the second power supply terminal, wherein the control circuit of the third semiconductor chip controls respective gates of the first and second field effect transistors in accordance with a control signal inputted to the signal terminal, wherein the second semiconductor chip is placed in a position closer to the second power supply terminal than the output terminal, and wherein the first Schottky barrier diode of the fourth semiconductor chip has a cathode electrically connected to the output terminal and an anode electrically connected to the second power supply terminal, and is electrically connected so as to be parallel with the second field effect transistor, wherein the control circuit of the third semiconductor chip includes a first control circuit for control of the operation of the first field effect transistor, and a second control circuit for control of the operation of the second field effect transistor, wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal, wherein the sealing body further includes:

(a) a fifth semiconductor chip having the second Schottky barrier diode; and (b) a wire which electrically connects the cathode of the second Schottky barrier diode to the output of the first control circuit, and wherein the fifth semiconductor chip is mounted over the third chip mounting section in a state in which the anode of the second Schottky barrier diode is electrically connected to the second power supply terminal through the third chip mounting section.

6. A semiconductor device comprising:
a first chip mounting section, a second chip mounting section and a third chip mounting section respectively disposed at intervals;
a plurality of external terminals disposed around the first, second and third chip mounting sections;
a first semiconductor chip disposed over the first chip mounting section and having a first field effect transistor;
a second semiconductor chip disposed over the second chip mounting section and having a second field effect transistor;
a third semiconductor chip disposed over the third chip mounting section and including a control circuit which controls operations of the first and second field effect transistors;
a fourth semiconductor chip disposed over the second chip mounting section and having a first Schottky barrier diode; and
a sealing body which seals the first, second, third and fourth semiconductor chips, the first, second and third chip mounting sections and some of the plurality of external terminals,
wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside,
wherein the first field effect transistor has a source-drain path series-connected between the first power supply terminal and the output terminal;
wherein the second field effect transistor has a source-drain path series-connected between the output terminal and the second power supply terminal,
wherein the control circuit of the third semiconductor chip controls respective gates of the first and second field effect transistors in accordance with a control signal inputted to the signal terminal,
wherein the second semiconductor chip is placed in a position closer to the second power supply terminal than the output terminal, and
wherein the first Schottky barrier diode of the fourth semiconductor chip has a cathode electrically connected to the output terminal and an anode electrically connected to the second power supply terminal, and is electrically connected so as to be parallel with the second field effect transistor,
wherein the control circuit of the third semiconductor chip includes a first control circuit for control of the operation of the first field effect transistor, and a second control circuit for control of the operation of the second field effect transistor,
wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal,
wherein the sealing body further includes:
(a) a fifth semiconductor chip having the second Schottky barrier diode; and
(b) a wire which electrically connects the anode of the second Schottky barrier diode to the second power supply terminal, and
wherein the fifth semiconductor chip is mounted over the first semiconductor chip in a state in which the cathode of the second Schottky barrier diode is electrically connected to a gate electrode of the first field effect transistor of the first semiconductor chip.

7. A semiconductor device comprising:
a first chip mounting section, a second chip mounting section and a third chip mounting section respectively disposed at intervals;
a plurality of external terminals disposed around the first, second and third chip mounting sections;
a first semiconductor chip disposed over the first chip mounting section and having a first field effect transistor;
a second semiconductor chip disposed over the second chip mounting section and having a second field effect transistor;
a third semiconductor chip disposed over the third chip mounting section and including a control circuit which controls operations of the first and second field effect transistors;
a fourth semiconductor chip disposed over the second chip mounting section and having a first Schottky barrier diode; and
a sealing body which seals the first, second, third and fourth semiconductor chips, the first, second and third chip mounting sections and some of the plurality of external terminals,
wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside,
wherein the first field effect transistor has a source-drain path series-connected between the first power supply terminal and the output terminal;
wherein the second field effect transistor has a source-drain path series-connected between the output terminal and the second power supply terminal,
wherein the control circuit of the third semiconductor chip controls respective gates of the first and second field effect transistors in accordance with a control signal inputted to the signal terminal,
wherein the first semiconductor chip is disposed in such a manner that one side thereof approaches one side of the first chip mounting section, which is adjacent to one side of the second chip mounting section, and wherein the first Schottky barrier diode of the fourth semiconductor chip has a cathode electrically connected to the output terminal and an anode electrically connected to the second power supply terminal, and is electrically connected so as to be parallel with the second field effect transistor,
wherein the control circuit of the third semiconductor chip includes a first control circuit for control of the operation of the first field effect transistor, and a second control circuit for control of the operation of the second field effect transistor,
wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal, wherein the sealing body further includes:

(a) a fifth semiconductor chip having the second Schottky barrier diode;

(b) a fourth chip mounting section with the fifth semiconductor chip mounted thereover, and electrically connected to the cathode of the second Schottky barrier diode;

(c) a wire which electrically connects the fourth chip mounting section to the output of the first control circuit; and (d) a wire which electrically connects the anode of the second Schottky barrier diode to the second power supply terminal.

8. A semiconductor device comprising:

a first chip mounting section, a second chip mounting section and a third chip mounting section respectively disposed at intervals;

a plurality of external terminals disposed around the first, second and third chip mounting sections;

a first semiconductor chip disposed over the first chip mounting section and having a first field effect transistor;

a second semiconductor chip disposed over the second chip mounting section and having a second field effect transistor;

a third semiconductor chip disposed over the third chip mounting section and including a control circuit which controls operations of the first and second field effect transistors;

a fourth semiconductor chip disposed over the second chip mounting section and having a first Schottky barrier diode; and a sealing body which seals the first, second, third and fourth semiconductor chips, the first, second and third chip mounting sections and some of the plurality of external terminals, wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside, wherein the first field effect transistor has a source-drain path series-connected between the first power supply terminal and the output terminal;

wherein the second field effect transistor has a source-drain path series-connected between the output terminal and the second power supply terminal, wherein the control circuit of the third semiconductor chip controls respective gates of the first and second field effect transistors in accordance with a control signal inputted to the signal terminal, wherein the first semiconductor chip is disposed in such a manner that one side thereof approaches one side of the first chip mounting section, which is adjacent to one side of the second chip mounting section, and wherein the first Schottky barrier diode of the fourth semiconductor chip has a cathode electrically connected to the output terminal and an anode electrically connected to the second power supply terminal, and is electrically connected so as to be parallel with the second field effect transistor, wherein the control circuit of the third semiconductor chip includes a first control circuit for control of the operation of the first field effect transistor, and a second control circuit for control of the operation of the second field effect transistor, wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal, wherein the sealing body further includes:

(a) a fifth semiconductor chip having the second Schottky barrier diode; and (b) a wire which electrically connects the cathode of the second Schottky barrier diode to the output of the first control circuit, and wherein the fifth semiconductor chip is mounted over the third chip mounting section in a state in which the anode of the second Schottky barrier diode is electrically connected to the second power supply terminal through the third chip mounting section.

9. A semiconductor device comprising:

a first chip mounting section, a second chip mounting section and a third chip mounting section respectively disposed at intervals;

a plurality of external terminals disposed around the first, second and third chip mounting sections;

a first semiconductor chip disposed over the first chip mounting section and having a first field effect transistor;

a second semiconductor chip disposed over the second chip mounting section and having a second field effect transistor;

a third semiconductor chip disposed over the third chip mounting section and including a control circuit which controls operations of the first and second field effect transistors;

a fourth semiconductor chip disposed over the second chip mounting section and having a first Schottky barrier diode; and a sealing body which seals the first, second, third and fourth semiconductor chips, the first, second and third chip mounting sections and some of the plurality of external terminals, wherein the plurality of external terminals include a first power supply terminal which supplies an input power supply potential, second power supply terminals which supply a potential lower than the input power supply potential, a signal terminal which controls the control circuit of the third semiconductor chip, and an output terminal which outputs an output power supply potential to the outside, wherein the first field effect transistor has a source-drain path series-connected between the first power supply terminal and the output terminal;

wherein the second field effect transistor has a source-drain path series-connected between the output terminal and the second power supply terminal, wherein the control circuit of the third semiconductor chip controls respective gates of the first and second field effect transistors in accordance with a control signal inputted to the signal terminal, wherein the first semiconductor chip is disposed in such a manner that one side thereof approaches one side of the first chip mounting section, which is adjacent to one side of the second chip mounting section, and wherein the first Schottky barrier diode of the fourth semiconductor chip has a cathode electrically connected to the output terminal and an anode electrically connected to the second power supply terminal, and is electrically connected so as to be parallel with the second field effect transistor, wherein the control circuit of the third semiconductor chip includes a first control circuit for control of the operation of the first field effect transistor, and a second control circuit for control of the operation of the second field effect transistor, wherein a cathode of a second Schottky barrier diode is electrically connected to an output of the first control circuit, an anode of the second Schottky barrier diode is electrically connected to the second power supply terminal, and the second Schottky barrier diode is electrically connected between the output of the first control circuit and the second power supply terminal, wherein the sealing body further includes:
(a) a fifth semiconductor chip having the second Schottky barrier diode; and
(b) a wire which electrically connects the anode of the second Schottky barrier diode to the second power supply terminal, and wherein the fifth semiconductor chip is mounted over the first semiconductor chip in a state in which the cathode of the second Schottky barrier diode is electrically connected to a gate electrode of the first field effect transistor of the first semiconductor chip.

* * * * *